(12) United States Patent
Luch

(10) Patent No.: US 8,222,513 B2
(45) Date of Patent: *Jul. 17, 2012

(54) COLLECTOR GRID, ELECTRODE STRUCTURES AND INTERCONNECT STRUCTURES FOR PHOTOVOLTAIC ARRAYS AND METHODS OF MANUFACTURE

(76) Inventor: Daniel Luch, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/317,117

(22) Filed: Oct. 11, 2011

(65) Prior Publication Data

US 2012/0031462 A1 Feb. 9, 2012

Related U.S. Application Data

(63) Continuation-in-part of application No. 13/199,333, filed on Aug. 25, 2011, now Pat. No. 8,110,737, which is a continuation of application No. 12/290,896, filed on Nov. 5, 2008, now abandoned, which is a continuation-in-part of application No. 11/824,047, filed on Jun. 30, 2007, now abandoned, which is a continuation-in-part of application No. 11/404,168, filed on Apr. 13, 2006, now Pat. No. 7,635,810.

(51) Int. Cl.
*H02N 6/00* (2006.01)
*H01L 31/042* (2006.01)

(52) U.S. Cl. .................. 136/244; 136/259; 136/251

(58) Field of Classification Search .................. 136/244, 136/262, 259, 251
See application file for complete search history.

(56) References Cited

U.S. PATENT DOCUMENTS

| | | | |
|---|---|---|---|
| 3,094,439 A | 6/1963 | Mann et al. | |
| 3,116,171 A | 12/1963 | Leif et al. | |
| 3,330,700 A | 7/1967 | Sequeira et al. | |
| 3,346,419 A | 10/1967 | Webb et al. | |
| 3,369,939 A | 2/1968 | Meyer | |
| 3,376,163 A | 4/1968 | Abrahamsohn | |
| 3,442,007 A | 5/1969 | Griffin et al. | |
| 3,459,597 A | 8/1969 | Baron | |
| 3,480,473 A | 11/1969 | Tanos | |
| 3,483,038 A | 12/1969 | Hui et al. | |
| 3,523,875 A | 8/1970 | Minklei | |
| 3,553,030 A | 1/1971 | Lebrun | |
| 3,619,382 A | 11/1971 | Lupinski | |
| 3,682,786 A | 8/1972 | Brown et al. | |
| 3,713,893 A | 1/1973 | Shirland | |
| 3,764,280 A | 10/1973 | Lupinski | |
| 3,818,324 A | 6/1974 | Espinasse | |
| 3,849,880 A | 11/1974 | Haynos | |
| 3,865,699 A | 2/1975 | Luch | |
| 3,888,697 A | 6/1975 | Bogus et al. | |
| 3,903,427 A | 9/1975 | Pack | |
| 3,903,428 A | 9/1975 | DeJong | |
| 3,978,333 A | 8/1976 | Crisman et al. | |
| 3,982,964 A | 9/1976 | Lindmayer et al. | |
| 3,993,505 A | 11/1976 | Pack | |
| 3,996,067 A | 12/1976 | Broder | |

(Continued)

*Primary Examiner* — Basia Ridley
*Assistant Examiner* — Allison Bourke

(57) ABSTRACT

The invention teaches novel structure and methods for producing electrical current collectors and electrical interconnection structure. Such articles find particular use in facile production of modular arrays of photovoltaic cells. The current collector and interconnecting structures may be initially produced separately from the photovoltaic cells thereby allowing the use of unique materials and manufacture. Subsequent combination of the structures with photovoltaic cells allows facile and efficient completion of modular arrays. Methods for combining the collector and interconnection structures with cells and final interconnecting into modular arrays are taught.

26 Claims, 29 Drawing Sheets

U.S. PATENT DOCUMENTS

| | | | |
|---|---|---|---|
| 4,009,093 A | 2/1977 | Luch | |
| 4,017,332 A | 4/1977 | James | |
| 4,019,924 A | 4/1977 | Kurth | |
| 4,027,652 A | 6/1977 | Collura | |
| 4,038,042 A | 7/1977 | Adelman | |
| 4,087,960 A | 5/1978 | Koichi | |
| 4,101,385 A | 7/1978 | Luch | |
| 4,127,424 A | 11/1978 | Ullery | |
| 4,158,612 A | 6/1979 | Luch et al. | |
| 4,175,249 A | 11/1979 | Gruber | |
| 4,195,117 A | 3/1980 | Luch | |
| 4,227,942 A | 10/1980 | Hall | |
| 4,231,808 A | 11/1980 | Tabei | |
| 4,241,493 A | 12/1980 | Andrulitis et al. | |
| 4,243,432 A | 1/1981 | Jordan | |
| 4,260,428 A | 4/1981 | Roy | |
| 4,260,429 A | 4/1981 | Moyer | |
| 4,278,473 A | 7/1981 | Borden | |
| 4,278,510 A | 7/1981 | Chien et al. | |
| 4,283,590 A | 8/1981 | Bilger et al. | |
| 4,283,591 A | 8/1981 | Boer | |
| 4,291,191 A | 9/1981 | Dahlberg | |
| 4,306,108 A | 12/1981 | Henesian | |
| 4,315,096 A | 2/1982 | Tyan et al. | |
| 4,320,154 A | 3/1982 | Biter | |
| 4,348,546 A | 9/1982 | Little | |
| 4,361,717 A | 11/1982 | Gilmore et al. | |
| 4,366,335 A | 12/1982 | Feng et al. | |
| 4,380,112 A | 4/1983 | Little | |
| 4,395,362 A | 7/1983 | Satoh et al. | |
| 4,398,055 A | 8/1983 | Ijaz et al. | |
| 4,425,262 A | 1/1984 | Kawai et al. | |
| 4,428,110 A | 1/1984 | Kim | |
| 4,429,020 A | 1/1984 | Luch | |
| 4,430,519 A | 2/1984 | Young | |
| 4,443,651 A | 4/1984 | Swartz | |
| 4,457,578 A | 7/1984 | Taylor | |
| 4,499,658 A | 2/1985 | Lewis | |
| 4,507,181 A | 3/1985 | Nath et al. | |
| 4,510,079 A | 4/1985 | Kawai et al. | |
| 4,514,579 A | 4/1985 | Hanak | |
| 4,514,580 A | 4/1985 | Bartlett | |
| 4,517,403 A | 5/1985 | Morel et al. | |
| 4,542,255 A | 9/1985 | Tanner et al. | |
| 4,574,160 A | 3/1986 | Cull | |
| 4,584,427 A | 4/1986 | Mackamul et al. | |
| 4,585,490 A | 4/1986 | Raffel et al. | |
| 4,586,988 A | 5/1986 | Nath et al. | |
| 4,598,306 A | 7/1986 | Nath et al. | |
| 4,603,092 A | 7/1986 | Luch | |
| 4,603,470 A | 8/1986 | Yamazaki | |
| 4,605,813 A | 8/1986 | Takeuchi et al. | |
| 4,617,420 A | 10/1986 | Dilts et al. | |
| 4,617,421 A | 10/1986 | Nath et al. | |
| 4,624,045 A | 11/1986 | Ishihara et al. | |
| 4,640,002 A | 2/1987 | Phillips et al. | |
| 4,652,693 A | 3/1987 | Bar-On | |
| 4,667,128 A | 5/1987 | Kamijo et al. | |
| 4,675,468 A | 6/1987 | Basol et al. | |
| 4,694,117 A | 9/1987 | Friedrich et al. | |
| 4,695,674 A | 9/1987 | Bar-on | |
| 4,697,041 A | 9/1987 | Okaniwa et al. | |
| 4,697,042 A | 9/1987 | Schilling | |
| 4,704,369 A | 11/1987 | Nath et al. | |
| 4,724,011 A | 2/1988 | Turner et al. | |
| 4,745,078 A | 5/1988 | Stetter et al. | |
| 4,746,618 A | 5/1988 | Nath et al. | |
| 4,755,475 A | 7/1988 | Kiyama et al. | |
| 4,758,526 A | 7/1988 | Thalheimer | |
| 4,762,747 A | 8/1988 | Liu et al. | |
| 4,765,845 A | 8/1988 | Takada et al. | |
| 4,769,086 A | 9/1988 | Tanner et al. | |
| 4,773,944 A | 9/1988 | Nath | |
| 4,786,607 A | 11/1988 | Yamazaki et al. | |
| 4,806,432 A | 2/1989 | Eguchi et al. | |
| 4,830,038 A | 5/1989 | Anderson et al. | |
| 4,849,028 A * | 7/1989 | Krause | 136/256 |
| 4,849,029 A | 7/1989 | Delahoy | |
| 4,860,509 A | 8/1989 | Laaly et al. | |
| 4,865,999 A | 9/1989 | Xi et al. | |
| 4,872,607 A | 10/1989 | Jensen | |
| 4,872,925 A | 10/1989 | McMaster | |
| 4,873,201 A | 10/1989 | Grimmer | |
| 4,876,430 A | 10/1989 | Herschitz et al. | |
| 4,877,460 A | 10/1989 | Flodl | |
| 4,892,592 A | 1/1990 | Dickson | |
| 4,917,752 A | 4/1990 | Jensen | |
| 4,933,021 A | 6/1990 | Swanson | |
| 4,940,495 A | 7/1990 | Weber | |
| 4,965,655 A | 10/1990 | Grimmer et al. | |
| 4,981,525 A | 1/1991 | Kiyama et al. | |
| 5,057,163 A | 10/1991 | Barnett et al. | |
| 5,084,107 A | 1/1992 | Deguchi et al. | |
| 5,118,540 A | 6/1992 | Hutchison | |
| 5,139,959 A | 8/1992 | Craft et al. | |
| 5,151,373 A | 9/1992 | Deguchi | |
| 5,158,618 A | 10/1992 | Rubin et al. | |
| 5,164,443 A | 11/1992 | Watanabe | |
| 5,181,968 A | 1/1993 | Nath et al. | |
| 5,185,042 A | 2/1993 | Ferguson | |
| 5,202,271 A | 4/1993 | Kouzuma | |
| 5,223,044 A | 6/1993 | Asai | |
| 5,232,518 A | 8/1993 | Nath et al. | |
| 5,238,519 A | 8/1993 | Nath et al. | |
| 5,254,179 A | 10/1993 | Ricaud et al. | |
| 5,259,891 A | 11/1993 | Matsuyama | |
| 5,268,037 A | 12/1993 | Glatfelter | |
| 5,270,229 A | 12/1993 | Ishihara | |
| 5,273,608 A | 12/1993 | Nath | |
| 5,278,097 A | 1/1994 | Hotchkiss | |
| 5,296,043 A | 3/1994 | Kawakami | |
| 5,330,583 A | 7/1994 | Asai et al. | |
| 5,380,371 A | 1/1995 | Murakami | |
| 5,385,848 A | 1/1995 | Grimmer | |
| 5,391,235 A | 2/1995 | Inoue | |
| 5,391,236 A | 2/1995 | Krut et al. | |
| 5,419,781 A | 5/1995 | Hamakawa et al. | |
| 5,421,908 A | 6/1995 | Yoshida et al. | |
| 5,428,249 A | 6/1995 | Sawayama et al. | |
| 5,437,735 A | 8/1995 | Younan | |
| 5,457,057 A | 10/1995 | Nath et al. | |
| 5,466,302 A | 11/1995 | Carey et al. | |
| 5,468,652 A | 11/1995 | Gee | |
| 5,474,620 A | 12/1995 | Nath et al. | |
| 5,474,621 A | 12/1995 | Barnard | |
| 5,501,744 A | 3/1996 | Albright | |
| 5,516,704 A | 5/1996 | Yoshida | |
| 5,530,519 A | 6/1996 | Miyawaki et al. | |
| 5,547,516 A | 8/1996 | Luch | |
| 5,554,229 A | 9/1996 | Vogeli | |
| 5,567,296 A | 10/1996 | Luch | |
| 5,575,861 A | 11/1996 | Younan et al. | |
| 5,582,653 A | 12/1996 | Kataoka | |
| 5,587,264 A | 12/1996 | Iijima et al. | |
| 5,593,901 A | 1/1997 | Oswald et al. | |
| 5,620,528 A | 4/1997 | Schade et al. | |
| 5,626,686 A | 5/1997 | Yoshida | |
| 5,626,688 A | 5/1997 | Probst et al. | |
| 5,637,537 A | 6/1997 | Nath et al. | |
| 5,667,596 A | 9/1997 | Tsuzuki et al. | |
| 5,674,325 A | 10/1997 | Albright et al. | |
| 5,679,176 A | 10/1997 | Tsuzuki et al. | |
| 5,681,402 A | 10/1997 | Ichinose et al. | |
| 5,733,381 A | 3/1998 | Ota et al. | |
| 5,735,966 A | 4/1998 | Luch | |
| 5,759,291 A | 6/1998 | Ichinose et al. | |
| 5,814,195 A | 9/1998 | Lehan et al. | |
| 5,854,940 A | 12/1998 | Nihara | |
| 5,858,121 A | 1/1999 | Wada | |
| 5,865,904 A | 2/1999 | Tanda | |
| 5,868,869 A | 2/1999 | Albright et al. | |
| 5,897,715 A | 4/1999 | Ward et al. | |
| 5,919,316 A | 7/1999 | Bogorad et al. | |
| 5,928,439 A | 7/1999 | Ota et al. | |
| 5,942,048 A | 8/1999 | Fujisaki et al. | |
| 5,951,786 A | 9/1999 | Gee et al. | |
| 5,968,287 A | 10/1999 | Nath | |

| | | |
|---|---|---|
| 6,008,451 A | 12/1999 | Ichinose et al. |
| 6,034,322 A | 3/2000 | Pollard |
| 6,034,810 A | 3/2000 | Robinson et al. |
| 6,083,801 A | 7/2000 | Ohtani |
| 6,093,581 A | 7/2000 | Takabayashi |
| 6,093,884 A | 7/2000 | Toyomura et al. |
| 6,111,189 A | 8/2000 | Garvison et al. |
| 6,121,542 A | 9/2000 | Shiotsuka et al. |
| 6,137,221 A | 10/2000 | Roitman et al. |
| 6,160,215 A | 12/2000 | Curtin |
| 6,184,458 B1 | 2/2001 | Murakami et al. |
| 6,201,181 B1 | 3/2001 | Azzam et al. |
| 6,231,732 B1 | 5/2001 | Hollars et al. |
| 6,232,544 B1 | 5/2001 | Takabayashi |
| 6,239,352 B1 | 5/2001 | Luch |
| 6,265,652 B1 | 7/2001 | Kurata et al. |
| 6,265,812 B1 | 7/2001 | Watanabe et al. |
| 6,268,014 B1 | 7/2001 | Eberspacher et al. |
| 6,294,725 B1 | 9/2001 | Hirschberg |
| 6,313,395 B1 | 11/2001 | Crane et al. |
| 6,333,206 B1 | 12/2001 | Ito et al. |
| 6,335,479 B1 | 1/2002 | Yamada et al. |
| 6,340,403 B1 | 1/2002 | Carey et al. |
| 6,350,944 B1 | 2/2002 | Sherif et al. |
| 6,359,209 B1 | 3/2002 | Glenn et al. |
| 6,365,010 B1 | 4/2002 | Hollars |
| 6,372,538 B1 | 4/2002 | Wendt et al. |
| 6,380,477 B1 | 4/2002 | Curtin |
| 6,384,313 B2 | 5/2002 | Nakagawa et al. |
| 6,414,235 B1 | 7/2002 | Luch |
| 6,422,793 B1 | 7/2002 | Todisco et al. |
| 6,437,231 B2 | 8/2002 | Kurata et al. |
| 6,455,347 B1 | 9/2002 | Hiraishi et al. |
| 6,459,032 B1 | 10/2002 | Luch |
| 6,468,828 B1 | 10/2002 | Glatfelter et al. |
| 6,479,744 B1 | 11/2002 | Tsuzuki et al. |
| 6,488,824 B1 | 12/2002 | Hollars |
| 6,511,861 B2 | 1/2003 | Takeyama et al. |
| 6,548,912 B1 | 4/2003 | Graff et al. |
| 6,553,729 B1 | 4/2003 | Nath et al. |
| 6,555,739 B2 | 4/2003 | Kawam |
| 6,573,445 B1 | 6/2003 | Burgers |
| 6,582,887 B2 | 6/2003 | Luch |
| 6,586,270 B2 | 7/2003 | Tsuzuki et al. |
| 6,697,248 B1 | 2/2004 | Luch |
| 6,729,081 B2 | 5/2004 | Nath et al. |
| 6,743,524 B2 | 6/2004 | Schaepkens |
| 6,750,662 B1 | 6/2004 | Van Der Heide |
| 6,774,497 B1 | 8/2004 | Qi et al. |
| 6,784,358 B2 | 8/2004 | Kukulka et al. |
| 6,787,405 B2 | 9/2004 | Chen |
| 6,803,513 B2 | 10/2004 | Beernink et al. |
| 6,846,696 B2 | 1/2005 | Adachi et al. |
| 6,974,976 B2 | 12/2005 | Hollars |
| 7,022,910 B2 | 4/2006 | Gaudiana et al. |
| 7,120,005 B1 | 10/2006 | Luch |
| 7,144,751 B2 | 12/2006 | Gee et al. |
| 7,157,641 B2 | 1/2007 | Gregg |
| 7,170,001 B2 | 1/2007 | Gee et al. |
| 7,276,724 B2 | 10/2007 | Sheats et al. |
| 7,394,425 B2 | 7/2008 | Luch |
| 7,507,903 B2 | 3/2009 | Luch |
| 7,507,971 B2 | 3/2009 | Shibayama et al. |
| 7,635,810 B2 | 12/2009 | Luch |
| 7,732,243 B2 | 6/2010 | Luch |
| 7,781,672 B2 | 8/2010 | Gaudiana et al. |
| 7,829,781 B2 | 11/2010 | Montello et al. |
| 2002/0014262 A1 | 2/2002 | Matsushita et al. |
| 2002/0189662 A1 | 12/2002 | Lomparski |
| 2003/0103181 A1 | 6/2003 | Imayama et al. |
| 2003/0198587 A1 | 10/2003 | Kaloyeros et al. |
| 2003/0205270 A1 | 11/2003 | Stanbery |
| 2003/0227021 A1 | 12/2003 | Yamazaki et al. |
| 2004/0063320 A1 | 4/2004 | Hollars |
| 2004/0144043 A1 | 7/2004 | Stevenson et al. |
| 2004/0144419 A1 | 7/2004 | Fix |
| 2004/0214409 A1 | 10/2004 | Farnworth et al. |
| 2004/0219730 A1 | 11/2004 | Basol |
| 2004/0261839 A1 | 12/2004 | Gee et al. |
| 2004/0261840 A1 | 12/2004 | Schmit et al. |
| 2005/0006714 A1 | 1/2005 | Graetzel et al. |
| 2005/0061363 A1 | 3/2005 | Ginley et al. |
| 2005/0072461 A1 | 4/2005 | Kuchinski et al. |
| 2005/0074915 A1 | 4/2005 | Tuttle |
| 2005/0087225 A1 | 4/2005 | Morooka et al. |
| 2005/0109392 A1 | 5/2005 | Hollars |
| 2005/0117194 A1 | 6/2005 | Kim et al. |
| 2005/0126621 A1 | 6/2005 | Dinwoodie et al. |
| 2005/0135724 A1 | 6/2005 | Helvajian et al. |
| 2005/0172996 A1 | 8/2005 | Hacke et al. |
| 2005/0172998 A1 | 8/2005 | Gee et al. |
| 2005/0175856 A1 | 8/2005 | Rogers et al. |
| 2005/0176164 A1 | 8/2005 | Gee et al. |
| 2005/0176270 A1 | 8/2005 | Luch |
| 2005/0217719 A1 | 10/2005 | Mahieu et al. |
| 2005/0241692 A1 | 11/2005 | Rubin et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0274408 A1 | 12/2005 | Li et al. |
| 2006/0030141 A1 | 2/2006 | Weng et al. |
| 2006/0032752 A1 | 2/2006 | Luch |
| 2006/0107471 A1 | 5/2006 | Spath et al. |
| 2006/0118165 A1 | 6/2006 | Van Roosmalen et al. |
| 2006/0121701 A1 | 6/2006 | Basol |
| 2006/0121748 A1 | 6/2006 | Brieko |
| 2006/0160261 A1 | 7/2006 | Sheats et al. |
| 2006/0174931 A1 | 8/2006 | Mapes et al. |
| 2007/0283996 A1 | 12/2007 | Hachtmann et al. |
| 2007/0283997 A1 | 12/2007 | Hachtmann et al. |
| 2007/0295385 A1 | 12/2007 | Sheats |
| 2007/0295390 A1 | 12/2007 | Sheats et al. |
| 2008/0000518 A1 | 1/2008 | Basol |
| 2008/0011350 A1 | 1/2008 | Luch |
| 2008/0053512 A1 | 3/2008 | Kawashima |
| 2008/0053519 A1 | 3/2008 | Pearce |
| 2008/0142071 A1 | 6/2008 | Dorn et al. |
| 2008/0314432 A1 | 12/2008 | Paulson et al. |
| 2008/0314433 A1 | 12/2008 | Luch |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0107538 A1 | 4/2009 | Luch |
| 2009/0111206 A1 | 4/2009 | Luch |
| 2009/0114261 A1 | 5/2009 | Stancel |
| 2009/0145551 A1 | 6/2009 | Luch |
| 2009/0159119 A1 | 6/2009 | Basol |
| 2009/0169722 A1 | 7/2009 | Luch |
| 2009/0173374 A1 | 7/2009 | Luch |
| 2009/0199894 A1 | 8/2009 | Hollars et al. |
| 2009/0223552 A1 | 9/2009 | Luch |
| 2009/0293941 A1 | 12/2009 | Luch |
| 2010/0071757 A1 | 3/2010 | Krajewski et al. |
| 2010/0108118 A1 | 5/2010 | Luch |

* cited by examiner

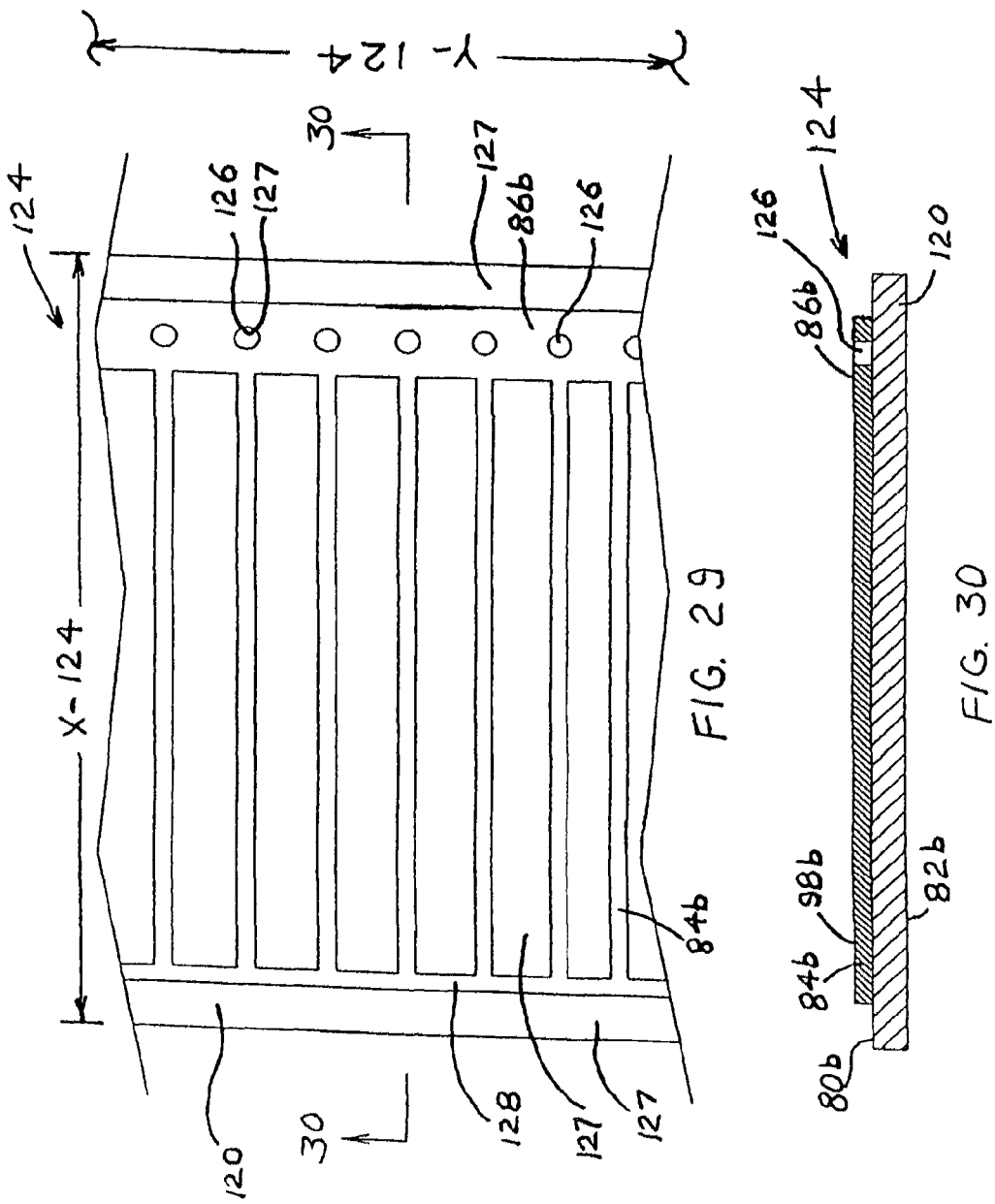

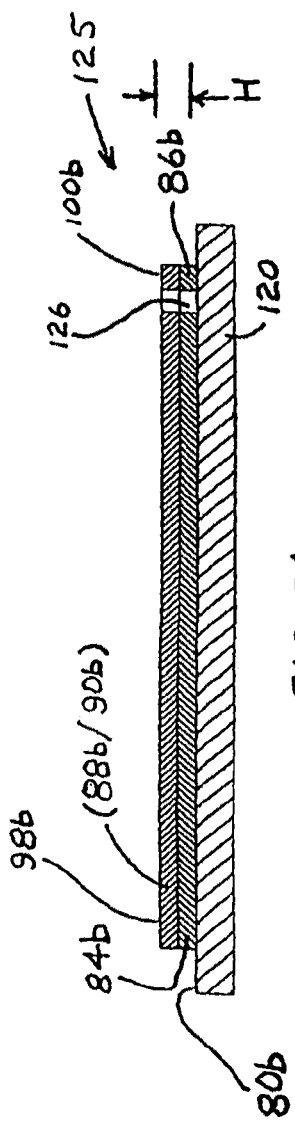
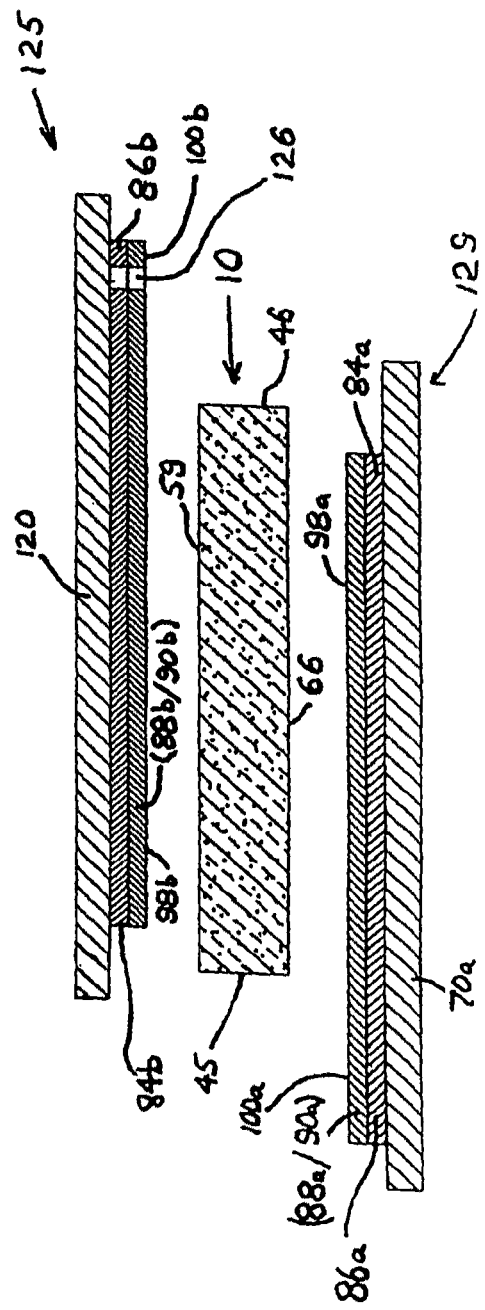
FIG. 31
FIG. 32

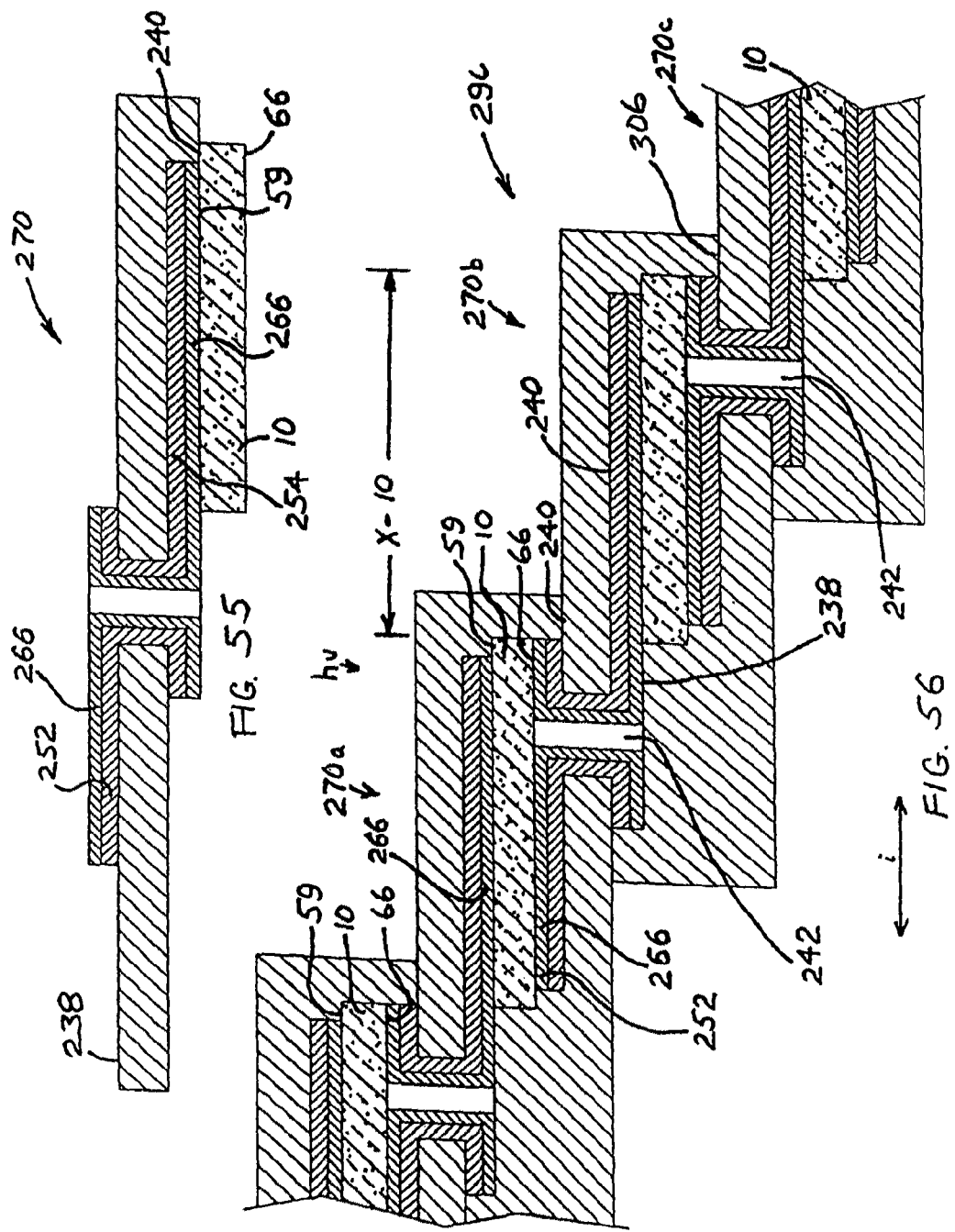

COLLECTOR GRID, ELECTRODE STRUCTURES AND INTERCONNECT STRUCTURES FOR PHOTOVOLTAIC ARRAYS AND METHODS OF MANUFACTURE

CROSS-REFERENCE TO RELATED APPLICATIONS

This application is a Continuation-in-Part of U.S. patent application Ser. No. 13/199,333 filed Aug. 25, 2011 now U.S. Pat. No. 8,110,737, entitled, Collector Grid, Electrode Structures and Interconnect Structures for Photovoltaic Arrays and Methods of Manufacture, which is a Continuation of U.S. patent application Ser. No. 12/290,896 filed Nov. 5, 2008 now abandoned, entitled Collector Grid, Electrode Structures and Interconnect Structures for Photovoltaic Arrays and Methods of Manufacture, which is a Continuation-in-Part of U.S. patent application Ser. No. 11/824,047 filed Jun. 30, 2007 now abandoned, entitled Collector Grid, Electrode Structures and Interconnect Structures for Photovoltaic Arrays and other Optoelectric Devices, which is a Continuation-in-Part of U.S. application Ser. No. 11/404,168 filed Apr. 13, 2006, entitled Substrate and Collector Grid Structures for Integrated Photovoltaic Arrays and Process of Manufacture of Such Arrays, and now U.S. Pat. No. 7,635,810. The entire contents of the above identified applications are incorporated herein by this reference.

BACKGROUND OF THE INVENTION

This invention teaches novel structure and methods for achieving efficient collection and conveyance of power from photovoltaic power generating devices.

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the high cost of single crystal silicon material and interconnection processing.

A second approach to produce photovoltaic cells is by depositing thin photovoltaic semiconductor films on a supporting substrate. Material requirements are minimized and technologies can be proposed for mass production. Thin film photovoltaic cells employing amorphous silicon, cadmium telluride, copper indium gallium diselenide, dye sensitized solar cells (DSSC), printed silicon inks and the like have received increasing attention in recent years.

Despite significant improvements in individual cell conversion efficiencies for both single crystal and thin film approaches, photovoltaic energy collection has been generally restricted to applications having low power requirements. One factor characteristic of many optoelectric devices and photovoltaic cells in particular is that electrical energy is produced over a relatively expansive surface area. Thus a challenge to implementing bulk power systems is the problem of economically collecting the photogenerated power from an expansive surface. In particular, photovoltaic cells can be described as high current, low voltage devices. Typically individual cell voltage is less than about two volts, and often less than 0.6 volt. The current component is a substantial characteristic of the power generated. Efficient power collection from expansive photovoltaic cell surfaces must minimize resistive losses associated with the high current characteristic. In the specific case of most photovoltaic cells, the upper surface is normally formed by a transparent conductive oxide (TCO). However, these TCO layers are relatively resistive compared to pure metals and have a surface resistivity on the order of 10 to 100 ohms per square. Thus the conductive surface itself is limited in its ability to collect and transport current and efforts must be made to minimize resistive losses in transport of current through the TCO layer. This problem increases in severity as individual cell sizes increase. One solution is to simply reduce individual cell size (and thus accumulated current from an individual cell) to a point where the transparent conductive oxide alone can handle the current. Where larger individual cell sizes are the norm, it is common practice to augment the transparent conductive oxide with a current collector structure comprising a pattern of highly conductive traces extending over substantially the entire surface from which current is to be collected. Often the structure is in the form of a grid or lattice pattern. The current collector structure reduces the distance that current must be transported by the transparent conductive oxide before it reaches a highly conductive conveyance path off the surface. Thus the current collector structure collects current from a surface having relatively low surface conductivity. Many current collector structures or grids are conventionally prepared by first applying metal wires, fused silver filled pastes or silver filled ink traces to the cell surface and then covering the surface with a sealing material in a subsequent operation. These highly conductive traces may lead to a collection buss such as a copper foil strip which also functions as a tab extending to the back electrode of an adjacent cell. The wire approach requires positioning and fixing of multiple fine fragile wires which makes mass production difficult and expensive. Silver pastes are expensive and require high fusion temperatures which not all photovoltaic semiconductors can tolerate. A silver filled ink, as compared to a fuseable paste, is simply dried or cured at mild temperatures which do not adversely affect the cell. However, this ink approach requires the use of relatively expensive inks because of the high loading of finely divided silver particles. In addition, batch printing on the individual cells is laborious and expensive. Finally, the silver filled ink is relatively resistive compared to a fuseable silver paste or metal wire. Typical silver filled inks have intrinsic resistivities in the range 0.00002 to 0.01 ohm-cm.

Thus there remains a need for improved materials and structure for collecting the current from the top light incident surface of photovoltaic cells.

Normally one envisions a photovoltaic power collection device much larger than the size of an individual cell. Therefore, an arrangement must be supplied to collect power from multiple cells. This is normally accomplished by interconnecting multiple cells in series. In this way, voltage is stepped through each cell while current and associated resistive losses are minimized. Such interconnected multi-cell arrangements are commonly referred to as "modules" or "arrays". However, it is readily recognized that making effective, durable series connections among multiple small cells can be laborious, difficult and expensive. Regarding traditional crystalline silicon cells, the individual cells are normally discrete and comprise rigid wafers approximately 200 micrometers thick and approximately 230 square centimeters in area. A common way to convert multiple such cells into modules is to use a conventional "string and tab" arrangement. In this process multiple discrete cells are arranged in "strings" and the topside current collector electrodes of cells are connected to backside electrodes of adjacent cells using "tabs" or ribbons of conductive material. The cell connections often involve tedious manual operations such as soldering and handling of multiple interconnected cells. Next, unwieldy flexible leads from the terminal cells must be directed and secured in position for outside connections, again a tedious operation. Finally, weight and assembly concerns limit the ultimate size of the module. These limitations impede adoption of the modules for large scale power generation.

In order to approach economical mass production of modules of series connected individual cells, a number of factors must be considered in addition to the type of photovoltaic materials chosen. These include the substrate employed and the process envisioned. Since thin films can be deposited over expansive areas, thin film technologies offer additional opportunities for mass production of interconnected modules compared to inherently small, discrete single crystal silicon cells. Thus a number of U.S. patents have issued proposing designs and processes to achieve series interconnections among thin film photovoltaic cells. Many of these technologies comprise deposition of photovoltaic thin films on glass substrates followed by scribing to form smaller area individual cells. Multiple steps then follow to electrically connect the individual cells in series while maintaining the original common glass substrate. These "common" substrate approaches have come to be known as "monolithic integration". Examples of these proposed processes are presented in U.S. Pat. Nos. 4,443,651, 4,724,011, and 4,769,086 to Swartz, Turner et al. and Tanner et al. respectively. While expanding the opportunities for mass production of interconnected cell modules compared with inherently discrete approaches for crystal silicon cells, monolithic integration employing common glass substrates must inherently be performed on an individual batch basis. In addition, many monolithic approaches are not compatible with the use of a current collector grid and therefore cell sizes (in the direction of current flow) are constrained. Typically, cell widths for monolithic integration between 0.5 cm. and 1.0 cm. are taught in the art. However, as cell widths decrease, the width of the area between individual cells (interconnect area) should also decrease so that the relative portion of inactive surface of the interconnect area does not become excessive. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers may significantly limit the active area of the individual interconnected cells.

It has become well known in the art that the efficiencies of certain promising thin film photovoltaic junctions can be substantially increased by high temperature treatments. These treatments involve temperatures at which even the most heat resistant plastics suffer rapid deterioration. Use of a metal foil as a substrate allows high temperature treatments and continuous roll-to-roll processing. However, the subsequent conversion to an interconnected module of multiple cells has proven difficult, in part because the metal foil substrate is electrically conducting.

U.S. Pat. No. 4,746,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for acceptable mass manufacturing processes and articles to achieve effective integrated interconnections among photovoltaic cells.

A further issue that has impeded adoption of photovoltaic technology, especially for bulk power collection in the form of solar farms, involves installation of multiple modules over expansive regions of surface. Traditionally, modules have been mounted individually on supporting mounts, normally at an incline to horizontal appropriate to the latitude of the site. Conducting leads from each module are then physically coupled with leads from an adjacent module in order to interconnect multiple modules. This arrangement results in a string of modules each of which is coupled to an adjacent module. At one end of the string, the power is transferred from the end module to be conveyed to a separate site for further treatment such as voltage adjustment. This arrangement avoids having to run conductive cabling from each individual module to the separate treatment site.

The traditional solar farm installation described in the above paragraph has some drawbacks. First, traditional modules are limited in size due to weight and manufacturing constraints. This fact increases the number of individual modules required to cover a desired surface area. Next, the module itself comprises a string of individual cells. In the conventional module lead conductors in the form of flexible wires or ribbons are attached to an electrode on the two cells positioned at each end of the string in order to convey the power from the module. After mounting the individual modules on their support at the installation site, the respective leads from adjacent modules must be connected in order to couple adjacent modules, and the connection must be protected to avoid environmental deterioration or separation. These are intrinsically tedious manual operations. Finally, since the module leads and cell interconnections are not of high current carrying capacity, the adjacent cells are normally connected in series arrangement. Thus voltage builds up to high levels even at relatively short strings of modules. While not an overriding problem security and insulation must be appropriate to eliminate a shock hazard.

Thus there remains a need for improved module form factors and complimentary installation structure to reduce the cost and complexity of achieving large area "utility" scale photovoltaic installations.

In a somewhat removed segment of technology, a number of electrically conductive fillers have been used to produce electrically conductive polymeric materials. This technology generally involves mixing of a conductive filler such as silver particles with the polymer resin prior to fabrication of the material into its final shape. Conductive fillers may have high aspect ratio structure such as metal fibers, metal flakes or powder, or highly structured carbon blacks, with the choice based on a number of cost/performance considerations. More recently, fine particles of intrinsically conductive polymers have been employed as conductive fillers within a resin binder. Electrically conductive polymers have been used as bulk thermoplastic compositions, or formulated into paints and inks. Their development has been spurred in large part by electromagnetic radiation shielding and static discharge requirements for plastic components used in the electronics industry. Other known applications include resistive heating fibers and battery components and production of conductive patterns and traces. The characterization "electrically conductive polymer" covers a very wide range of intrinsic resistivities depending on the filler, the filler loading and the methods of manufacture of the filler/polymer blend. Resistivities for filled electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. In addition, it has been reported that recently developed intrinsically conducting polymers (absent conductive filler) may exhibit resistivities comparable to pure metals.

In yet another separate technological segment, coating plastic substrates with metal electrodeposits has been employed to achieve decorative effects on items such as knobs, cosmetic closures, faucets, and automotive trim. The normal conventional process actually combines two primary deposition technologies. The first is to deposit an adherent metal coating using chemical (electroless) deposition to first coat the nonconductive plastic and thereby render its surface highly conductive. This electroless step is then followed by conventional electroplating. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction (typically referred to as "electroless plating"). This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully prepared parts and designs. In addition, the many steps employing harsh chemicals make the process intrinsically costly and environmentally difficult. Finally, the sensitivity of ABS plastic to liquid hydrocarbons has prevented certain applications. ABS and other such polymers have been referred to as "electroplateable" polymers or resins. This is a misnomer in the strict sense, since ABS (and other nonconductive polymers) are incapable of accepting an electrodeposit directly and must be first metallized by other means before being finally coated with an electrodeposit. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated. None of these attempts at simplification have achieved any recognizable commercial application.

A number of proposals have been made to make the plastic itself conductive enough to allow it to be electroplated directly thereby avoiding the "electroless plating" process. As noted above, it is common to produce electrically conductive polymers by incorporating conductive or semiconductive fillers into a polymeric binder. Investigators have attempted to produce electrically conductive polymers capable of accepting an electrodeposited metal coating by loading polymers with relatively small conductive particulate fillers such as graphite, carbon black, and silver or nickel powder or flake. Heavy such loadings are sufficient to reduce volume resistivity to a level where electroplating may be considered. However, attempts to make an acceptable electroplateable polymer using the relatively small metal containing fillers alone encounter a number of barriers. First, the most conductive fine metal containing fillers such as silver are relatively expensive. The loadings required to achieve the particle-to-particle proximity to achieve acceptable conductivity increases the cost of the polymer/filler blend dramatically. The metal containing fillers are accompanied by further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding, printing etc.). A required heavy loading of metal filler severely restricts ability to manipulate processing properties in this way. A further problem is that metal fillers can be abrasive to processing machinery and may require specialized screws, barrels, and the like.

Another major obstacle involved in the electroplating of electrically conductive polymers is a consideration of adhesion between the electrodeposited metal and polymeric substrate (metal/polymer adhesion). In most cases sufficient adhesion is required to prevent metal/polymer separation during extended environmental and use cycles. Despite being electrically conductive, a simple metal-filled polymer offers no assured bonding mechanism to produce adhesion of an electrodeposit since the metal particles may be encapsulated by the resin binder, often resulting in a resin-rich "skin".

A number of methods to enhance electrodeposit adhesion to electrically conductive polymers have been proposed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids. In the case of conductive polymers containing finely divided metal, one can propose achieving direct metal-to-metal adhesion between electrodeposit and filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

For the above reasons, electrically conductive polymers employing metal fillers have not been widely used as bulk substrates for electroplateable articles. Such metal containing polymers have found use as inks or pastes in production of printed circuitry. Revived efforts and advances have been made in the past few years to accomplish electroplating onto printed conductive patterns formed by silver filled inks and pastes.

An additional physical obstacle confronting practical electroplating onto electrically conductive polymers is the initial "bridge" of electrodeposit onto the surface of the electrically conductive polymer. In electrodeposition, the substrate to be plated is often made cathodic through a pressure contact to a metal rack tip, itself under cathodic potential. However, if the contact resistance is excessive or the substrate is insufficiently conductive, the electrodeposit current favors the rack tip to the point where the electrodeposit will not bridge to the substrate.

Moreover, a further problem is encountered even if specialized racking or cathodic contact successfully achieves electrodeposit bridging to the substrate. Many of the electrically conductive polymers have resistivities far higher than those of typical metal substrates. Also, many applications involve electroplating onto a thin (less than 25 micrometer) printed substrate. The conductive polymeric substrate may be relatively limited in the amount of electrodeposition current which it alone can convey. Thus, the conductive polymeric substrate does not cover almost instantly with electrodeposit as is typical with metallic substrates. Except for the most heavily loaded and highly conductive polymer substrates, a large portion of the electrodeposition current must pass back through the previously electrodeposited metal growing laterally over the surface of the conductive plastic substrate. In a fashion similar to the bridging problem discussed above, the electrodeposition current favors the electrodeposited metal and the lateral growth can be extremely slow and erratic. This restricts the size and "growth length" of the substrate conductive pattern, increases plating costs, and can also result in large non-uniformities in electrodeposit integrity and thickness over the pattern.

This lateral growth is dependent on the ability of the substrate to convey current. Thus, the thickness and resistivity of the conductive polymeric substrate can be defining factors in the ability to achieve satisfactory electrodeposit coverage rates. When dealing with selectively electroplated patterns long thin metal traces are often desired. Electrodeposited metal thicknesses of from 1 to 25 micrometer are often typical. The metal traces must normally be of relatively uniform thickness and have a minimum of internal stress. Further, an electrically conductive polymer "seed" pattern defining the traces is often relatively thin, less than about 25 micrometers, and therefore may have relatively low current carrying capacity. These factors of course often work against achieving the desired result.

This coverage rate problem likely can be characterized by a continuum, being dependent on many factors such as the nature of the initially electrodeposited metal, electroplating bath chemistry, the nature of the polymeric binder and the resistivity of the electrically conductive polymeric substrate. As a "rule of thumb", the instant inventor estimates that coverage rate issue would demand attention if the resistivity of a bulk conductive polymeric substrate rose above about 0.001 ohm-cm. Alternatively, a "rule of thumb" appropriate for thin film substrates would be that attention is appropriate if the substrate film to be plated had a surface "sheet" resistance of greater than about 0.075 ohm per square.

The least expensive (and least conductive) of the readily available conductive fillers for plastics are carbon blacks. Attempts have been made to electroplate electrically conductive polymers using carbon black loadings. Examples of this approach are the teachings of U.S. Pat. Nos. 4,038,042, 3,865, 699, and 4,278,510 to Adelman, Luch, and Chien et al. respectively. These earlier efforts were directed primarily at achieving decorative electroplated articles with the substrate fully encapsulated with electrodeposit.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. A fundamental problem remaining unresolved by the Adelman teaching is the relatively high resistivity of carbon loaded polymers. The lowest "microscopic resistivity" generally achievable with carbon black loaded polymers is about 1 ohm-cm. This is about five to six orders of magnitude higher than typical electrodeposited metals such as copper or nickel. Thus, the electrodeposit bridging and coverage rate problems described above remained unresolved by the Adelman teachings.

Luch in U.S. Pat. No. 3,865,699 and Chien et al. in U.S. Pat. No. 4,278,510 also chose carbon black as a filler to provide an electrically conductive surface for the polymeric compounds to be electroplated. The Luch U.S. Pat. No. 3,865,699 and the Chien U.S. Pat. No. 4,278,510 are hereby incorporated in their entirety by this reference. However, these inventors further taught inclusion of materials to increase the rate of metal coverage or the rate of metal deposition on the polymer. These materials can be described herein as "electrodeposit growth rate accelerators" or "electrodeposit coverage rate accelerators". An electrodeposit coverage rate accelerator is a material functioning to increase the electrodeposition coverage rate over the surface of an electrically conductive polymer independent of any incidental affect it may have on the conductivity of an electrically conductive polymer. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome problems in achieving electrodeposit coverage of electrically conductive polymeric surfaces having relatively high resistivity or thin electrically conductive polymeric substrates having limited current carrying capacity.

In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These directly electroplateable resins (DER) can be generally described as electrically conductive polymers with the inclusion of a growth rate accelerator.

Specifically for the present invention, specification, and claims, directly electroplateable resins, (DER), are characterized by the following features:

(a) presence of an electrically conductive polymer;
(b) presence of an electrodeposit coverage rate accelerator;
(c) presence of the electrically conductive polymer and the electrodeposit coverage rate accelerator in the directly electroplateable composition in cooperative amounts required to achieve direct coverage of the composition with an electrodeposited metal or metal-based alloy.

In his patents, Luch specifically identified unsaturated elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

Using the materials and loadings reported, the carbon black/polymer formulations of Adelman, Luch and Chien referenced above would be expected to have intrinsic "microscopic" resistivities of less than about 1000 ohm-cm.(i.e. 1 ohm-cm., 10 ohm-cm., 100 ohm-cm., 1000 ohm-cm.). When used alone, the minimum workable level of carbon black required to achieve "microscopic" electrical resistivities of less than 1000 ohm-cm. for a polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities or resistivities associated with common silver filled inks.

It is understood that in addition to carbon blacks, other well known, highly conductive fillers can be considered to decrease the "microscopic" resistivity of DER compositions. Examples include but are not limited to metallic fillers or flake such as silver. In these cases the more highly conductive fillers can be used to augment or even replace the conductive carbon black. Furthermore, one may consider using intrinsically conductive polymers to supply the required conductivity. For example, an intrinsically conductive polymer in particulate form may be considered as a conductive filler.

The "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer "matrix" encapsulating the non-conductive filler particles. It has been found that DER formulations can include substantial quantities of non-conductive fillers. In particular, loading of DER formulations with glass fibers has been shown to dramatically reduce mold shrinkage and increase stiffness of these formulations.

Regarding electrodeposit coverage rate accelerators, both Luch and Chien et al. in the above discussed U.S. patents demonstrated that sulfur and other sulfur bearing materials such as sulfur donors and vulcanization accelerators function as electrodeposit coverage rate accelerators when using an initial Group VIII metal electrodeposit "strike" layer. Thus, an electrodeposit coverage rate accelerator need not be electrically conductive, but may be a material that is normally characterized as a non-conductor. The coverage rate accelerator need not appreciably affect the conductivity of the polymeric substrate. As an aid in understanding the function of an electrodeposit coverage rate accelerator the following is offered:

a. A specific conductive polymeric structure is identified as having insufficient current carrying capacity to be directly electroplated in a practical manner.
b. A material is added to the conductive polymeric material forming said structure. Said material addition may have insignificant affect on the current carrying capacity of the structure (i.e. it does not appreciably reduce resistivity or increase thickness). The material need only be present at the substrate surface.
c. Nevertheless, inclusion of said material greatly increases the speed at which an electrodeposited metal laterally covers the electrically conductive surface.

It is contemplated that a coverage rate accelerator may be present as an additive, as a species absorbed on a filler surface, or even as a functional group attached to the polymer chain. One or more growth rate accelerators may be present in a directly electroplateable resin (DER) to achieve combined, often synergistic results.

A hypothetical example might be an extended trace of conductive ink having a dry thickness of 1 micrometer. Such inks typically include a conductive filler such as silver, nickel, copper, conductive carbon etc. The limited thickness of the ink reduces the current carrying capacity of this trace thus preventing direct electroplating in a practical manner. However, inclusion of an appropriate quantity of a coverage rate accelerator may allow the conductive trace to be directly electroplated in a practical manner.

One might expect that other Group 6A elements, such as oxygen, selenium and tellurium, could function in a way similar to sulfur. In addition, other combinations of electrodeposited metals, such as copper and appropriate coverage rate accelerators may be identified. It is important to recognize that such an electrodeposit coverage rate accelerator is important in order to achieve direct electrodeposition in a practical way onto polymeric substrates having low conductivity or very thin electrically conductive polymeric substrates having restricted current carrying ability.

It has also been found that the inclusion of an electrodeposit coverage rate accelerator promotes electrodeposit bridging from a discrete cathodic metal contact to a DER surface. This greatly reduces the bridging problems described above.

Due to multiple performance problems associated with their intended end use, the instant inventor is unaware of any recognizable commercial success for attempts to directly electroplate electrically conductive polymers in applications intended to produce decorative "bright" electroplated objects. Nevertheless, electroplating in a selective manner onto insulating substrates for functional applications remains an intriguing possibility for many applications. This is because electroplating is selective between conductive and insulating surfaces and is inexpensive. Further, a wide variety of metals and alloys can be deposited by electroplating and the deposition rates are relatively rapid. There are a number of techniques available to achieve selective electrodeposited patterns on insulating substrates. Most involve initial formation of a "seed" pattern. The "seed" pattern is formed from a material that has the ability to assist in subsequent metal electrodeposition. Typical "seed" patterns comprise metals, polymers containing electroless plating catalysts, and electrically conductive polymers. Examples of such processes follow in subparagraphs 1 through 3.

(1) An electrically conductive polymer is formed into a "seed" pattern by printing from an ink formulation onto the surface of an insulating substrate. This electrically conductive polymer "seed layer" pattern, when dried, is then subjected to a metal electroplating process to cover the pattern with a conductive metal.

(2) A polymeric composition containing a catalyst suitable for initiating chemical metal deposition is printed into a "seed layer" pattern. After appropriate activation, the article is subjected to a chemical metal deposition "electroless" plating bath. Following coverage with electroless metal, the "seed pattern", now comprising a layered structure of polymer and chemically deposited metal, is subjected to an electroplating process to cover the pattern with electrodeposited metal.

(3) An insulating substrate is coated in its entirety with a thin film of metal. This uniform coating may be achieved, for example, using vacuum metallizing, sputtering, chemical metal deposition processing. As a next step, a mask is applied having a pattern the reverse of the eventual desired selective metal pattern. The remaining exposed pattern (reverse of the mask pattern) retains its conductive surface and thereby forms a "seed" pattern for subsequent further metal electrodeposition. This subsequent electrodeposition increases metal thickness and also may apply a final coat resistant to an eventual etch. The mask is then removed and the article etched to completely remove the metal that had been covered by the mask.

As previously noted, the current inventor is unaware of any recognizable success in attempts to use DER technology to produce decorative "bright" electroplated objects. Nevertheless, the current inventor has persisted in personal efforts to overcome certain performance deficiencies associated with the initial DER technology. Along with these efforts has come a recognition of unique and eminently suitable applications employing the DER technology for functional applications. These functional applications often have requirements, such as selectivity, fine patterning and relatively thin electrodeposits, which differ substantially from the requirements of purely decorative electroplating. Some examples of these unique applications for electroplated articles include solar cell electrical current collection grids and interconnect structures, electrodes, electrical circuits, electrical traces, circuit boards, antennas, capacitors, induction heaters, connectors, switches, and resistors. One readily recognizes that the demand for such functional applications for electroplated articles is relatively recent and has been particularly explosive during the past decade.

It is important to recognize a number of important characteristics of directly electroplateable resins (DER's) which may facilitate certain embodiments of the current invention. One such characteristic of the DER technology is its ability to employ polymer resins and formulations generally chosen in recognition of the fabrication process envisioned and the intended end use requirements. In order to provide clarity, examples of some such fabrication processes are presented immediately below in subparagraphs 1 through 9.

(1) Should it be desired to electroplate an ink, paint, coating, or paste which may be printed or formed on a substrate, a good film forming polymer, for example a soluble resin such as an elastomer, can be chosen to fabricate a DER ink (paint, coating, paste etc.). For example, in some embodiments thermoplastic elastomers having an olefin base, a urethane base, a block copolymer base or a random copolymer base may be appropriate. In some embodiments the coating may comprise a water based latex. Other embodiments may employ more rigid film forming polymers. The DER ink composition can be tailored for a specific process such flexographic printing, rotary silk screening, gravure printing, ink jet printing, flow coating, spraying etc. Furthermore, additives such as tackifiers or curatives can be employed to improve the adhesion of the DER ink to various substrates.

(2) Very thin DER traces often associated with collector grid structures can be printed and then electroplated due to the inclusion of the electrodeposit growth rate accelerator. Traces as thin as 1.5 micrometer have been demonstrated as practical. Silk screening has produced trace widths as little as 150 micrometers.

(3) Should it be desired to cure the DER substrate to a 3 dimensional matrix, an unsaturated elastomer or other "curable" resin may be chosen.

(4) DER inks can be formulated to form electrical traces on a variety of flexible substrates. For example, should it be desired to form electrical structure on a laminating film, a DER ink adherent to the sealing surface of the laminating film can be effectively electroplated with metal and subsequently laminated to a separate surface.

(5) Should it be desired to electroplate a fabric, a DER ink can be used to coat all or selected portion of the fabric intended to be electroplated. Furthermore, since DER's can be fabricated out of the thermoplastic materials commonly used to create fabrics, the fabric itself could completely or partially comprise a DER. This would eliminate the need to coat the fabric.

(6) Should one desire to electroplate a thermoformed article or structure, DER's would represent an eminently suitable material choice. DER's can be easily formulated using olefinic materials which are often a preferred material for the thermoforming process. Furthermore, DER's can be easily and inexpensively extruded into the sheet like structure necessary for the thermoforming process.

(7) Should one desire to electroplate an extruded article or structure, for example a sheet or film, DER's can be formulated to possess the necessary melt strength advantageous for the extrusion process.

(8) Should one desire to injection mold an article or structure having thin walls, broad surface areas etc. a DER composition comprising a high flow polymer can be chosen.

(9) Should one desire to vary adhesion between an electrodeposited DER structure supported by a substrate the DER material can be formulated to supply the required adhesive characteristics to the substrate. For example, the polymer chosen to fabricate a DER ink can be chosen to cooperate with an "ink adhesion promoting" surface treatment such as a material primer or corona treatment. In this regard, it has been observed that it may be advantageous to limit such adhesion promoting treatments to a single side of the substrate. Treatment of both sides of the substrate in a roll to roll process may adversely affect the surface of the DER material and may lead to deterioration in plateability. For example, it has been observed that primers on both sides of a roll of PET film have adversely affected plateability of DER inks printed on the PET. It is believed that this is due to primer being transferred to the surface of the DER ink when the PET is rolled up.

All polymer fabrication processes require specific resin processing characteristics for success. The ability to "custom formulate" DER's to comply with these changing processing and end use requirements while still allowing facile, quality electroplating is unique among methods to electroplate onto polymeric forms.

Another important recognition regarding the suitability of DER's for the teachings of the current invention is the simplicity of the electroplating process. Unlike many conventional electroplated plastics, DER's do not require a significant number of process steps prior to actual electroplating. This allows for simplified manufacturing and improved process control. It also reduces the risk of cross contamination such as solution dragout from one process bath being transported to another process bath. The simplified manufacturing process will also result in reduced manufacturing costs.

Yet another recognition of the benefit of DER's for the teachings of the current invention is the ability they offer to selectively electroplate metal onto an article or structure. The desired metal structures of the invention often involve long yet fine metal traces. Further, the articles of the invention often consist of such metal patterns selectively positioned in conjunction with flexible insulating materials. Such selective positioning of metals can often be expensive and difficult. As discussed previously, the coverage rate accelerators included in DER formulations allow for such extended surfaces to be covered with electrodeposit in a relatively rapid and simple manner.

Yet another recognition of the benefit of DER's is their ability they to be continuously electroplated. As will be shown in later embodiments, it is often desired to continuously electroplate metal onto "seed" patterns defining specific structure. DER's are eminently suitable as "seed" patterns for such continuous electroplating.

Yet another recognition of the benefit of DER's for the teachings of the current invention is their ability to withstand the pre-treatments often required to prepare other materials for plating. For example, were a DER to be combined with a metal, the DER material would be resistant to many of the pre-treatments such as cleaning which may be necessary to electroplate the metal.

Another important recognition is the suitability of metal electrodeposition for producing articles of the current invention. Electroplating is a rapid and inexpensive metal deposition process. Electroplating allows selective deposition of a wide variety of metals and alloys. Single or multi-layered deposits may be chosen for specific attributes. Examples may include copper for conductivity and nickel, silver or gold for corrosion resistance. Electrodeposition further allows a wide range of appropriate deposit thickness to be achieved relatively quickly. The articles of the invention may require metal traces varying from about 0.1 micrometer to greater than about 100 micrometer (i.e. 0.1 micrometer, 1 micrometer, 10 micrometer 25 micrometer, 100 micrometer etc.). Such thicknesses may be readily achieved in reasonable time using metal electrodeposition.

These and other attributes of DER's and electroplating may contribute to successful articles and processing of the instant invention. However, it is emphasized that the DER technology, and more broadly electroplating onto conductive polymeric "seed" layers, is but one of a number of alternative metal deposition or positioning processes suitable to produce many of the embodiments of the instant invention. Other approaches, such as electroless metal deposition, selective metal etching, placement of metal forms such as wires or strips, stamping metal patterns and selective vacuum or chemical deposition may be suitable alternatives for producing the selectively positioned metal structures of the invention. These choices will become clear to the skilled artisan in light of the teachings to follow in the remaining specification, accompanying figures and claims.

Another important aspect of the embodiments of the current invention is the inclusion of web processing to achieve structure and combinations in a facile and economic fashion. A web is a generally planar or sheet-like structure, normally flexible, having thickness much smaller than its length or width. This sheet-like structure may also have a length far greater than its width. A web of extended length may be conveyed through one or more processing steps in a way that can be described as "continuous", thereby achieving the advantages of continuous processing. "Continuous" web processing is well known in the paper and packaging industries. It is normally accomplished by supplying web material from a feed roll of extended length to the process steps. The product resulting from the process is often continuously retrieved onto a takeup roll following processing, in which case the process may be termed roll-to-roll or reel-to-reel processing.

An advantage of web processing is that the web can comprise many different materials, surface characteristics and forms. The web may comprise layers for packaging material options such as pressure sensitive or hot melt adhesive layers, environmental barriers, and as support for printing and other features. The web can constitute a nonporous film or may be a fabric and may be transparent or opaque. Combinations of such differences over the expansive surface of the web can be achieved. Indeed, as will be shown, the web itself can comprise materials such as conductive polymers or even metal fibers which will allow the web itself to perform electrical function. The web material may remain as part of the final article of manufacture or may be removed after processing, in which case it would serve as a surrogate or temporary support during processing.

In order to eliminate ambiguity in terminology, for the present invention the following definitions are supplied:

While not precisely definable, for the purposes of this specification, electrically insulating materials may generally be characterized as having electrical resistivities greater than 10,000 ohm-cm. Also, electrically conductive materials may generally be characterized as having electrical resistivities less than 0.001 ohm-cm. Also electrically resistive or semiconductive materials may generally be characterized as having electrical resistivities in the range of about 0.01 ohm-cm to about 10,000 ohm-cm. The characterization "electrically conductive polymer" covers a very wide range of intrinsic resistivities depending on the filler, the filler loading and the methods of manufacture of the filler/polymer blend. Resistivities for electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. Thus, the term "electrically conductive polymer" as used in the art and in this specification and claims extends to materials of a very wide range of resistivities from about 0.00001 ohm-cm. to about 10,000 ohm-cm and higher.

An "electroplateable material" is a material having suitable attributes that allow it to be coated with a layer of electrodeposited material.

A "metallizable material" is a material suitable to be coated with a metal deposited by any one or more of the available metallizing process, including chemical deposition, vacuum metallizing, sputtering, metal spraying, sintering and electrodeposition.

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

A "bulk metal foil" refers to a thin structure of metal or metal-based material that may maintain its integrity absent a supporting structure. Generally, metal films of thickness greater than about 2 micrometers may have this characteristic. Thus, in most cases a "bulk metal foil" will have a thickness between about 2 micrometers and 250 micrometers (i.e. 2 micrometer, 5 micrometer, 10 micrometer, 25 micrometer, 100 micrometer, 250 micrometer) and may comprise a laminate of multiple layers.

The term "monolithic" or "monolithic structure" is used in this specification and claims as is common in industry to describe an object that is made or formed into or from a single item or material.

The term "continuous form" refers to a material structure having one dimension of sufficient size such that it can be fed to or retrieved from a process over an extended time period without interruption of the material structure.

The term "continuous process" refers to a process or method in which at least one of the material feed components or a product of the process has a continuous form.

A web is a generally planar or sheet-like structure, normally flexible, having thickness much smaller than its length or width.

"Web processing" is a process wherein a web itself is altered by the process or wherein structure supported by the web is added, altered or otherwise modified by the process.

A "reel to reel" or "roll to roll" process is one wherein at least one of the feed components to a process is supplied in a continuous roll form and the product of the process is retrieved on a takeup roll.

OBJECTS OF THE INVENTION

An object of the invention is to eliminate the deficiencies in the prior art methods of producing expansive area, series or parallel interconnected photovoltaic modules and arrays.

A further object of the present invention is to provide improved substrates to achieve series or parallel interconnections among photovoltaic cells.

A further object of the invention is to provide structures useful for collecting current from an electrically conductive surface.

A further object of the invention is to provide structures useful in collecting current from a surface of limited current carrying capacity such as those of many optoelectric devices including photovoltaic cells. The current collector structure comprising a pattern of highly conductive traces normally extends over a preponderance of the surface from which current is to be collected.

A further object of the present invention is to provide improved processes whereby interconnected photovoltaic modules can be economically mass produced.

A further object of the invention is to provide a process and means to accomplish interconnection of photovoltaic cells into an integrated array through continuous processing.

Other objects and advantages will become apparent in light of the following description taken in conjunction with the drawings and embodiments.

SUMMARY OF THE INVENTION

The current invention provides a solution to the stated needs by producing the active photovoltaic cells and interconnecting structures separately and subsequently combining them to produce the desired interconnected array or module. One embodiment of the invention contemplates deposition of thin film photovoltaic junctions on metal foil substrates which may be heat treated following deposition if required in a continuous fashion without deterioration of the metal support structure. In a separate operation, interconnection structures are produced. In an embodiment, interconnection structures are produced in a continuous roll-to-roll fashion. In an embodiment, the interconnecting structure is laminated to the foil supported photovoltaic cell and conductive connections are applied to complete the array. Application of a separate interconnection structure subsequent to cell manufacture allows the interconnection structures to be uniquely formulated using polymer-based materials. Interconnections are achieved without the need to use the expensive and intricate material removal operations currently taught in the art to achieve interconnections.

In another embodiment, a separately prepared current collector grid structure is taught. In an embodiment the current collector structure is produced in a continuous roll-to-roll fashion. The current collector structure comprises conductive material pattern positioned on a first surface of a laminating sheet or positioning carrier sheet. This combination is prepared such that a first surface of the laminating or positioning sheet and the conductive material can be positioned in abutting contact with a conductive surface. In one embodiment the conductive surface is the light incident surface of a photovoltaic cell. In another embodiment the conductive surface is the rear conductive surface of a photovoltaic cell.

BRIEF DESCRIPTION OF THE DRAWINGS

The various factors and details of the structures and manufacturing methods of the present invention are hereinafter more fully set forth with reference to the accompanying drawings wherein:

FIG. 29 is a top plan view of the original article of FIGS. 26-28 following an additional processing step.

FIG. 30 is a sectional view taken substantially from the perspective of lines 30-30 of FIG. 29.

FIG. 31 is a sectional view of the article of FIGS. 29 and 30 following an additional optional processing step.

FIG. 32 is a sectional view, similar to FIG. 22, showing an arrangement of articles just prior to combination using a process such as depicted in FIG. 21.

FIG. 55 is a sectional view showing an article combining the article of FIG. 52 with a photovoltaic cell.

FIG. 56 is a sectional view embodying series interconnection of multiple articles as depicted in FIG. 55.

DESCRIPTION OF PREFERRED EMBODIMENTS

Figure 1:
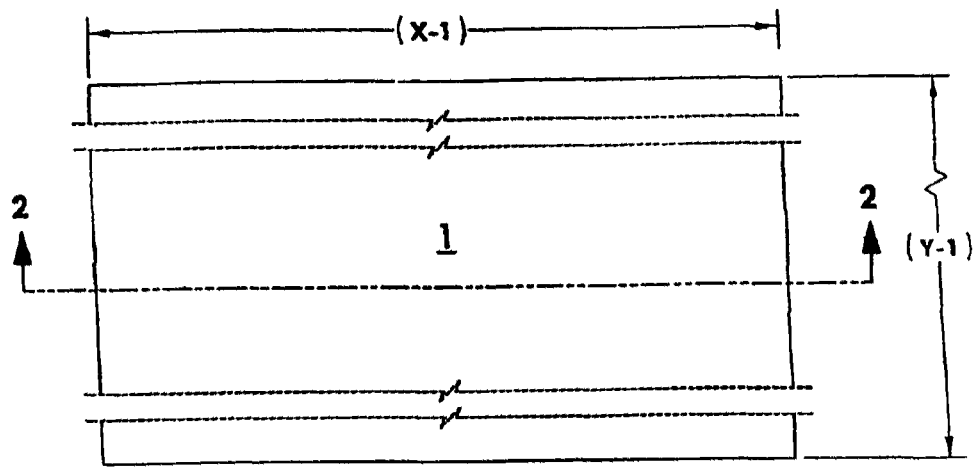
FIG. 1 is a top plan view of a thin film photovoltaic structure including its support structure.

Reference will now be made in detail to the preferred embodiments of the invention, examples of which are illustrated in the accompanying drawings. In the drawings, like reference numerals designate identical, equivalent or corresponding parts throughout several views and an additional letter designation is characteristic of a particular embodiment.

Figure 2:
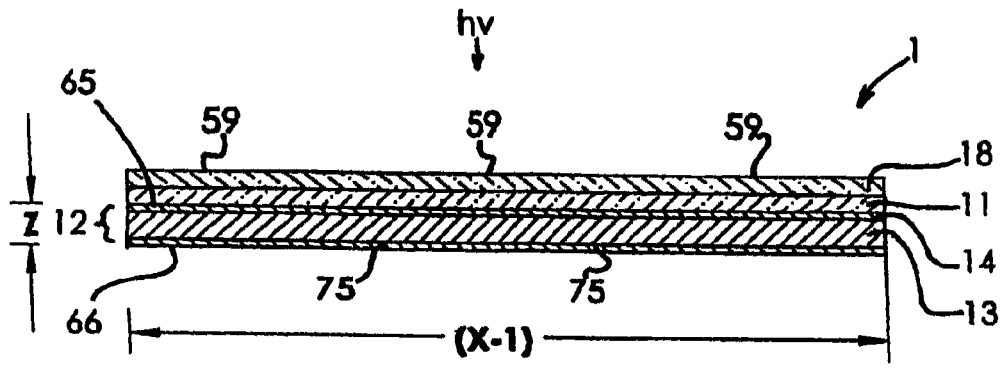
FIG. 2 is a sectional view taken substantially along the line 2-2 of FIG. 1.

Referring to FIGS. 1 and 2, an embodiment of a thin film photovoltaic structure is generally indicated by numeral 1. It is noted here that "thin film" has become commonplace in the industry to designate certain types of semiconductor materials in photovoltaic applications. These include amorphous silicon, cadmium telluride, copper-indium-gallium diselenide, dye sensitized polymers, so-called "Graetzel" electrolyte cells and the like. While the characterization "thin film" may be used to describe many of the embodiments of the instant invention, principles of the invention may extend to photovoltaic devices not normally considered "thin film" such as single crystal or polysilicon devices, as those skilled in the art will readily appreciate. The article 1 embodiment has a light-incident top surface 59 and a bottom surface 66. Structure 1 has a width X-1 and length Y-1. It is contemplated that length Y-1 may be considerably greater than width X-1 such that length Y-1 can generally be described as "continuous" or being able to be processed in a roll-to-roll fashion. FIG. 2 shows that embodiment 1 structure comprises a thin film semiconductor structure 11 supported by "bulk" metal-based foil 12. "Bulk" foil 12 is often self supporting to allow continuous processing. Foil 12 has a top surface 65, bottom surface 66, and thickness "Z". In the embodiment, bottom surface 66 of foil 12 also forms the bottom surface of photovoltaic structure 1. Metal-based foil 12 may be of uniform composition or may comprise a laminate of multiple layers. For example, foil 12 may comprise a base layer of inexpensive and processable metal 13 with an additional metal-based layer 14 disposed between base layer 13 and semiconductor structure 11. The additional metal-based layer 14 may be chosen to ensure good ohmic contact between the top surface 65 of foil 12 and photovoltaic semiconductor structure 11. Bottom surface 66 of foil 12 may comprise a material 75 chosen to achieve good electrical and mechanical joining characteristics as will be shown. The thickness "Z" of foil 12 is often between 2 micrometers and 250 micrometers (i.e. 5 micrometers, 10 micrometers, 25 micrometers, 50 micrometers, 100 micrometers, 250 micrometers), and most often in the range of 10 micrometer to 125 micrometer although thicknesses outside this range may be functional in certain applications. One notes for example that should additional support be possible, such as that supplied by a supporting plastic film, metal foil thickness may be far less (0.1 to 1 micrometer) than those characteristic of a "bulk" foil. Nevertheless, a foil thickness between 2 micrometers and 250 micrometers may be self supporting and provide adequate handling strength and integrity while still allowing flexibility for certain processing as further taught hereinafter.

Figure 3:
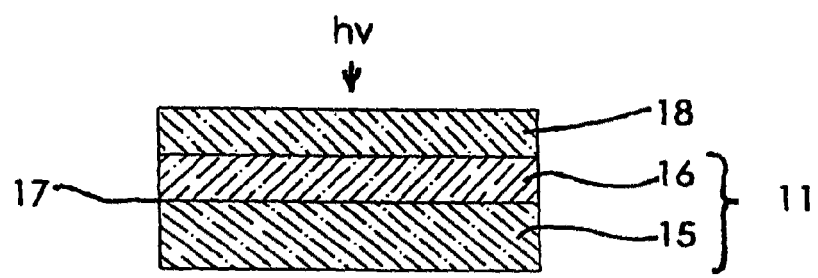
FIG. 3 is an expanded sectional view showing a form of the structure of semiconductor 11 of FIGS. 2 and 2A.

In its simplest form, a photovoltaic structure combines an n-type semiconductor with a p-type semiconductor to from a p-n junction. Often an optically transparent "window electrode", such as a thin film of zinc oxide, tin oxide indium tin oxide or the like is employed to minimize resistive losses involved in current collection. FIG. 3 illustrates an example of a typical photovoltaic structure in section. In FIGS. 2 and 3 and other figures, an arrow labeled "hv" is used to indicate the light incident side of the structure. In FIG. 3, 15 represents a thin film of a p-type semiconductor, 16 a thin film of n-type semiconductor and 17 the resulting photovoltaic junction. Window electrode 18 completes a typical photovoltaic structure. Various photovoltaic structures are known. For example, cells can be multiple junction or single junction and comprise homo or hetero junctions. Semiconductor structure 11 may comprise any of the thin film structures known in the art, including but not limited to CIS, CIGS, CdTe, Cu2S, amorphous silicon, so-called "Graetzel" electrolyte cells, organic solar cells such as dye sensitized cells, polymer based semiconductors, cells based on silicon inks and the like. Further, semiconductor structure 11 may also represent characteristically "non-thin film" cells such as those based on single crystal or polycrystal silicon since many embodiments of the invention may encompass such cells, as will be evident to those skilled in the art in light of the teachings to follow.

"Window electrode" 18 normally comprises a conductive metal oxide. These materials are applied as a thin layer, normally having a thickness less than about 1 micrometer. In addition, these materials have much higher intrinsic resistivity (in the range 0.001 ohm-cm.) than metals such as copper. Thus the light incident surface of the cell, despite being characterized as conductive, has limited current carrying capacity.

In the following, photovoltaic cells having a "bulk" metal based support foil will be used to illustrate many of the embodiments and teachings of the invention. The metal based foil may often serve as the back electrode of the cell. However, those skilled in the art will recognize that many of the applications of the instant invention may not use a "bulk" foil as represented in FIGS. 1 and 2. In many embodiments, other substrate structures, such as a metallized polymer film or glass, or a thin conductive polymer layer, may be employed as a back electrode rather than a "bulk" metal foil.

Figure 4:
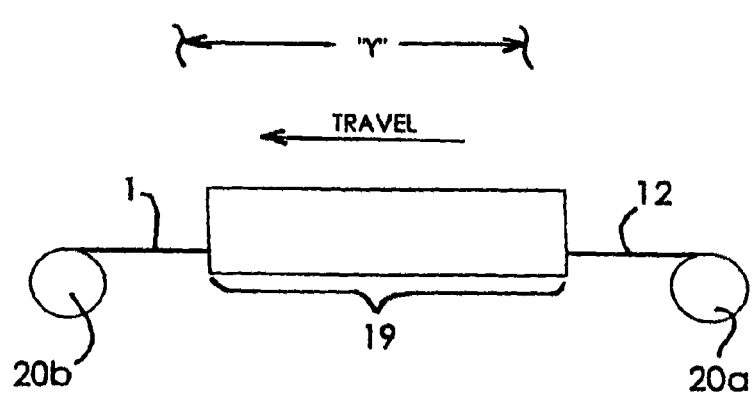
FIG. 4 illustrates a possible process for producing the structure shown in FIGS. 1-3.

FIG. 4 refers to a method of manufacture of bulk thin film photovoltaic structures generally illustrated in FIGS. 1 and 2. In the FIG. 4 embodiment, a metal-based support foil 12 is moved in the direction of its length Y through a deposition process, generally indicated as 19. Often foil 12 possesses structural characteristics such that it may be characterized as self supporting. Process 19 accomplishes deposition of the active photovoltaic structure onto foil 12. Foil 12 is unwound from supply roll 20a, passed through deposition process 19 and rewound onto takeup roll 20b. Process 19 can comprise any of the processes well-known in the art for depositing thin film photovoltaic structures. These processes include electroplating, vacuum evaporation and sputtering, chemical deposition, and printing of nanoparticle precursors. Process 19 may also include treatments, such as heat treatments, intended to enhance photovoltaic cell performance.

Figure 1A:
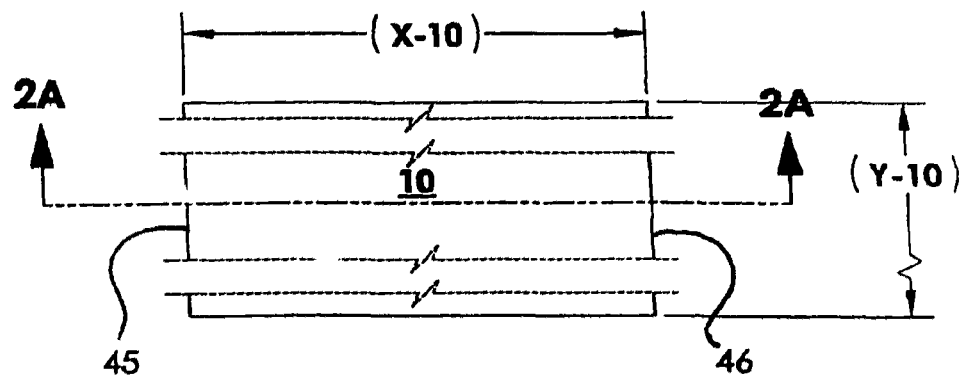
FIG. 1A is a top plan view of the article of FIG. 1 following an optional processing step of subdividing the article of FIG. 1 into cells of smaller dimension.
Figure 2A:
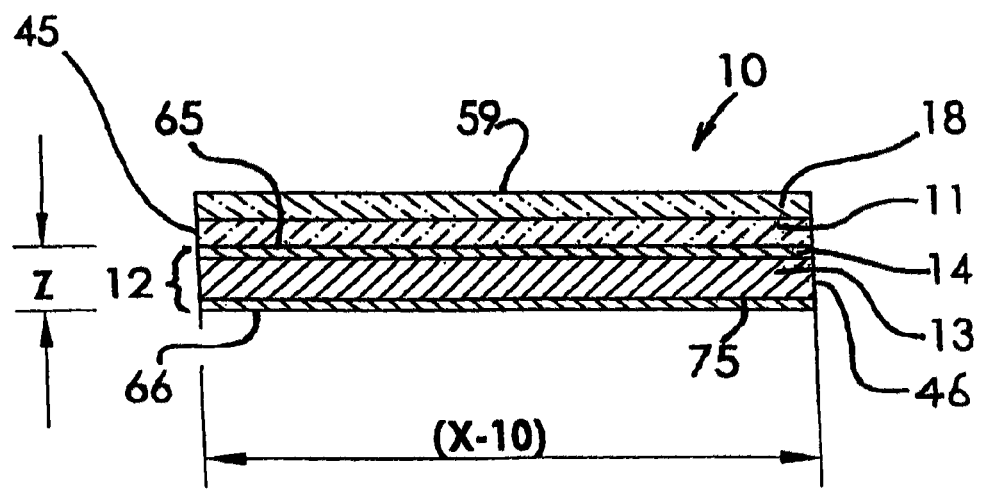
FIG. 2A is a sectional view taken substantially along the line 2A-2A of FIG. 1A.

Those skilled in the art will readily realize that the deposition process 19 of FIG. 4 may often most efficiently produce photovoltaic structure 1 having dimensions far greater than those suitable for individual cells in an interconnected array. Thus, the photovoltaic structure 1 may be subdivided into cells 10 having dimensions X-10 and Y-10 as indicated in FIGS. 1A and 2A for further fabrication. In FIG. 1A, width X-10 defines a first photovoltaic cell terminal edge 45 and second photovoltaic cell terminal edge 46. In one embodiment, for example, X-10 of FIG. 1A may be from 0.02 inches to 12 inches and Y-10 of FIG. 1A may be characterized as "continuous". In other embodiments the final form of cell 10 may be rectangular, such as 6 inch by 6 inch, 4 inch by 3 inch or 8 inch by 2 inch. In other embodiments, the photovoltaic structure 1 of FIG. 1 may be subdivided in the "X" dimension only thereby retaining the option of further processing in a "continuous" fashion in the "Y" direction. In the following, cell structure 10 in a form having dimensions suitable for interconnection into a multi-cell array may be referred to as "cell stock" or simply as cells. "Cell stock" can be characterized as being either continuous or discreet.

Figure 2B:
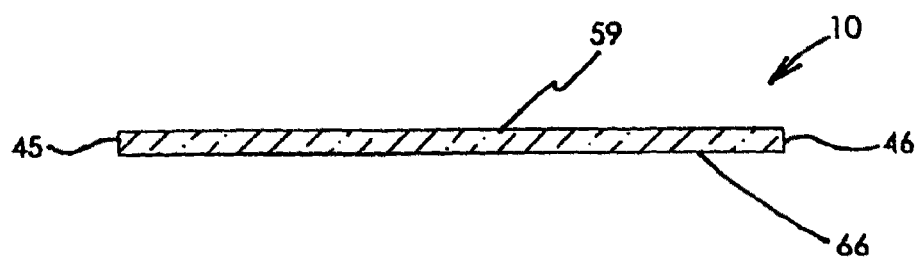
FIG. 2B is a simplified sectional depiction of the structure embodied in FIG. 2A.

FIG. 2B is a simplified depiction of cell 10 shown in FIG. 2A. In order to facilitate presentation of the aspects of the instant invention, the simplified depiction of cell 10 shown in FIG. 2B will normally be used.

Figure 5:
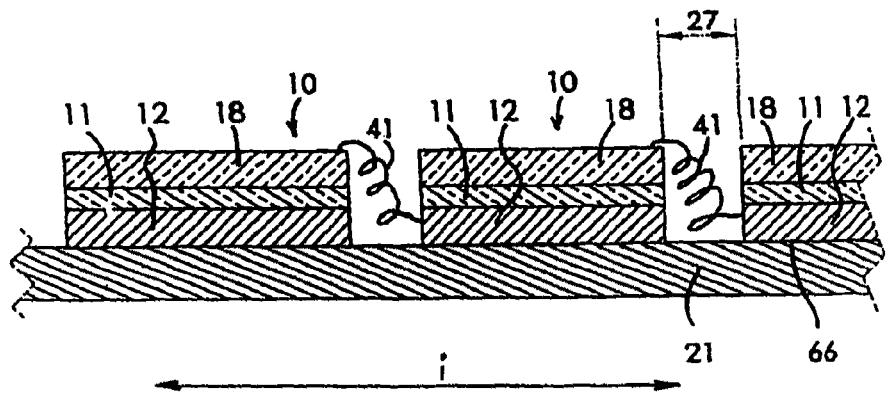
FIG. 5 is a sectional view illustrating the problems associated with making series connections among thin film photovoltaic cells shown in FIGS. 1-3.

Referring now to FIG. 5, there are illustrated cells 10 as shown in FIG. 2A. The cells have been positioned to achieve spatial positioning on the support substrate 21. Support structure 21 is by necessity non-conductive at least in a space indicated by numeral 27 separating the adjacent cells 10. This insulating space prevents short circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication is shown in the FIG. 5 as a metal wire or tab 41. The direction of the net current flow for the arrangement shown in FIG. 5 is indicated by the double pointed arrow "i". It should be noted that foil electrode 12 is normally relatively thin, on the order of 5 micrometer to 250 micrometer. Moreover, in order to have the flexibility and physical integrity required for processing such as the roll-to-roll process 19 as embodied in FIG. 4, a foil thickness of between 10 micrometers and 250 micrometer may be appropriate. Therefore, connecting to the foil edge as indicated in FIG. 5 would be impractical. Thus, such connections are normally made to the top surface 65 or the bottom surface 66 of foil 12. One readily recognizes that connecting metal wire or tab 41 is laborious, making inexpensive production difficult.

Figure 6:
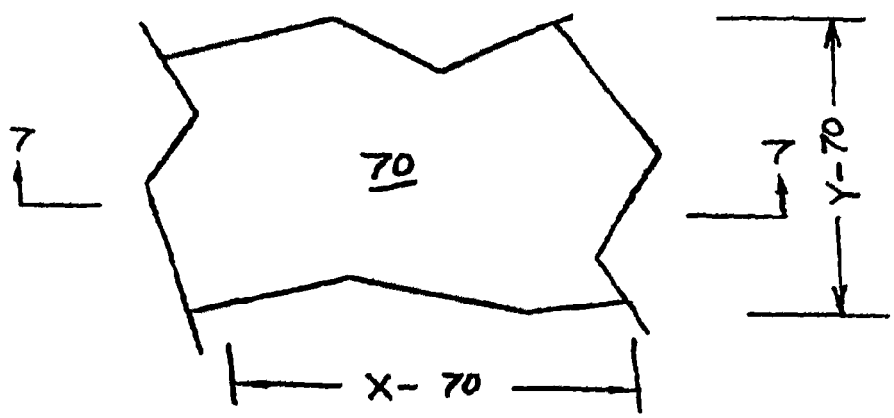
FIG. 6 is a top plan view of a starting structure for an embodiment of the instant invention.
Figure 7:
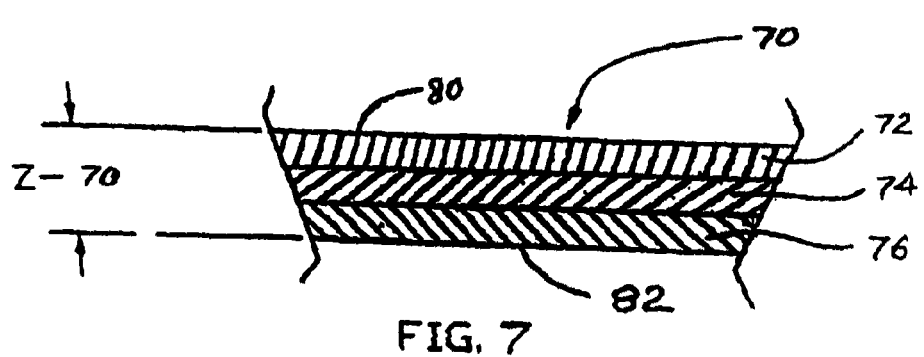
FIG. 7 is a sectional view, taken substantially along the lines 7-7 of FIG. 6, illustrating a possible laminate structure of the embodiment.

FIG. 6 is a top plan view of a starting article in production of a laminating current collector grid or electrode according to the instant invention. FIG. 6 embodies a polymer based film or glass substrate 70. Substrate 70 has width X-70 and length Y-70. When substrate 70 comprises glass, it would typically be processed as discrete articles having defined width and length dimensions. In other embodiments involving, for example, flexible films or webs and taught in detail below, Y-70 may be much greater than width X-70, whereby substrate film 70 can generally be described as "continuous" in length and able to be processed in length direction Y-70 in a continuous fashion. FIG. 7 is a sectional view taken substantially from the view 7-7 of FIG. 6. Thickness dimension Z-70 is small in comparison to dimensions Y-70, X-70. In a preferred embodiment substrate 70 may have a flexible sheetlike, or web structure. However, substrate flexibility is not a requirement for all embodiments of the invention. As shown in FIG. 7, substrate 70 may be a laminate of multiple layers 72, 74, 76 etc. or may comprise a single layer of material. Any number of layers 72, 74, 76 etc. may be employed. The layers 72, 74, 76 etc. may comprise inorganic or organic components such as thermoplastics, thermosets or silicon containing glass-like layers. The various layers are intended to supply functional attributes such as environmental barrier protection or adhesive characteristics. Such functional layering is well-known and widely practiced in the plastic packaging art. Sheetlike substrate 70 has first surface 80 and second surface 82. In particular, in light of the teachings to follow, one will recognize that it may be advantageous to have layer 72 forming surface 80 comprise a polymeric adhesive sealing material such as an ethylene vinyl acetate (EVA), ethylene ethyl acetate (EEA), an ionomer, or a polyolefin based adhesive to impart adhesive characteristics during a possible subsequent lamination process. It may be advantageous for the adhesive layer to have elastomeric characteristics to insure flexibility and stress relief for the composite. Other sealing materials useful in certain embodiments include those comprising silicones, silicone gels, epoxies, polydimethyl siloxane (PDMS), RTV rubbers, polyvinyl butyral (PVB), thermoplastic polyurethanes (TPU), acrylics and urethanes. An adhesive layer 72 forming surface 80 may further comprise a curing component which would activate to produce a cross linked structure. Such cross linking may improve adhesion of surface 80 to a mating surface or also function to resist permanent deformation during thermal cycling. Suitable curatives may be activated by heat and/or radiation such as ultraviolet (UV) radiation.

Lamination of such sheetlike films employing such sealing materials is a common practice in the packaging industry. In the packaging industry lamination is known and understood as applying a film, normally polymer based and normally having a surface comprising a sealing material, to a second surface and sealing them together with heat and/or pressure. However, while a combination of heat and pressure is often used in the lamination process, the instant invention is applicable to laminating materials, such as pressure sensitive adhesives, which may be applied using pressure alone. Suitable sealing materials may be made tacky and flowable, often under heated conditions, and retain their adhesive bond to many surfaces upon cooling and/or release of pressure. A wide variety of laminating films with associated sealing materials is possible, depending on the surface to which the adhesive seal or bond is to be made. Sealing materials such as olefin copolymers or atactic polyolefins may be advantageous, since these materials allow for the minimizing of materials which may be detrimental to the longevity of a solar cell with which it is in contact. Additional layers 74, 76 etc. may comprise materials which assist in support or processing such as polypropylene, polyethylene terepthalate and polycarbonate. Additional layers 74, 76 may comprise barrier materials such as fluorinated polymers, biaxially oriented polypropylene (BOPP), Saran, and thin compound layers such as Siox. Saran is a tradename for poly (vinylidene chloride) manufactured by Dow Chemical Corporation. Siox refers to a thin film of silicon oxide often vapor deposited on a polymer support. Additional layers 74, 76 etc. may also comprise materials intended to afford protection against ultraviolet radiation and may also comprise materials to promote curing. The instant invention does not depend on the presence of any specific material for layers 72, 74, or 76. In many embodiments substrate 70 may be generally be characterized as a laminating material. For example, the invention has been successfully demonstrated using standard laminating films sold by GBC Corp., Northbrook, Ill., 60062.

Figure 8:
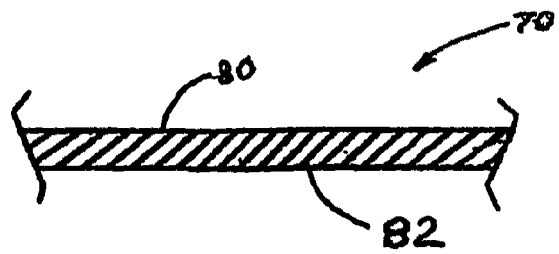
FIG. 8 is a simplified sectional depiction of the FIG. 7 structure suitable for ease of presentation of additional embodiments.

FIG. 8 depicts the structure of substrate 70 (possibly laminate) as a single layer for purposes of presentation simplicity. Substrate 70 will be represented as this single layer in the subsequent embodiments, but it will be understood that structure 70 may be a laminate of any number of layers. In addition, substrate 70 is shown in FIGS. 6 through 8 as a uniform, unvarying monolithic sheet. In this specification and claims, the term "monolithic" or "monolithic structure" is used as is common in industry to describe an object that is made or formed into or from a single item. However, it is understood that various regions of substrate 70 may differ in composition through thickness Z-70. For example, selected regions of substrate 70 may comprise differing sheetlike structures patched together using appropriate seaming techniques. A purpose for such a "patchwork" structure will become clear in light of the teachings to follow.

Figure 9:
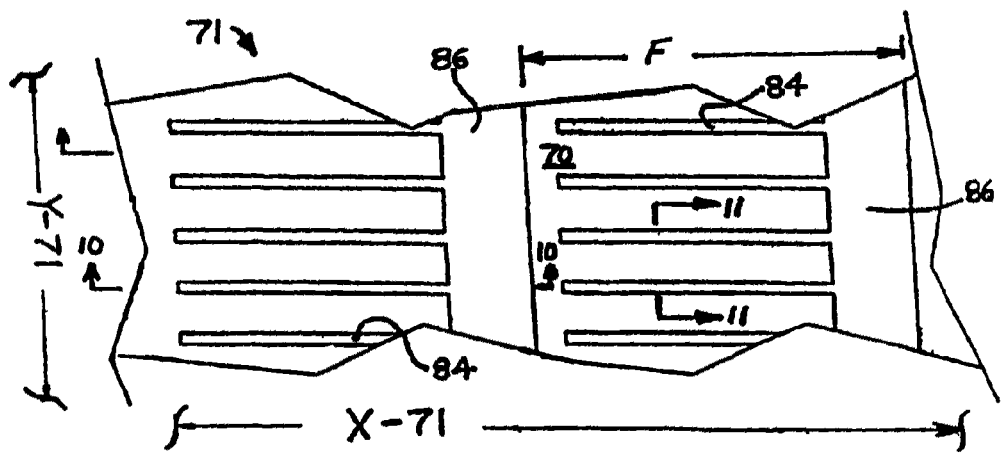
FIG. 9 is a top plan view of the structure embodied in FIGS. 6 through 8 following an additional processing step.

FIG. 9 is a plan view of the structure following an additional manufacturing step.

Figure 10:
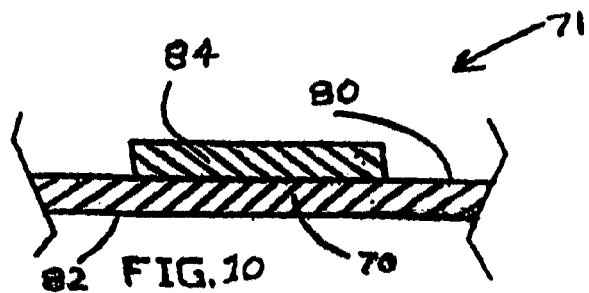
FIG. 10 is a sectional view taken substantially from the perspective of lines 10-10 of FIG. 9.

FIG. 10 is a sectional view taken along line 10-10 of FIG. 9.

Figure 11:
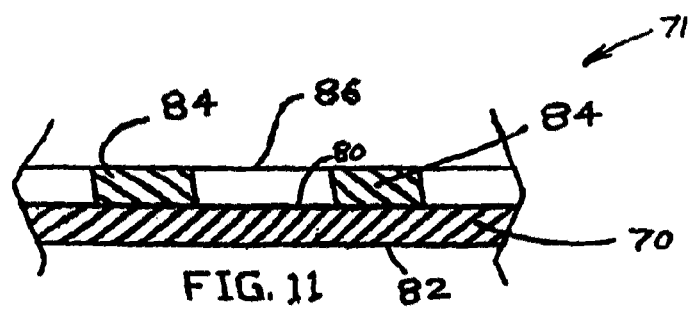
FIG. 11 is a sectional view taken substantially from the perspective of lines 11-11 of FIG. 9.

FIG. 11 is a sectional view taken along line 11-11 of FIG. 9.

In the embodiment of FIGS. 9, 10, and 11, a structure is now designated 71 to reflect the additional processing. It is seen in these embodiments that a repetitive pattern of multiple repetitively spaced "fingers" or "traces", designated 84, extends from "buss" or "tab" structures, designated 86. In the embodiments of FIGS. 9, 10, and 11, both "fingers" 84 and "busses" 86 are positioned on supporting substrate 70 in a grid pattern. In this embodiment, "fingers" 84 extend in the width X-71 direction of article 71 and "busses" ("tabs") extend in the Y-71 direction substantially perpendicular to the "fingers". Dimensions and structure for the "fingers" and "busses" may vary with application. For example, if the article 71 is intended for collecting current from a top light incident surface of a photovoltaic cell, one will understand that shading by "fingers" 84 is of concern. Thus, the surface area of the fingers may normally be minimized consistent with adequate current carrying characteristics. Dimensions may also be dictated somewhat by the materials and fabrication process used to create the fingers and busses, and the dimensions of the individual cell. For example, should the fingers be formed by a process such as silk screening of an ink, a minimum practical width of about 100 micrometer is typical. Should the fingers be formed by other techniques such as selective metal etching or metal wire placement, widths less than 100 micrometers may be suitable. Spacing between the fingers may also vary depending on factors such as current carrying capacity and surface conductivity of a mating conductive surface.

While a pattern of "fingers" and "busses" is shown in the FIG. 9 embodiment, one will readily understand that other patterns appropriate to the eventual application of the article are possible and that the pattern of "fingers"/"busses" is but one of many structural patterns possible within the scope of the instant invention. Specifically, the invention allows design flexibility associated with the process used to establish the material pattern of "fingers" and "busses". "Design flexible" processing includes printing of conductive inks or "seed" layers, foil etching or stamping, masked deposition using paint or vacuum deposition, and the like. As an example, the conductive paths can have triangular type surface structures increasing in width (and thus cross section) in the direction of current flow. Thus the resistance decreases as net current accumulates to reduce power losses. Various structural features, such as radiused connections between fingers and busses may be employed to improve structural robustness Further, the invention permits a variety of structural forms to create the pattern. For example, while the embodiments of FIGS. 9 through 11 show the "fingers" and "busses" as essentially planar rectangular structures, the fingers or traces may be wires of circular cross section.

As indicated, structure 71 may be produced and processed extending continuously in the length "Y-71" direction. Repetitive multiple "finger/buss" arrangements are shown in the FIG. 9 embodiment with a repeat dimension "F" as indicted. As will be seen, dimension "F" is associated with the repeat distance among adjacent interconnected photovoltaic cells. When structure 71 is intended for eventual use as a current collector structure for the light incident surface of a photovoltaic cell, portions of substrate 70 not overlayed by "fingers" 84 and "busses" 86 remain transparent or translucent to visible light. In the embodiment of FIGS. 9 through 11, the "fingers" 84 and "busses" 86 are shown to be a single layer for simplicity of presentation. However, the "fingers" and "busses" can comprise multiple layers of differing materials chosen to support various functional attributes. For example the material in direct contact with substrate 70 defining the "buss" or "finger" patterns may be chosen for its adhesive affinity to surface 80 of substrate 70 and also to a subsequently applied constituent of the buss or finger structure. Further, it may be advantageous to have the first visible material component of the fingers and busses be of dark color or black. As will be shown, the light incident side (outside surface) of the substrate 70 will eventually be surface 82. By having the first visible component of the fingers and busses be dark, they will aesthetically blend with the generally dark color of the photovoltaic cell. This eliminates the often objectionable appearance of a metal colored grid pattern.

"Fingers" 84 and "busses" 86 may comprise electrically conductive material. Examples of such materials are metal wires and foils, stamped or die cut metal patterns, conductive metal containing inks and pastes such as those having a conductive filler comprising silver or stainless steel, patterned deposited metals such as etched metal patterns or masked vacuum deposited metals, intrinsically conductive polymers and DER formulations. In a preferred embodiment, the pattern of "fingers and "busses" comprise electroplateable material such as DER or an electrically conductive ink which will enhance or allow subsequent metal electrodeposition. "Fingers" 84 and "busses" 86 may also comprise non-conductive material which would assist accomplishing a subsequent deposition of conductive material in the pattern defined by the "fingers" and "busses". For example, "fingers" 84 or "busses" 86 could comprise a polymer which may be seeded to catalyze chemical deposition of a metal in a subsequent step. An example of such a material is seeded ABS. Patterns comprising electroplateable materials or materials facilitating subsequent electrodeposition are often referred to as "seed" patterns or layers. "Fingers" 84 and "busses" 86 may also comprise materials selected to promote adhesion of a subsequently applied conductive material. "Fingers" 84 and "busses" 86 may differ in actual composition and be applied separately. For example, "fingers" 84 may comprise a conductive ink while "buss/tab" 86 may comprise a conductive metal foil strip. Alternatively, fingers and busses may comprise a continuous unvarying monolithic material structure forming portions of both fingers and busses. Fingers and busses need not both be present in certain embodiments of the invention.

One will recognize that while shown in the embodiments as a continuous void free surface, "buss" 86 could be selectively structured. Such selective structuring may be appropriate to enhance functionality, such as flexibility, of article 71 or any article produced there from. Furthermore, regions of substrate 70 supporting the "buss" regions 86 may be different than those regions supporting "fingers" 84. For example, substrate 70 associated with "buss region" 86 may comprise a fabric while substrate 70 may comprise a solid transparent film in the region associated with "fingers" 84. A "holey" structure in the "buss region" would provide increased flexibility, increased surface area and increased structural characteristic for an adhesive to grip.

The embodiment of FIG. 9 shows multiple "busses" 86 extending in the direction Y-71 with "fingers" extending from one side of the "busses" in the X-71 direction. Many different such structural arrangements of the laminating current collector structures are possible within the scope and purview of the instant invention. It is important to note however that the laminating current collector structures of the instant invention may be manufactured utilizing continuous, bulk processing, including roll to roll processing. While the collector grid embodiments of the current invention may advantageously be produced using continuous processing, one will recognize that combining of grids or electrodes so produced with mating conductive surfaces may be accomplished using either continuous or batch processing. In one case it may be desired to produce photovoltaic cells having discrete defined dimensions. For example, single crystal silicon cells are often produced having X-Y dimensions of about 6 inches by 6 inches. In this case the collector grids of the instant invention, which may be produced continuously, may then be subdivided to dimensions appropriate for combining with such cells. In other cases, such as production of many thin film photovoltaic structures, a continuous roll-to-roll production of an expansive surface article can be accomplished in the "Y" direction as identified in FIG. 1. Such a continuous expansive photovoltaic structure may be combined with a continuous arrangement of collector grids of the instant invention in a semicontinuous or continuous manner. Alternatively the expansive semiconductor structure may be subdivided into continuous strips of cell stock. In this case, combining a continuous strip of cell stock with a continuous strip of collector grid of the instant invention may be accomplished in a continuous or semi-continuous manner.

Figure 12:
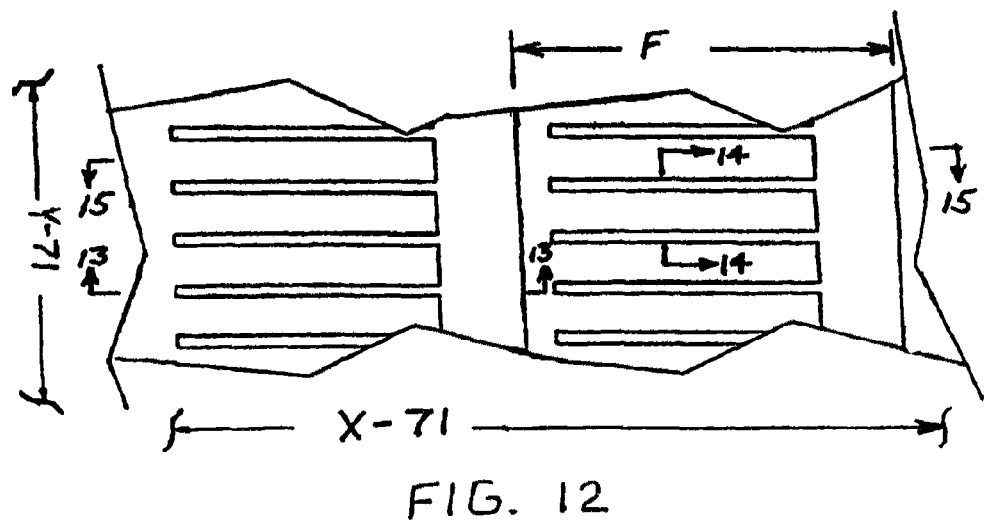
FIG. 12 is a top plan view of an article resulting from exposing the FIG. 9 article to an additional processing step.
Figure 13:
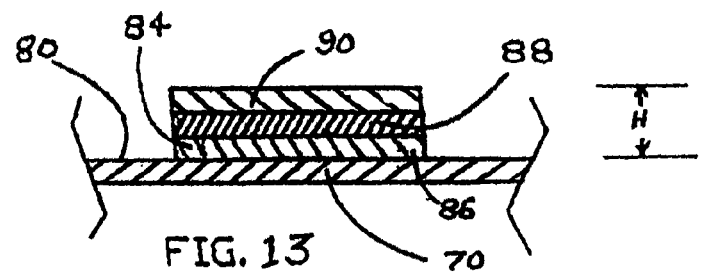
FIG. 13 is a sectional view taken substantially from the perspective of lines 13-13 of FIG. 12.
Figure 14:
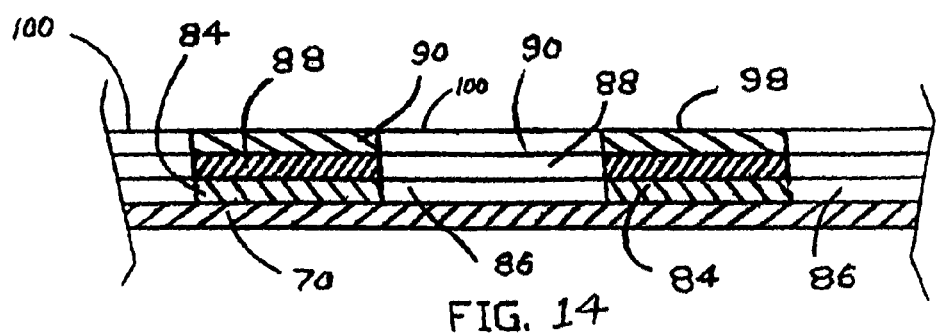
FIG. 14 is a sectional view taken substantially from the perspective of lines 14-14 of FIG. 12.
Figure 15:
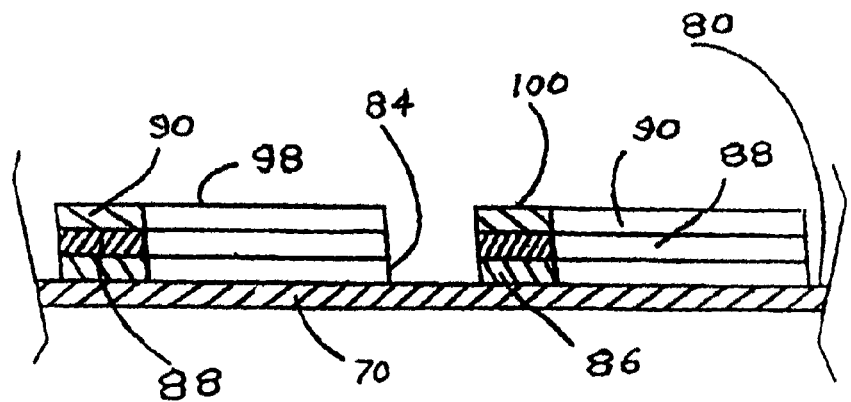
FIG. 15 is a sectional view taken substantially from the perspective of lines 15-15 of FIG. 12.

FIGS. 12, 13 and 14 correspond to the views of FIGS. 9, 10 and 11 respectively following an additional optional processing step. FIG. 15 is a sectional view taken substantially along line 15-15 of FIG. 12. FIGS. 12 through 15 show additional conductive material deposited onto the "fingers" 84 and "busses" 86 of FIGS. 9 through 11. In this embodiment additional conductive material is designated by one or more layers 88, 90 and the fingers and busses project above surface 80 as shown by dimension "H". In some cases it may be desirable to reduce the height of projection "H" prior to eventual combination with a conductive surface such as 59 or 66 of photovoltaic cell 10. This reduction may be accomplished by passing the structures as depicted in FIGS. 12-15 through a pressurized and/or heated roller or the like to embed "fingers" 84 and/or "busses" 86 into layer 72 of substrate 70.

While shown as two layers 88, 90, it is understood that this conductive material could comprise more than two layers or be a single layer. In addition, while each additional conductive layer is shown in the embodiment as having the same continuous monolithic material extending over both the buss and finger patterns, one will realize that selective deposition techniques would allow the additional "finger" layers to differ from additional "buss" layers. For example, as best shown in FIG. 14, "fingers" 84 have top free surface 98 and "busses" 86 have top free surface 100. As noted, selective deposition techniques such as brush electroplating or masked deposition would allow different materials to be considered for the "buss" surface 100 and "finger" surface 98. In a preferred embodiment, at least one of the additional layers 88, 90 etc. are deposited by electrodeposition, taking advantage of the deposition speed, compositional choice, low cost and selectivity of the electrodeposition process. Many various metals, including highly conductive silver, copper and gold, nickel, tin, indium and alloys of these can be readily electrodeposited. In these embodiments, it may be advantageous to utilize electrodeposition technology giving an electrodeposit of low tensile stress to prevent curling and promote flatness of the metal deposits. In particular, use of nickel deposited from a nickel sulfamate bath, nickel deposited from a bath containing stress reducing additives such as brighteners, or copper from a standard acid copper bath have been found particularly suitable. Electrodeposition also permits precise control of thickness and composition to permit optimization of other requirements of the overall manufacturing process for interconnected arrays. Thus, the electrodeposited metal may significantly increase the current carrying capacity of the "buss" and "finger" structure and may be the dominant current carrying material for these structures. In general, electrodeposit thicknesses characterized as "low profile", less than about 50 micrometer (i.e. 1 micrometer, 10 micrometer, 25 micrometer, 50 micrometer), supply adequate current carrying capacity for the grid "fingers" of the instant invention. Thus electrodeposited metal offers a very appropriate material to achieve the dominant current carrying capacity for the "buss" and "finger" structure. Alternatively, these additional conductive layers may be deposited by selective chemical deposition or registered masked vapor deposition. These additional layers 88, 90 may also comprise conductive inks or adhesives applied by registered printing.

It has been found very advantageous to form surface 98 of "fingers" 84 or top surface 100 of "busses" 86 with a material compatible with the conductive surface with which eventual contact is made. In preferred embodiments, electroless deposition or electrodeposition is used to form a suitable metallic surface. Specifically electrodeposition offers a wide choice of potentially suitable materials to form the top surface. Corrosion resistant materials such as nickel, chromium, tin, indium, silver, gold and platinum are readily electrodeposited. These functional top coatings, sometimes referred to as "flash" coatings, are often thin, less than about two micrometer (i.e. 0.1 micrometer, 1 micrometer, 2 micrometer). The "flash" coatings normally need not exhibit exceptional current carrying capacity since the bulk of the current may be carried by the underlying material such as the above described electroplated metals such as copper. When compatible, of course, surfaces comprising metals such as copper or zinc or alloys of copper or zinc may be considered. Alternatively, surfaces 98 and 100 may comprise a conversion coating, such as a chromate coating, of a material such as copper or zinc. Further, as will be discussed below, it may be highly advantageous to choose a material to form surfaces 98 or 100 which exhibits adhesive or bonding ability to a subsequently positioned abutting conductive surface. For example, it may be advantageous to form surfaces 98 and 100 using an electrically conductive adhesive. Such an adhesive could be applied intermittently, for example as a series of "dots" over the underlying conductive surface. Alternatively, it may be advantageous to form surfaces 98 of "fingers" 84 or 100 of "busses" 86 with a conductive material such as a low melting point metal such as tin, tin containing alloys, indium, lead etc. in order to facilitate electrical joining to a complimentary conductive surface. Such low melting point materials can be caused to melt at temperatures below that of many polymer processing operations such as lamination. These processes are normally carried out at temperatures below about 325 degree C. (i.e. 100 degree C., 150 degree C., 250 degree C.). One will note that materials forming "fingers" surface 98 and "buss" surface 100 need not be the same. It is emphasized that many of the principles taught in detail with reference to FIGS. 6 through 15 extend to additional embodiments of the invention taught in subsequent Figures.

Figure 16:
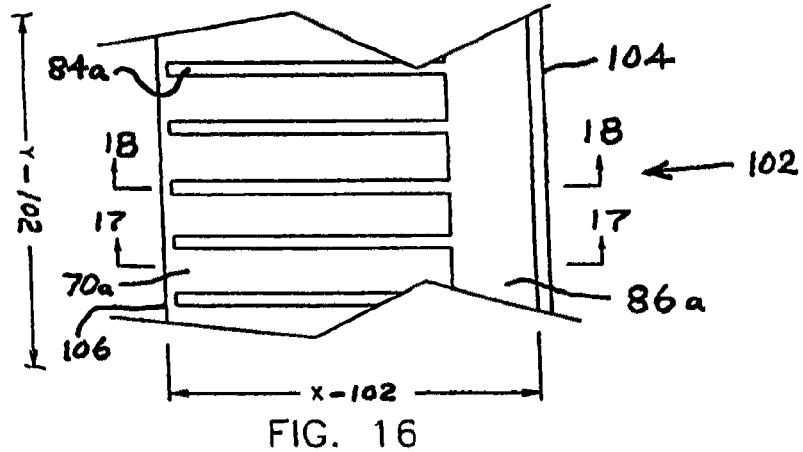
FIG. 16 is a top plan of an alternate embodiment similar in structure to the embodiment of FIG. 9.

FIG. 16 is a top plan view of an article 102 embodying another form of the electrodes of the current invention. FIG. 16 shows article 102 having structure comprising "fingers" 84a extending from "buss/tab" 86a arranged on a substrate 70a. The structure of FIG. 16 is similar to that shown in FIG. 9. However, whereas FIG. 9 depicted multiple finger and buss/tab structures arranged in a substantially repetitive pattern in direction "X-71", the FIG. 16 embodiment consists of one finger/buss pattern. Thus, the dimension "X-102" of FIG. 16 may be roughly equivalent to the repeat dimension "F"

shown in FIG. 9. Indeed, it is contemplated that article 102 of FIG. 16 may be produced by subdividing the FIG. 9 structure 71 according to repeat dimension "F" shown in FIG. 9. Dimension "Y-102" may be chosen appropriate to the particular processing scheme envisioned for the eventual lamination to a conductive surface such as a photovoltaic cell. However, it is envisioned that "Y-102" may be much greater than "X-102" such that article 102 may be characterized as continuous or capable of being processed in a continuous, possibly roll-to-roll fashion. Article 102 has a first terminal edge 104 and second terminal edge 106. In the FIG. 16 embodiment "fingers" 84a are seen to terminate prior to intersection with terminal edge 106. One will understand that this is not a requirement.

"Fingers" 84a and "buss/tab" 86a of FIG. 16 have the same characterization as "fingers" 84 and "busses" 86 of FIGS. 9 through 11. Like the "fingers" 84 and "busses" 86 of FIGS. 9 through 11, "fingers" 84a and "buss" 86a of FIG. 16 may comprise materials that are either conductive, assist in a subsequent deposition of conductive material or promote adhesion of a subsequently applied conductive material to substrate 70a. While shown as a single layer, one appreciates that "fingers" 84a and "buss" 86a may comprise multiple layers. The materials forming "fingers" 84a and "buss" 86a may be different or the same. In addition, the substrate 70a may comprise different materials or structures in those regions associated with "fingers" 84a and "buss region" 86a. For example, substrate 70a associated with "buss region" 86a may comprise a fabric to provide thru-hole communication and enhance flexibility, while substrate 70a in the region associated with "fingers" 84a may comprise a film devoid of thru-holes such as depicted in FIGS. 6-8. A "holey" structure in the "buss region" would provide increased flexibility, surface area and structural characteristic for an adhesive to grip.

Figure 17:
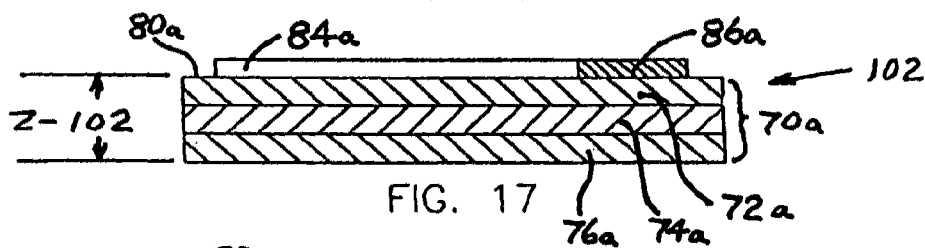
FIG. 17 is a sectional view taken substantially from the perspective of lines 17-17 of FIG. 16.
Figure 18:
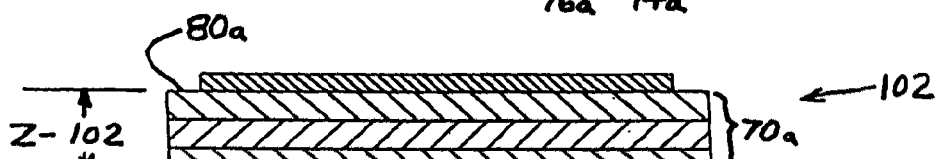
FIG. 18 is a sectional view taken substantially from the perspective of lines 18-18 of FIG. 16.

FIGS. 17 and 18 are sectional embodiments taken substantially from the perspective of lines 17-17 and 18-18 respectively of FIG. 16. FIGS. 17 and 18 show that article 102 has thickness Z-102 which may be much smaller than the X and Y dimensions, thereby allowing article 102 to be flexible and processable in roll form. Also, flexible sheet-like article 102 may comprise any number of discrete layers (three layers 72a, 74a, 76a are shown in FIGS. 17 and 18). These layers contribute to functionality as previously pointed out in the discussion of FIG. 7. As will be understood in light of the following discussion, it is normally helpful for layer 72a forming free surface 80a to exhibit adhesive characteristics to the eventual abutting conductive surface.

Figure 19:
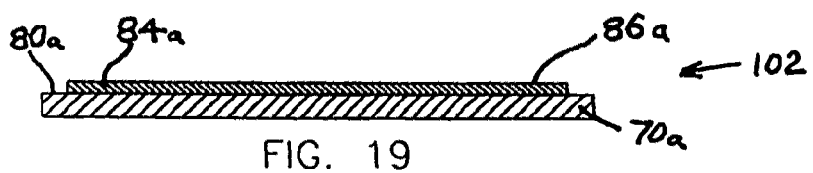
FIG. 19 is a simplified sectional view of the article embodied in FIGS. 16-18 suitable for ease of clarity of presentation of additional embodiments.

FIG. 19 is an alternate representation of the sectional view of FIG. 18. FIG. 19 depicts substrate 70a as a single layer for ease of presentation. The single layer representation will be used in many following embodiments, but one will understand that substrate 70a may comprise multiple layers.

Figure 20:
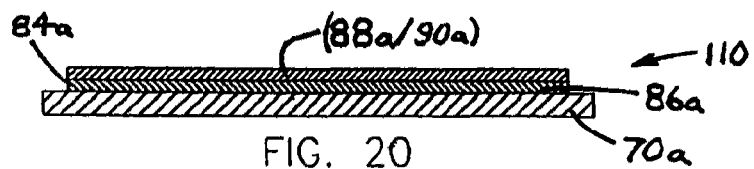
FIG. 20 is a sectional view showing the article of FIGS. 16 through 19 following an additional optional processing step.

FIG. 20 is a sectional view of the article now identified as 110, similar to FIG. 19, after an additional optional processing step. In a fashion like that described above for production of the current collector structure of FIGS. 12 through 15, additional conductive material (88a/90a) has been deposited by optional processing to produce the article 110 of FIG. 20. The discussion involving processing to produce the article of FIGS. 12 through 15 is proper to describe production of the article of FIG. 20. Thus, while additional conductive material has been designated as a single layer (88a/90a) in the FIG. 20 embodiment, one will understand that layer (88a/90a) of FIG. 20 may represent any number of multiple additional layers. In subsequent embodiments, additional conductive material (88a/90a) will be represented as a single layer for ease of presentation. In its form prior to combination with a conductive surface (such as surface 59 of cells 10), the structures such as shown in FIGS. 9-15, and 16-20 can be referred to as "current collector stock". For the purposes of this specification and claims a current collector in its form prior to combination with a conductive surface can be referred to as "current collector stock". "Current collector stock" can be characterized as being either continuous or discrete.

The invention contemplates a particularly attractive conductive joining that may be achieved through a technique described herein as a laminated contact. In light of the teachings to follow one will recognize that the structures shown in FIGS. 9-15 and 16-20 may function and be further characterized as electrodes employing a laminated contact (laminating electrodes). One structure involved in the laminated contact is a first portion of conductive structure which is to be electrically joined to a second conductive surface. The first portion comprises a conductive pattern positioned over or embedded in a surface of an adhesive. In a preferred embodiment, the adhesive is characterized as a polymeric hot melt adhesive. A hot melt adhesive is a material, substantially solid at room temperature, whose full adhesive affinity is activated by heating, normally to a temperature where the material softens or melts sufficiently for it to flow under simultaneously applied pressure. Many various hot melt materials, such as ethylene vinyl acetate (EVA), are well known in the art. It is noted that while the invention is described herein regarding the use of hot melt laminating adhesives, the invention contemplates use of laminating adhesives such as pressure sensitive adhesives not requiring heat for function.

In the process of producing a laminated contact, the exposed surface of a conductive material pattern positioned on or embedded in the surface of an adhesive is brought into facing relationship with a second conductive surface to which electrical joining is intended. Heat and/or pressure are applied to soften the adhesive which then may flow around edges or through openings in the conductive pattern to also contact and adhesively "grab" the exposed second surface portions adjacent the conductive pattern. When heat and pressure are removed, the adhesive adjacent edges of the conductive pattern firmly fixes features of conductive pattern in secure mechanical contact with the second surface.

Figure 61:
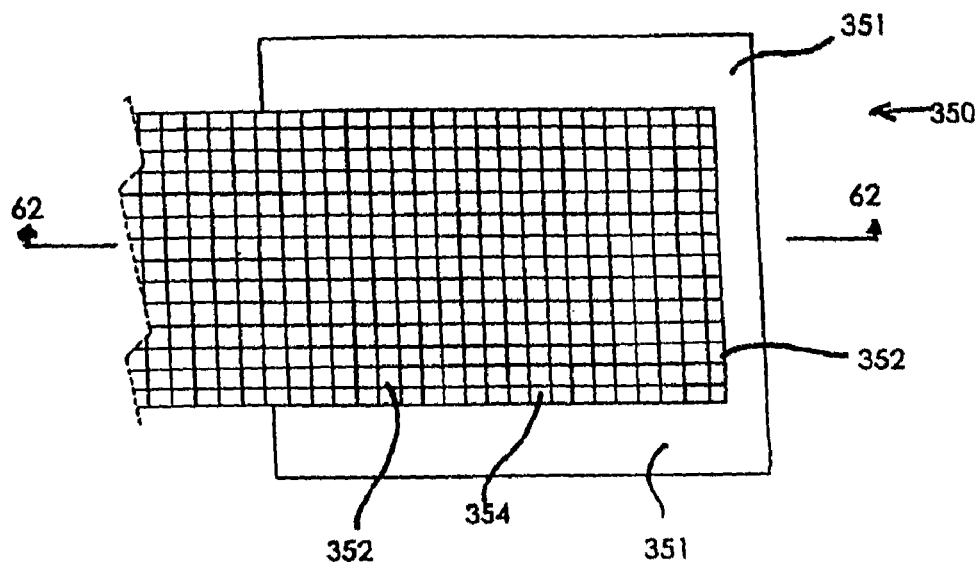
FIG. 61 is a top plan view showing a simplified depiction of structure useful to explain a concept of the invention.

The laminated contact is particularly suitable for the electrical joining requirements of many embodiments of the instant invention. A simplified depiction of structure to assist understanding the concept of a laminated contact is embodied in FIGS. 61 and 62. FIG. 61 shows a top plan view of an article 350. Article 350 comprises a conductive mesh 352 positioned on the surface of or partially embedded in adhesive 351. Mesh 352 may be in the form of a metal screen, a metallized fabric or a fabric comprising conductive fibers and the like. Adhesive 351 possesses adhesive affinity to the conductive surface to which electrical joining is intended. Numeral 354 indicates holes through the mesh or fabric. One will realize that many different patterns and conductive materials may be suitable for the conductive material represented by conductive mesh 352, including conductive comb-like patterns, serpentine traces, monolithic metal mesh patterns, metallized fabric, wires, etched or die cut metal forms, forms comprising vacuum deposited, chemically deposited and electrodeposited metals, etc.

Figure 62:
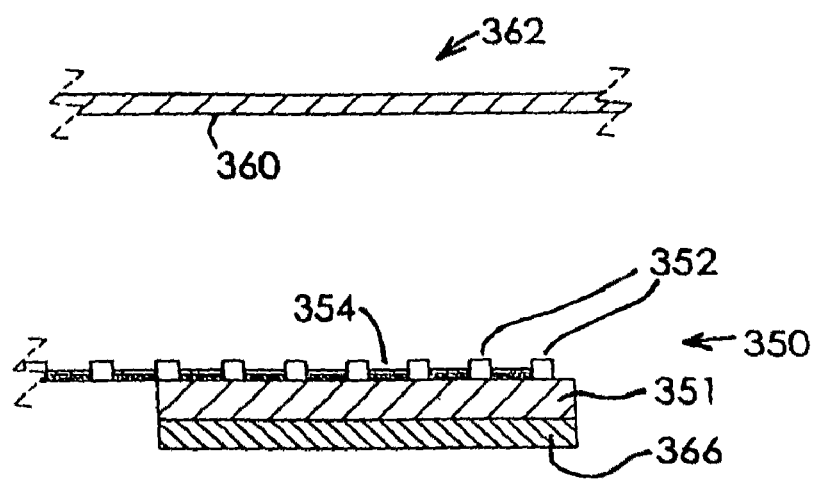
FIG. 62 is a sectional view taken substantially from the perspective of lines 62-62 of FIG. 61.

FIG. 62 shows a sectional view of article 350 juxtaposed such that the free surface of adhesive 351 and metal 352 are in facing relationship to a mating conductive surface 360 of article 362 to which electrical joining is desired. In the embodiment, article 350 is seen to be a composite of the conductive material pattern 352 positioned on a top surface of hot melt adhesive film 351. In the embodiment, an additional support film 366 is included for structural and process integrity, and possibly barrier properties. Additional film 366 may be a polymer film of a material such as polyethylene terephthalate, polypropylene, polycarbonate, etc. Film 366 may be multilayered and comprise layers intended to achieve functional attributes such as moisture barrier, UV protection etc. Film 366 may also comprise a structure such as glass. Article 350 can include additional layered materials (not shown) to achieve desired functional characteristics similar to article 70 discussed above. Also depicted in FIG. 62 is article 362 having a bottom surface 360. Surface 360 may represent, for example, the top or bottom surfaces 59 or 66 respectively of solar cell structure 10 (FIG. 2A).

In order to achieve the laminated contact, articles 350 and 362 are brought together in the facing relationship depicted and heat and pressure are applied. The adhesive layer 351 softens and flows to contact surface 360. In the case of the FIG. 62 embodiment, flow occurs through the holes 354 in the mesh 352. Upon cooling and removal of the pressure, the metal mesh 352 overlays and is held in secure and firm electrical contact with surface 360 by virtue of the adhesive bond between adhesive 351 and surface 360. Thus mesh may function as a laminated electrode or current collector in combination with surface 360.

Figure 21:
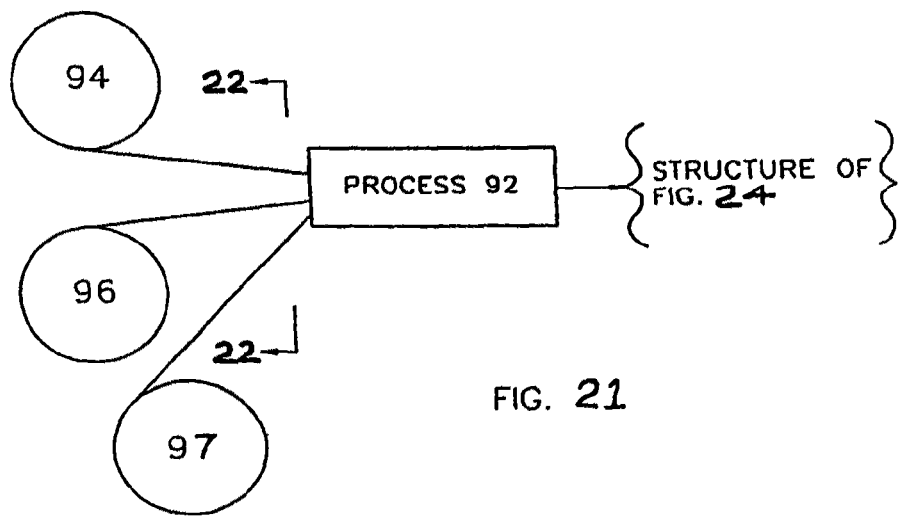
FIG. 21 is a simplified depiction of a process useful in producing objects of the instant invention.
Figure 22:
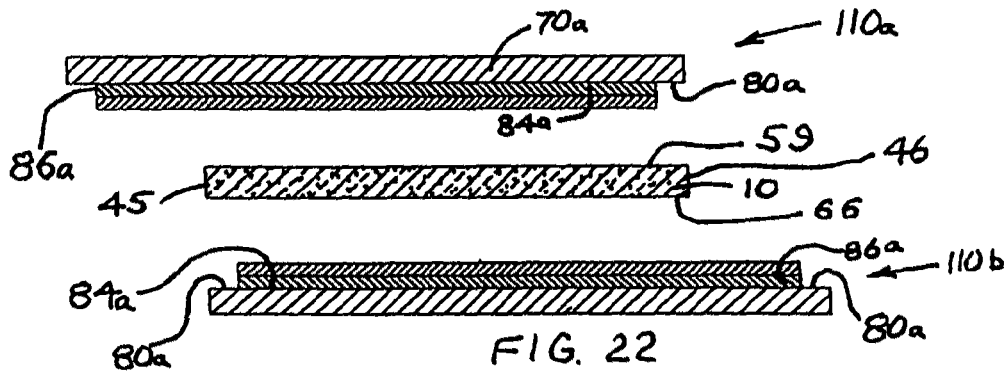
FIG. 22 is a sectional view taken substantially from the perspective of lines 22-22 of FIG. 21 showing an arrangement of three components just prior to the Process 92 depicted in FIG. 21.

Figures illustrates a process 92 by which the current collector grids of FIGS. 16 through 20 may be combined with the structure illustrated in FIG. 1A, 2A or 2B to accomplish lamination of current collecting electrodes of top and bottom surfaces photovoltaic cell stock. The combining process envisioned in FIG. 21 has been demonstrated using standard lamination processing such as roll lamination and vacuum lamination. In a preferred embodiment, roll lamination allows continuous lamination processing and a wide choice of application temperatures and pressure. Temperatures employed are typical for lamination of standard polymeric materials used in the high volume plastics packaging industry, normally less than about 325 degree Centigrade. Process 92 is but one of many processes possible to achieve such application. In FIG. 21 rolls 94 and 97 represent "continuous" feed rolls of grid/buss structure on a flexible sheetlike substrate (current collector stock) as depicted in FIGS. 16 through 20. Roll 96 represents a "continuous" feed roll of the sheetlike cell stock as depicted in FIGS. 1A, 2A and 2B. FIG. 22 is a sectional view taken substantially from the perspective of line 22-22 of FIG. 21. FIG. 22 shows a photovoltaic cell 10 such as embodied in FIGS. 2A and 2B disposed between two current collecting electrodes 110a and 110b such as article 110 embodied in FIG. 20. It is understood that suitable insulating materials (not shown) may be applied to terminal edges 45 and 46 of cell 10 to prevent shorting by the conductive materials of articles 110a and 110b in crossing the terminal edges.

Figure 23:
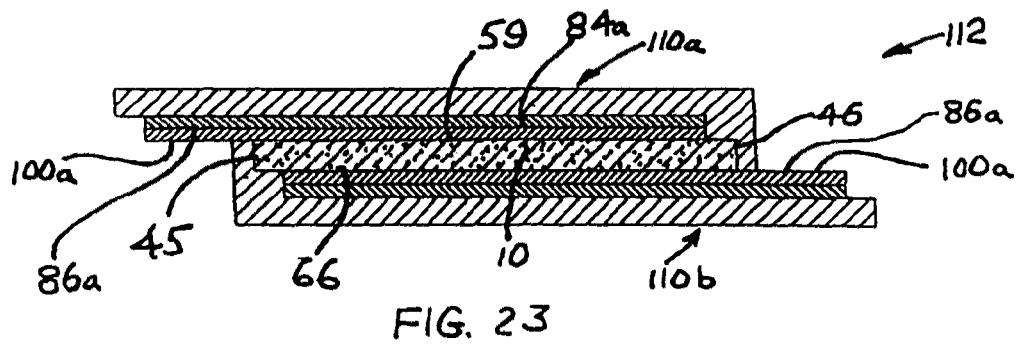
FIG. 23 is a sectional view showing the result of combining the components of FIG. 22 using the process of FIG. 21.

FIG. 23 is a sectional view showing the article 112 resulting from using process 92 to laminate the three individual structures of FIG. 22 while substantially maintaining the relative positioning depicted in FIG. 22. FIG. 23 shows that a laminating current collector electrode 110a has now been applied to the top conductive surface 59 of cell 10. Portions of surface 80a of electrode 110a not covered with "fingers" 84a face and are adhesively bonded to surface 59 of cell 10. Similarly, laminating current collector electrode 110b mates with and contacts the bottom conductive surface 66 of cell 10. Grid "fingers" 84a of a top current collector electrode 110a project laterally across the top surface 59 of cell stock 10 and extend to a "buss" region 86a located outside terminal edge 45 of cell stock 10. The grid "fingers" 84a of a bottom current collector electrode 110b project laterally across the bottom surface 66 of cell stock 10 and extend to a "buss" region 86a located outside terminal edge 46 of cell stock 10. Thus article 112 is characterized as having readily accessible conductive surface portions 114 and 116 in the form of tabs in electrical communication with both top cell surface 59 and bottom cell surface 66 respectively. Article 112 can be described as a "tabbed cell stock". In the present specification and claims, a "tabbed cell stock" is defined as a photovoltaic cell structure combined with electrically conducting material in electrical communication with a conductive surface of the cell structure, and further wherein the electrically conducting material extends outside a terminal edge of the cell structure to present a readily accessible contact surface. In light of the present teachings, one will understand that "tabbed cell stock" can be characterized as being either continuous or discrete. One will also recognize that electrodes 110a and 110b can be used independently of each other. For example, 110b could be employed as a back side electrode while a current collector structurally or materially different than 110b is employed on the top side of cell 10. Also, one will understand that while electrodes 110a and 110b are shown in the embodiment to be the same structure, different structures and materials may be chosen for electrodes 110a and 110b.

A "tabbed cell stock" combination 112 has a number of fundamental advantageous attributes. First, the laminated current collector electrodes protect the surfaces of the cell from defects possibly introduced by the further handing associated with final interconnections. Moreover, "tabbed cell stock" can be produced as a continuous form using a continuous cell "strip" originally produced in the "machine" direction ("Y" direction of FIG. 1 or 1A). Such a continuous raw cell "strip" would be anticipated to have more uniform performance characteristics than portions chosen transverse to the "machine" direction ("X" direction of FIG. 1). Next, the "tabbed cell stock" combination 112 may be produced in a continuous fashion in the Y direction (direction normal to the paper in the sectional view of FIG. 23) using either roll lamination or intermittent vacuum lamination. Following the envisioned lamination, the "tabbed cell stock" strip can be continuously monitored for quality since there is ready access to the conductive, exposed free surfaces 114 and 116 in electrical communication with top cell surface 59 and the cell bottom surface 66 respectively. Alternative "sorting" options exist at this point.

a. It would be anticipated that since the raw cell "strip" is continuous in the "machine" direction, performance variation would be minimized and the "tabbed cell stock" could be accumulated in takeup roll form.

b. Should there be excessive performance variation along the length of the raw cell "strip", the "tabbed cell stock" combination may be continuously characterized, cut to standard lengths and automatically sorted prior to assembly into a module. Excessively defective cell material could be readily identified and discarded prior to final interconnection into a module. Acceptable lengths could be automatically sorted according to defined parameters and placed in appropriate cassette feeders prior to assembly into final modules.

The lamination process 92 of FIG. 21 normally involves application of heat and pressure. Temperatures will vary depending on materials and exposure time. Typical temperatures less than about 325 degree Centigrade are envisioned. Lamination temperatures of less than 325 degree centigrade would be more than sufficient to melt and activate not only typical polymeric sealing materials but also many low melting point metals, alloys and metallic solders. For example, tin melts at about 230 degree Centigrade and its alloys even lower. Tin alloys with for example bismuth, lead and indium are common industrial materials. Many conductive "hot melt" adhesives can be activated at even lower temperatures such as 200 degree Centigrade. Typical thermal curing temperatures for polymers are in the range 95 to 200 degree Centigrade. Thus, typical lamination practice widespread in the packaging industry is normally appropriate to simultaneously accomplish many conductive joining possibilities.

It will be understood that while the process 92 of FIG. 21 envisions a roll type lamination, other forms of laminating process are appropriate in practice of the invention. For example, a semi-continuous or indexed feed lamination process, perhaps augmented by vacuum, may be employed. Moreover, should the substrate 70a comprise a rigid or discrete component such as glass, a semi-continuous or discrete batch lamination process may be envisioned.

Figure 24:
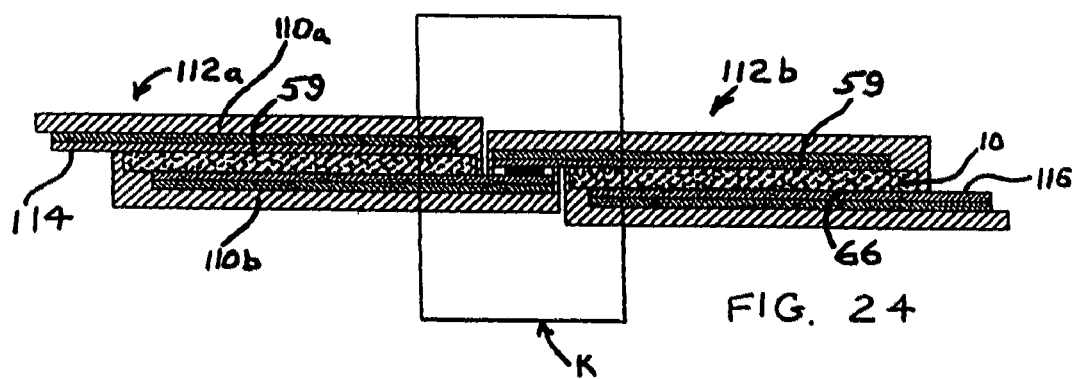
FIG. 24 is a sectional view embodying a series interconnection of multiple articles as depicted in FIG. 23
Figure 25:
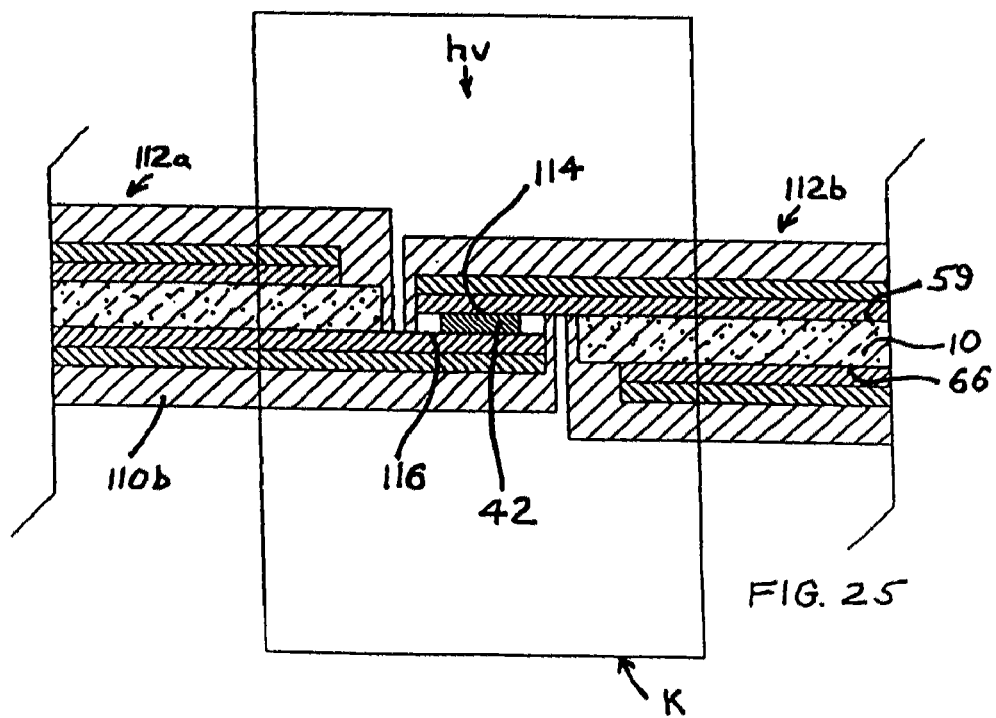
FIG. 25 is an exploded sectional view of the region within the box "K" of FIG. 24.

The sectional drawings of FIGS. 24 and 25 show the result of joining multiple articles 112a, 112b. Each article has a readily accessible downward facing pattern 114 (in the drawing perspective) with a conductive surface 100a in communication with the cell top surface 59. A readily accessible upward facing pattern 116 having another conductive surface 100a communicates with the cell bottom surfaces 66. One will appreciate that in this embodiment, current collector 110b functions as an interconnecting substrate unit. Series connections are easily achieved by overlapping the top surface extension 114 of one article 112b and a bottom surface extension 116 of a second article 112a and electrically connecting these extensions with electrically conductive joining means such as conductive adhesive 42 shown in FIGS. 24 and 25. Other electrically conductive joining means including those defined above may be selected in place of conductive adhesive 42. For example, surfaces 114 and 116 could comprise solderable material which would fuse during a lamination process. Alternatively, surfaces 114 and 116 could overlap and be electrically joined to top and bottom surfaces of a metal foil member. Finally, since the articles 112 of FIG. 23 can be produced in a continuous form (in the direction normal to the paper in FIG. 23) the series connections and array production embodied in FIGS. 24 and 25 may also be accomplished in a continuous manner by using continuous feed rolls of "tabbed cell stock" 112. However, while continuous assembly may be possible, other processing may be envisioned to produce the interconnection embodied in FIGS. 24 and 25. For example, defined lengths of "tabbed cell stock" 112 could be produced by subdividing a continuous strip of "tabbed cell stock" 112 in the Y dimension and the individual articles thereby produced could be arranged as shown in FIGS. 24 and 25 using, for example, standard pick and place positioning.

Figure 26:
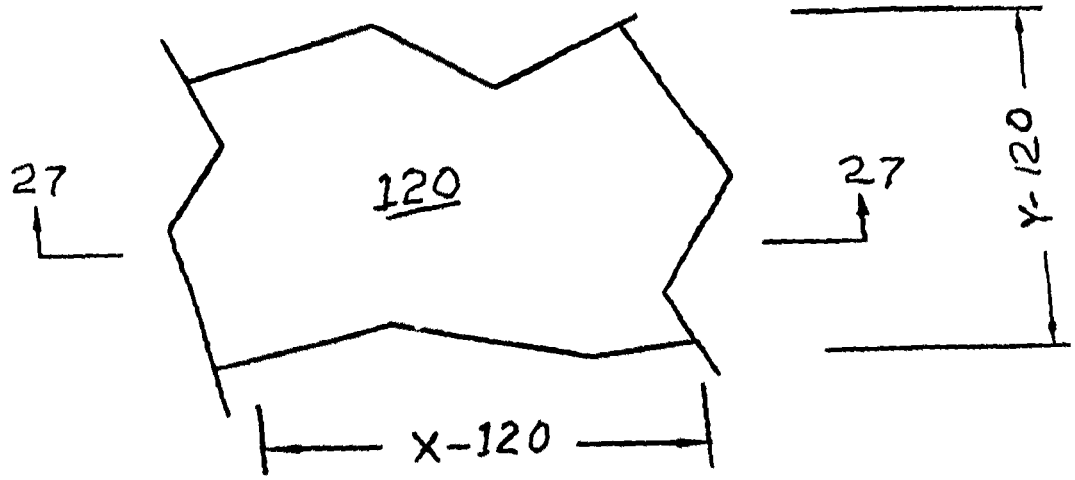
FIG. 26 is a top plan view of a starting article in the production of another embodiment of the instant invention.
Figure 27:
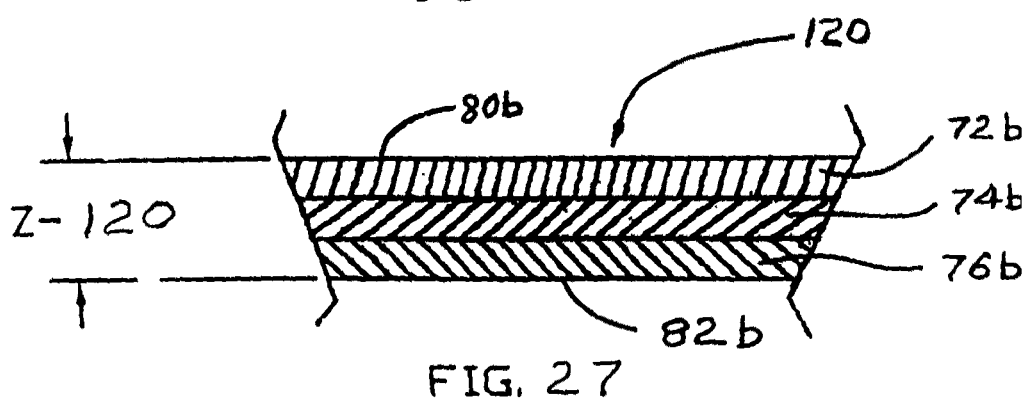
FIG. 27 is a sectional view taken from the perspective of lines 27-27 of FIG. 26.
Figure 28:
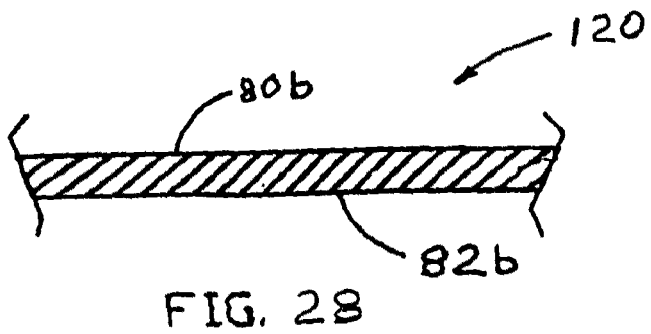
FIG. 28 is a simplified sectional depiction of the article of FIGS. 26 and 27 useful in preserving clarity of presentation of additional embodiments.

FIG. 26 is a top plan view of an article in production of another embodiment of a laminating current collector grid or electrode according to the instant invention. FIG. 26 embodies a polymer based film or glass substrate 120. Substrate 120 has width X-120 and length Y120. In embodiments, taught in detail below, Y-120 may be much greater than width X-120, whereby film 120 can generally be described as "continuous" in length and able to be processed in length direction Y-120 in a continuous roll-to-roll fashion. FIG. 27 is a sectional view taken substantially from the view 27-27 of FIG. 26. Thickness dimension Z-120 is small in comparison to dimensions Y-120, X-120 and thus substrate 120 may have a flexible sheetlike, or web structure contributing to possible roll-to-roll processing. As shown in FIG. 27, substrate 120 may be a laminate of multiple layers 72b, 74b, 76b etc. or may comprise a single layer of material. Thus substrate 120 may have structure similar to that of the FIGS. 6 through 8 embodiments, and the discussion of the characteristics of article 70 of FIGS. 6 through 8 is proper to characterize article 120 as well. As with the representation of the article 70 of FIGS. 6 through 8, and as shown in FIG. 28, article 120 (possibly multilayered) will be embodied as a single layer in the following for simplicity of presentation.

FIG. 29 is a top plan view of an article 124 following an additional processing step using article 120. FIG. 30 is a sectional view substantially from the perspective of lines 30-30 of FIG. 29. The structure depicted in FIGS. 29 and 30 is similar to that embodied in FIGS. 16 and 18. It is seen that article 124 comprises a pattern of "fingers" or "traces", designated 84b, extending from "buss" or "tab" structures, designated 86b. In the embodiments of FIGS. 29 and 30, both "fingers" 84b and "busses" 86b are positioned on supporting substrate 120 in a grid pattern. "Fingers" 84b extend in the width X-124 direction of article 124 and "busses" ("tabs") 86b extend in the Y-124 direction substantially perpendicular to the "fingers". In the FIG. 29 embodiment, it is seen that the ends of the fingers opposite the "buss" 86b are joined by connecting trace of material 128 extending in the "Y-124" direction. In the embodiment of FIGS. 29 and 30, the buss 86b region is characterized as having multiple regions 126 devoid of material forming "buss" pattern 86b. In the FIG. 29 embodiment, the voided regions 126 are presented as circular regions periodically spaced in the "Y-124" direction. One will understand in light of the teachings to follow that the circular forms 126 depicted in FIG. 29 is but one of many different patterns possible for the voided regions 126. The sectional view of FIG. 30 shows the voided regions 126 leave regions of the top surface 80b of substrate 120 exposed. Surface 80b of substrate 120 remains exposed in those regions not covered by the finger/buss pattern. These exposed regions are further indicated by numeral 127 in FIG. 29.

Structure 124 may be produced, processed and extend continuously in the length "Y-124" direction.

The embodiment of FIGS. 29 and 30 show substrate 120 as a uniform monolithic structure. As discussed for the embodiments of FIGS. 9-15 and 16-20, regions of substrate 120 associated with fingers 84b may differ from regions supporting buss 86b. However, it is understood that should article 124 be intended to mate with a light incident surface 59 of a photovoltaic cell, portions of substrate 120 not overlayed by material forming "fingers" 84b will remain transparent or translucent to visible light. Such regions are generally identified by numeral 127 in FIG. 29. In the embodiment of FIGS. 29 and 30, the "fingers" 84b and "busses" 86b are shown to be a single layer for simplicity of presentation. However, the "fingers" and "busses" can comprise multiple layers of differing materials chosen to support various functional attributes. For example the material defining the "buss" or "finger" patterns which is in direct contact with substrate 120 may be chosen for its adhesive affinity to surface 80b of substrate 120 and also to a subsequently applied constituent of the buss or finger structure. Further, it may be advantageous to have the first visible material component of the fingers and busses be of dark color or black. As will be shown, the light incident side (outside surface) of the substrate 120 will eventually be surface 82b. By having the first visible component of the fingers and busses be dark, they will aesthetically blend with the generally dark color of the photovoltaic cell. This eliminates the often objectionable appearance of a metal colored grid pattern. As previously discussed permissible dimensions and structure for the "fingers" and "busses" will vary somewhat depending on materials and fabrication process used for the fingers and busses, and the dimensions of the individual cell.

"Fingers" 84*b* and "busses" 86*b* may comprise electrically conductive material. Examples of such materials are metal wires and foils, stamped metal patterns, conductive metal containing inks and pastes such as those having a conductive filler comprising silver or stainless steel, patterned deposited metals such as etched metal patterns or masked vacuum deposited metals, intrinsically conductive polymers and DER formulations. In a preferred embodiment, the "fingers and "busses" comprise electroplateable material such as DER or an electrically conductive ink which will enhance or allow subsequent metal electrodeposition. "Fingers" 84*b* and "busses" 86*b* may also comprise non-conductive material which would assist accomplishing a subsequent deposition of conductive material in the pattern defined by the "fingers" and "busses". For example, "fingers" 84*b* or "busses" 86*b* could comprise a polymer which may be seeded to catalyze chemical deposition of a metal in a subsequent step. An example of such a material is seeded ABS. Patterns comprising electroplateable materials or materials facilitating subsequent electrodeposition are often referred to as "seed" patterns or layers. "Fingers" 84*b* and "busses" 86*b* may also comprise materials selected to promote adhesion of a subsequently applied conductive material. "Fingers" 84*b* and "busses" 86*b* may differ in actual composition and be applied separately. For example, "fingers" 84*b* may comprise a conductive ink while "buss/tab" 86*b* may comprise a conductive metal foil strip. Alternatively, fingers and busses may comprise a continuous unvarying monolithic material structure forming portions of both fingers and busses. Fingers and busses need not both be present in certain embodiments of the invention.

The embodiments of FIGS. 29 and 30 show the "fingers" 84*b*, "busses" 86*b*, and connecting trace 128 as essentially planar rectangular structures. Other geometrical forms are clearly possible, especially when design flexibility is associated with the process used to establish the material pattern of "fingers" and "busses". "Design flexible" processing includes printing of conductive inks or "seed" layers, foil etching or stamping, masked deposition using paint or vacuum deposition, and the like. For example, these conductive paths can have triangular type surface structures increasing in width (and thus cross section) in the direction of current flow. Thus the resistance decreases as net current accumulates to reduce power losses. Alternatively, one may select more intricate patterns, such as a "watershed" pattern as described in U.S. Patent Application Publication 2006/0157103 A1 which is hereby incorporated in its entirety by reference. Various structural features, such as radiused connections between fingers and busses may be employed to improve structural robustness.

It is important to note however that the laminating current collector structures of the instant invention may be manufactured utilizing continuous, bulk roll to roll processing. While the collector grid embodiments of the current invention may advantageously be produced using continuous processing, one will recognize that combining of grids or electrodes so produced with mating conductive surfaces may be accomplished using either continuous or batch processing. In one case it may be desired to produce photovoltaic cells having discrete defined dimensions. For example, single crystal silicon cells are often produced having X-Y dimensions of 6 inches by 6 inches. In this case the collector grids of the instant invention, which may be produced continuously, may then be subdivided to dimensions appropriate for combining with such cells. In other cases, such as production of many thin film photovoltaic structures, a continuous roll-to-roll production of an expansive surface article can be accomplished in the "Y" direction as identified in FIG. 1. Such a continuous expansive photovoltaic structure may be combined with a continuous arrangement of collector grids of the instant invention in a semicontinuous or continuous manner. Alternatively the expansive semiconductor structure may be subdivided into continuous strips of cell stock. In this case, combining a continuous strip of cell stock with a continuous strip of collector grid of the instant invention may be accomplished in a continuous or semi-continuous manner.

FIG. 31 corresponds to the view of FIG. 30 following an additional optional processing step. The FIG. 31 article is now designated by numeral 125 to reflect this additional processing. FIG. 31 shows additional conductive material deposited onto the "fingers" 84*b* and "buss" 86*b*. In this embodiment additional conductive material is designated by one or more layers (88*b*/90*b*) and the fingers and busses project above surface 80*b* as shown by dimension "H". It is understood that conductive material could comprise more than two layers or be a single layer. Conductive material (88*b*/90*b*) is shown as a single layer in the FIG. 31 embodiment for ease of presentation. Article 125 is another embodiment of a "current collector stock". Dimension "H" is normally smaller than about 50 micrometers and thus the structure of fingers and busses depicted in FIG. 31 can be considered as a "low profile" structure. In some cases it may be desirable to reduce the height of projection "H" prior to eventual combination with a conductive surface such as 59 or 66 of photovoltaic cell 10. This reduction may be accomplished by passing the structures as depicted in FIGS. 29-31 through a pressurized and/or heated roller or the like to partially embed "fingers" 84*b* and/or "busses" 86*b* into layer 72*b* of substrate 120.

While each additional conductive material is shown the FIG. 31 embodiment as having the same continuous monolithic material extending over both the buss and finger patterns, one will realize that selective deposition techniques would allow the additional "finger" layers to differ from additional "buss" layers. For example, as shown in FIG. 31, "fingers" 84*b* have top free surface 98*b* and "busses" 86*b* have top free surface 100*b*. As noted, selective deposition techniques such as brush electroplating or masked deposition would allow different materials to be considered for the "buss" surface 100*b* and "finger" surface 98*b*. In a preferred embodiment, at least one of the additional layers (88*b*/90*b*) etc. are deposited by electrodeposition, taking advantage of the deposition speed, compositional choice, low cost and selectivity of the electrodeposition process. Many various metals, including highly conductive silver, copper and gold, nickel, tin and alloys can be readily electrodeposited. In these embodiments, it may be advantageous to utilize electrodeposition technology giving an electrodeposit of low tensile stress to prevent curling and promote flatness of the metal deposits. In particular, use of nickel deposited from a nickel sulfamate bath, nickel deposited from a bath containing stress reducing additives such as brighteners, or copper from a standard acid copper bath have been found particularly suitable. Electrodeposition also permits precise control of thickness and composition to permit optimization of other requirements of the overall manufacturing process for interconnected arrays. Alternatively, these additional conductive layers may be deposited by selective chemical deposition or registered masked vapor deposition. These additional layers (88/90) may also comprise conductive inks applied by registered printing.

It has been found very advantageous to form surface 98*b* of "fingers" 84*b* or top surface 100*b* of "busses" 86*b* with a material compatible with the conductive surface with which eventual contact is made. In preferred embodiments, electroless deposition or electrodeposition is used to form a suitable surface 98b or 100b. Specifically electrodeposition offers a wide choice of potentially suitable materials to form these top surfaces. Corrosion resistant materials such as nickel, chromium, tin, indium, silver, gold and platinum are readily electrodeposited. When compatible, of course, surfaces comprising metals such as copper or zinc or alloys of copper or zinc may be considered. Alternatively, the surface 98b or 100b may comprise a conductive conversion coating, such as a chromate coating, of a material such as copper or zinc. Further, as will be discussed below, it may be highly advantageous to choose a material to form surfaces 98b or 100b which exhibits adhesive or bonding ability to a subsequently positioned abutting conductive surface. For example, it may be advantageous to form surfaces 98b and 100b using an electrically conductive adhesive or low melting point metal or solder. For example, forming surfaces 98b or 100b with a conductive hot melt adhesive or with materials such as tin or tin alloyed with element such as lead, bismuth or indium could result in a surface material having a melting point less than the temperature of a subsequent lamination process. This would facilitate electrical joining during the subsequent lamination steps. One will note that materials forming "fingers" surface 98b and "buss" surface 100b need not be the same.

FIG. 32 depicts an arrangement of 3 articles just prior to a laminating process according to a process embodiment such as that of FIG. 21. In the FIG. 32 embodiment, "current collector stock" 125 is positioned above a photovoltaic cell 10. A second article of laminating "current collector stock", identified by numeral 129, is positioned beneath cell 10. Article 129 may be similar in structure to article 110 of FIG. 20.

Figure 33:
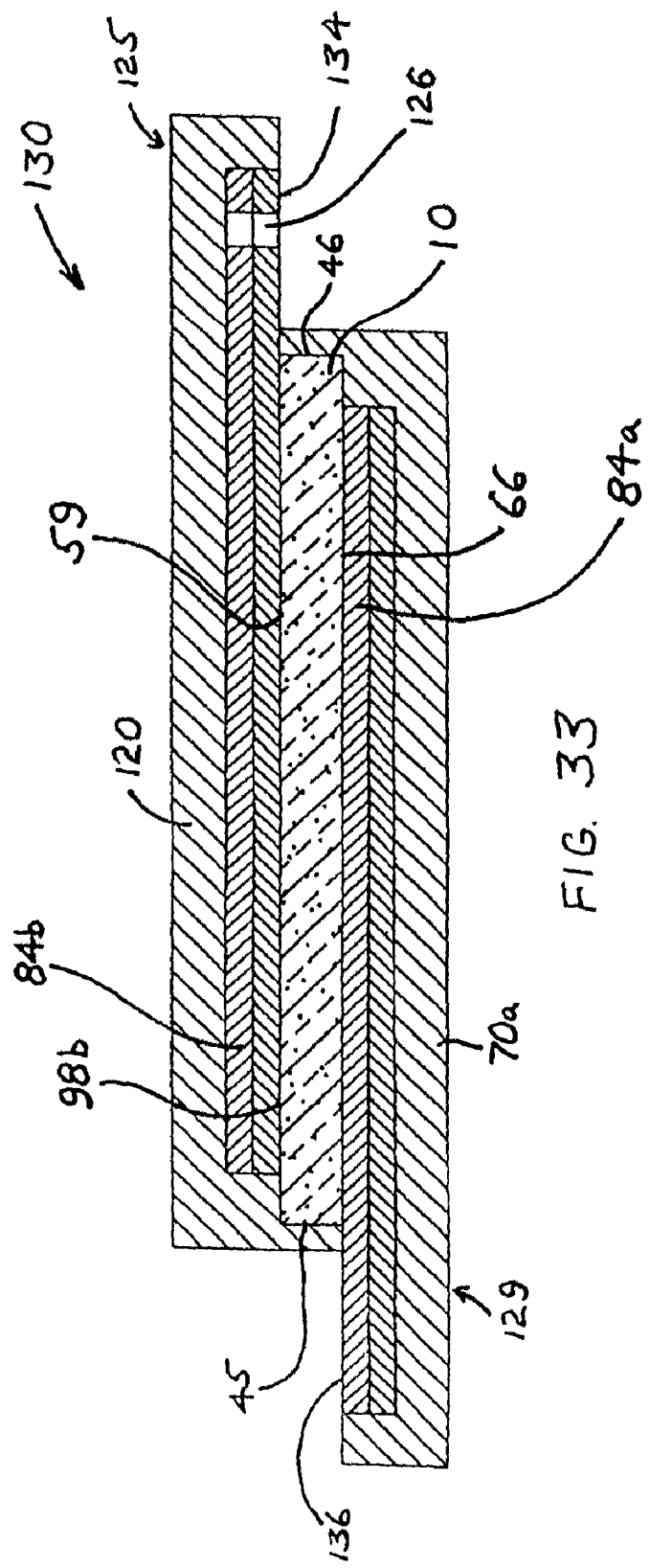
FIG. 33 is a sectional view showing the result of combining the arrangement depicted in FIG. 32 using a process as depicted in FIG. 21.

FIG. 33 shows the article 130 resulting from passing the FIG. 32 arrangement through a lamination process as depicted in FIG. 21. The lamination process has applied article 125 over the top surface 59 of cell 10. Thus, the conductive surfaces 98b of grid "fingers" 84b of article 125 are fixed by the lamination in intimate contact with conductive top surface 59 of cell 10. The lamination process has similarly positioned the conductive surface 98a of "fingers" 84a of article 129 in intimate contact with the bottom surface 66 of cell 10. The conductive material associated with current collector stock 125 extends past a first terminal edge 46 of cell 10. The conductive material associated with current collector stock 129 extends past second terminal edge 45 of cell 10. These extensions, identified by numerals 134 and 136 in FIG. 33, form convenient "tab" surfaces to facilitate electrical connections to and from the actual cell. Thus article 130 can be properly characterized as a form or embodiment of a "tabbed cell stock".

Figure 34:
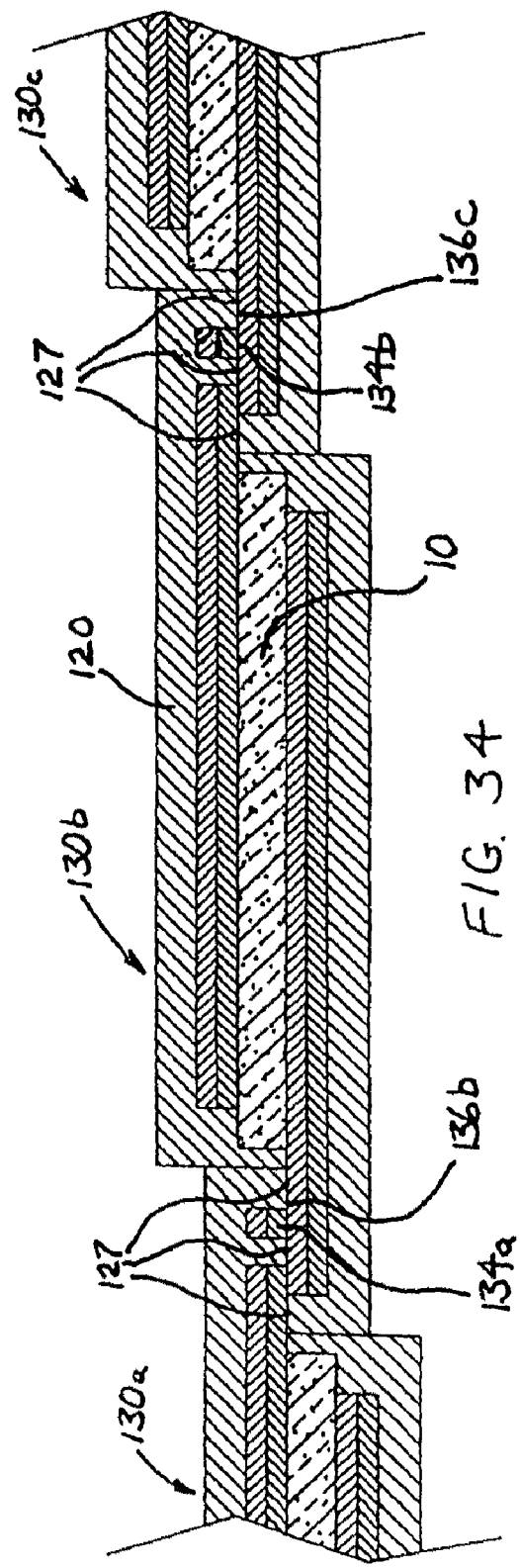
FIG. 34 is a sectional view a series interconnection of a multiple of articles such as depicted in FIG. 33.

FIG. 34 embodies the combination of multiple portions of "tabbed cell stock" 130. In the FIG. 34 embodiment, an extension 134a associated with a first unit of "tabbed cell stock" 130a overlaps extension 136b of an adjacent unit of "tabbed cell stock" 130b. The same spatial arrangement exists between "tabbed cell stock" units 130b and 130c. The conductive surfaces associated with the mating extensions are positioned and held in secure contact as a result of an adhesive material forming surface 80b of the substrate 120 melting and filling holes shown at 126. The mating contact is additionally secured by adhesive bonding produced by additional originally exposed portions of the substrates, shown at 127, in the region of the mechanical and pressure induced electrical joining between adjacent units of "tabbed cell stock". These originally exposed regions of substrate surface in the region of the mechanical and pressure induced electrical joining between adjacent units of "tabbed cell stock" are identified by the numeral 127 in the FIG. 34. It is clear that in the FIG. 34 embodiment a secure and robust series electrical connection is achieved between adjacent units of "tabbed cell stock" by virtue of the lamination process taught herein.

Figure 35:
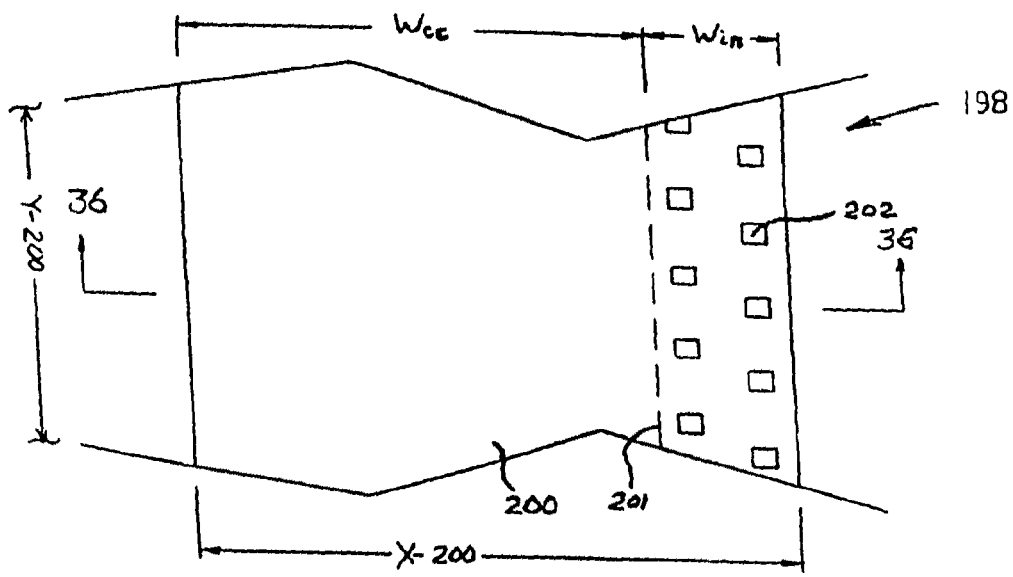
FIG. 35 is a top plan view of a starting article used to produce another embodiment of the instant invention.
Figure 36:
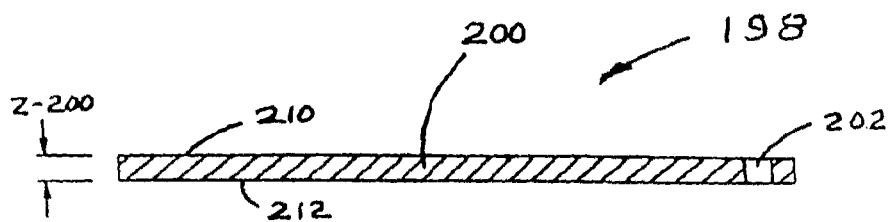
FIG. 36 is a simplified sectional view taken substantially from the perspective of lines 36-36 of FIG. 35.

Referring now to FIGS. 35 through 38, there are shown embodiments of a starting structure for another grid/interconnect article of the invention. FIG. 35 is a top plan view of an article 198. Article 198 comprises a polymeric film or glass sheet substrate generally identified by numeral 200. Substrate 200 has width X-200 and length Y-200. Length Y-200 is sometimes much greater the width X-200 such that film 200 can be processed in essentially a "roll-to-roll" fashion. However, this is not necessarily the case. Dimension "Y" can be chosen according to the application and process envisioned. FIG. 36 is a sectional view taken substantially from the perspective of lines 36-36 of FIG. 35. Thickness dimension Z-200 is normally small in comparison to dimensions Y-200 and X-200 and thus substrate 200 has a sheetlike structure and is often flexible. Substrate 200 is further characterized by having regions of essentially solid structure combined with regions having holes 202 extending through the thickness Z-200. In the FIG. 35 embodiment, a substantially solid region is generally defined by a width Wcc, representing a current collection portion. Another portion with through-holes (holey region) is generally defined by width Win, representing an interconnection region. Imaginary line 201 separates the two portions. Holes 202 may be formed by simple punching, laser drilling and the like. Alternatively, holey region Win may comprise a fabric joined to region Wcc along imaginary line 201, whereby the fabric structure comprises through-holes. The reason for these distinctions and definitions will become clear in light of the following teachings.

Figure 37:
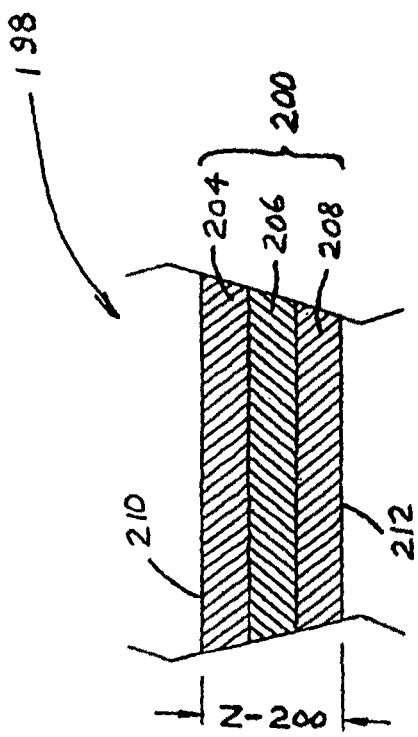
FIG. 37 is a expanded sectional view of the article embodied in FIGS. 35 and 36 showing a possible multi-layered structure of the article.

Referring now to FIG. 36, region Wcc of substrate 200 has a first surface 210 and second surface 212. The sectional view of substrate 200 shown in FIG. 36 shows a single layer structure. This depiction is suitable for simplicity and clarity of presentation. Often, however, film 200 will comprise a laminate of multiple layers as depicted in FIG. 37. In the FIG. 37 embodiment, substrate 200 is seen to comprise multiple layers 204, 206, 208, etc. As previously taught herein, the multiple layers may comprise inorganic or organic components such as thermoplastics, thermosets, or silicon containing glass-like layers. The various layers are intended to supply functional attributes such as environmental barrier protection or adhesive characteristics. In particular, in light of the teachings herein, one will recognize that it may be advantageous to have layer 204 forming surface 210 comprise a sealing or adhesive material such as ethylene vinyl acetate (EVA), an ionomer, an olefin based adhesive, atactic polyolefin, or a polymer containing polar functional groups for adhesive characteristics during a possible subsequent lamination process. For example, the invention has been successfully demonstrated using a standard laminating material sold by GBC Corp., Northbrook, Ill., 60062. Thermoplastic sealing and adhesives materials have particular utility in many embodiments of the instant inventions. Thermoplastic adhesives have their adhesive characteristics activated when temperatures and pressure are increased sufficiently above ambient. Additional layers 206, 208 etc. may comprise materials which assist in support or processing such as polypropylene and polyethylene terephthalate, barrier materials such as fluorinated polymers and biaxially oriented polypropylene, and materials offering protection against ultraviolet radiation as previously taught in characterizing substrate 70 of FIG. 6.

As embodied in FIGS. 35 and 36, the solid regions Wcc and "holey" regions Win of substrate 200 may comprise the same material. This is not necessarily the case. For example, the "holey" regions Win of substrate 200 could comprise a fabric, woven or non-woven, joined to an adjacent substantially solid region along imaginary line 201. However, should substrate 200 be used for current collection from a light incident surface of a photovoltaic cell, the materials forming the solid region Wcc should be relatively transparent or translucent to visible light, as will be understood in light of the teachings to follow.

Figure 38:
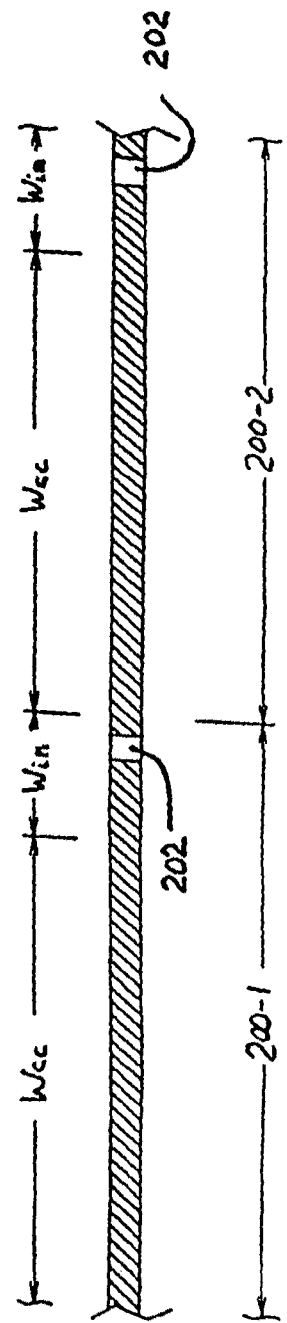
FIG. 38 is a sectional view showing a structure combining repetitive units of the article embodied in FIGS. 35 and 36.

FIG. 38 depicts an embodiment wherein multiple widths 200-1, 200-2 etc. of the general structure of FIGS. 35 and 36 are joined together in a generally repetitive pattern in the width direction. Such a structure allows simultaneous production of multiple repeat structures corresponding to widths 200-1, 200-2 in a fashion similar to that taught in conjunction with the embodiments of FIGS. 6 through 15.

Figure 39:
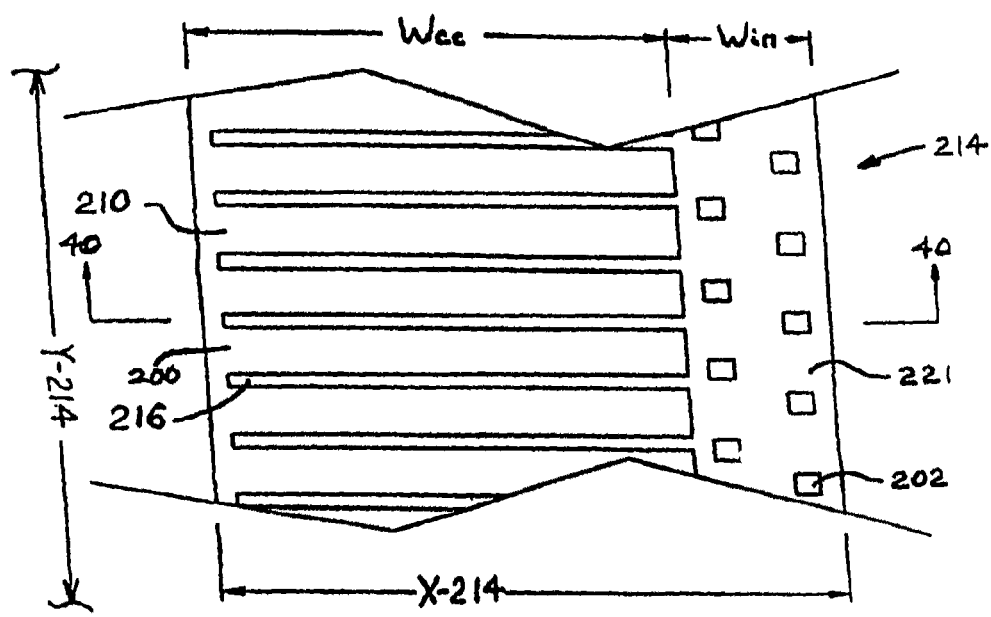
FIG. 39 is a top plan view of the article of FIGS. 35 and 36 following an additional processing step.
Figure 40:
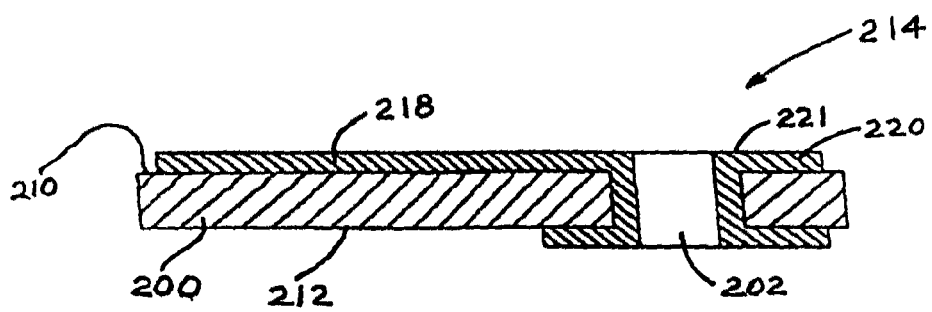
FIG. 40 is a sectional view taken from the perspective of lines 40-40 of FIG. 39.

FIG. 39 is a plan view of the FIG. 35 substrate 200 following an additional processing step, and FIG. 40 is a sectional view taken along line 40-40 of FIG. 39. In FIGS. 39 and 40, the article is now designated by the numeral 214 to reflect this additional processing. In FIGS. 39 and 40, it is seen that a pattern of "fingers" 216 has been formed by material 218 positioned in a pattern over surface 210 of original sheetlike substrate 200. "Fingers" 216 extend over the width Wcc of the solid portion of sheetlike structure 214. The "fingers" 216 extend to the "holey" interconnection region generally defined by Win. Portions of the Wcc region not overlayed by "fingers" 216 remain transparent or translucent to visible light. The "fingers" may comprise electrically conductive material. Examples of such materials are metal containing inks, patterned deposited metals such as etched metal patterns, stamped metal patterns, masked vacuum deposited metal patterns, fine metal wires, intrinsically conductive polymers and DER formulations. In other embodiments the "fingers" may comprise materials intended to facilitate subsequent deposition of conductive material in the pattern defined by the fingers. An example of such a material would be ABS, catalyzed to constitute a "seed" layer to initiate chemical "electroless" metal deposition. Another example would be a material functioning to promote adhesion of a subsequently applied conductive material to the film 200. In a preferred embodiment, the "fingers" comprise material which will enhance or allow subsequent metal electrodeposition such as a DER or electrically conductive ink. In the embodiment of FIGS. 39 and 40, the "fingers" 216 are shown to be a single layer of material 218 for simplicity of presentation. However, the "fingers" can comprise multiple layers of differing materials chosen to support various functional attributes as has previously been taught.

Continuing reference to FIGS. 39 and 40 also shows additional material 220 applied to the "holey" region Win of article 214 and extending through holes 202 from surface 210 to surface 212. As with the material comprising the "fingers" 216, the material 220 applied to the "holey" region Win is either conductive or material intended to facilitate subsequent deposition of conductive material. One will understand that "holey" region Win may comprise a fabric which may further comprise conductive material extending through the natural holes of the fabric. Further, such a fabric may comprise fibrils formed from conductive materials such as metals or conductive polymers. Such a fabric structure can be expected to increase and retain flexibility after subsequent processing such as metal electroplating. and perhaps bonding ability of the ultimate interconnected cells. Alternatively one may choose to establish electrical communication between surface 210 and 212 by using an electrically conductive polymer or metal foil to form portions of the substrate associated with interconnection region Win as will be understood in light of the teachings contained hereafter. In the embodiment of FIGS. 39 and 40, the "holey" region takes the general form of a "buss" 221 extending in the Y-214 direction in communication with the individual fingers. However, as one will understand through the subsequent teachings, the invention requires only that conductive communication extend from the fingers to a region Win intended to be electrically joined to the bottom conductive surface of an adjacent cell. The "holey" region Win thus does not require overall electrical continuity in the "Y" direction as is characteristic of a "buss" form depicted in the embodiment of FIGS. 39 and 40.

Reference to FIG. 40 shows that the material 220 applied to the "holey" interconnection region Win is shown as the same as that applied to form the fingers 216. However, these materials 218 and 220 need not be identical. In this embodiment material 220 applied to the "holey" region extends through holes 202 and onto the opposite second surface 212 of article 214. The extension of material 220 through the holes 202 can be readily accomplished as a result of the relatively small thickness (Z dimension) of the sheetlike substrate 200. Techniques include two sided printing of material 220, through hole spray application, masked metallization or selective chemical deposition or mechanical means such as stapling, wire sewing or riveting.

Figure 41:
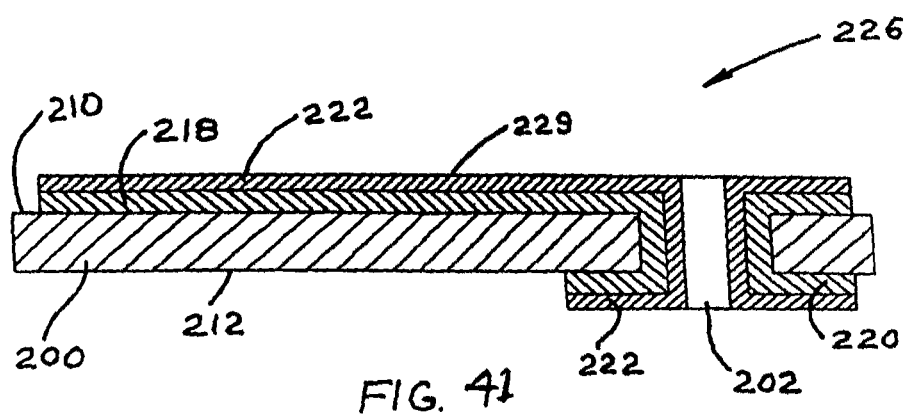
FIG. 41 is a sectional view similar to that of FIG. 40 following an additional optional processing step.

FIG. 41 is a view similar to that of FIG. 40 following an additional optional processing step. The article embodied in FIG. 41 is designated by numeral 226 to reflect this additional processing. It is seen in FIGS. 41 that the additional processing has deposited highly conductive material 222 over the originally free surfaces of materials 218 and 220. Material 222 normally comprises metal-based material such as copper or nickel, tin or a conductive metal containing paste or ink. Typical deposition techniques such as printing, chemical or electrochemical metal deposition and masked deposition can be used for this additional optional process to produce the article 226. In a preferred embodiment, electrodeposition is chosen for its speed, ease, and cost effectiveness as taught above. It is understood that article 226 is another embodiment of "current collector stock".

It is seen in FIG. 41 that highly conductive material 222 extends through holes to electrically join and form electrically conductive surfaces on opposite sides of article 226. While shown as a single layer in the FIG. 41 embodiment, the highly conductive material can comprise multiple layers to achieve functional value. In particular, a layer of copper is often desirable for its high conductivity. Nickel is often desired for its adhesion characteristics, plateability and corrosion resistance. The exposed surface 229 of material 222 can be selected for corrosion resistance and bonding ability. It has been found very advantageous to form surface 229 with a material compatible with the conductive surface with which eventual contact is made. In preferred embodiments, electroless deposition or electrodeposition is used to form a suitable metallic surface. Specifically electrodeposition offers a wide choice of potentially suitable materials to form the top surface 229. Corrosion resistant materials such as nickel, chromium, tin, indium, silver, gold and platinum are readily electrodeposited may be chosen to form surface 229. When compatible, of course, surfaces comprising metals such as copper or zinc or alloys of copper or zinc may be considered. Alternatively, the surface 229 may comprise a conductive conversion coating, such as a chromate coating, of a material such as copper or zinc. Further, it may be highly advantageous to choose a material, such as a conductive adhesive or metallic solder to form surface 229 which exhibits adhesive or bonding ability to a subsequently positioned abutting conductive surface. In this regard, electrodeposition offers a wide choice of materials to form surface 229. In particular, indium, tin or tin containing alloys are a possible choice of material to form the exposed surface 229 of material 222. These metals melt at relatively low temperatures less than about 275 degree Centigrade. Thus these metals may be desirable to promote ohmic joining, through soldering, to other components in subsequent processing such as lamination. Alternatively, exposed surface 229 may comprise an electrically conductive adhesive. Selective deposition techniques such as brush plating or printing would allow the conductive materials of region Win to differ from those of fingers 216. In addition to supplying electrical communication from surfaces 210 to 212, holes 202 also function to increase flexibility of "buss" 221 by relieving the "sandwiching" effect of continuous oppositely disposed layers. Holes 202 can clearly be the holes naturally present should substrate 200 in the region Win be a fabric. One realizes that an important attribute of the embodied structure is that electrical communication is achieved between opposing surfaces 210 and 212 of substrate 200 in the interconnection region Win. One further realizes that this communication may be achieved using structure other than using the holes shown. For example, similar communication by be achieved by using a conductive fabric, metal mesh, an electrically conductive polymer or metal foil to form a portion of the substrate 200 associated with region Win. These alternate materials would be patched to the remaining transparent current collector portion Wcc of substrate 200. In all these ways electrical communication is achieved from surface 212 to opposite surface 210 within region Win.

Figure 42:
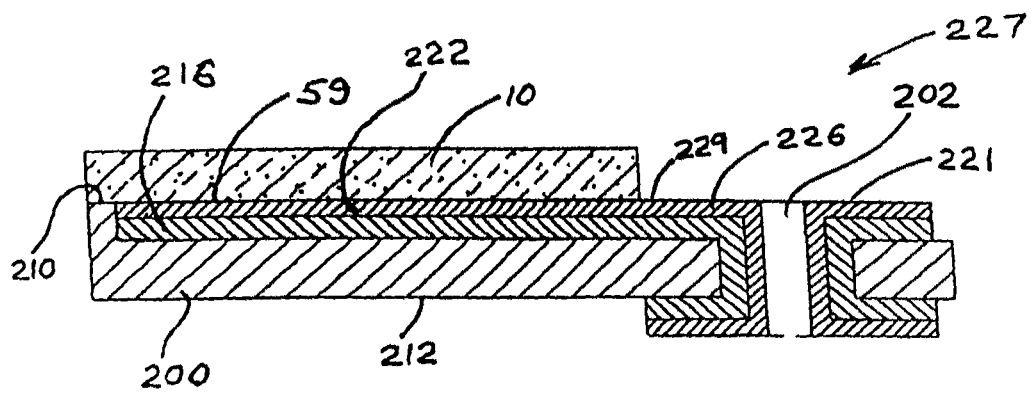
FIG. 42 is a sectional view showing a possible combining of the article of FIG. 41 with a photovoltaic cell.
Figure 43:
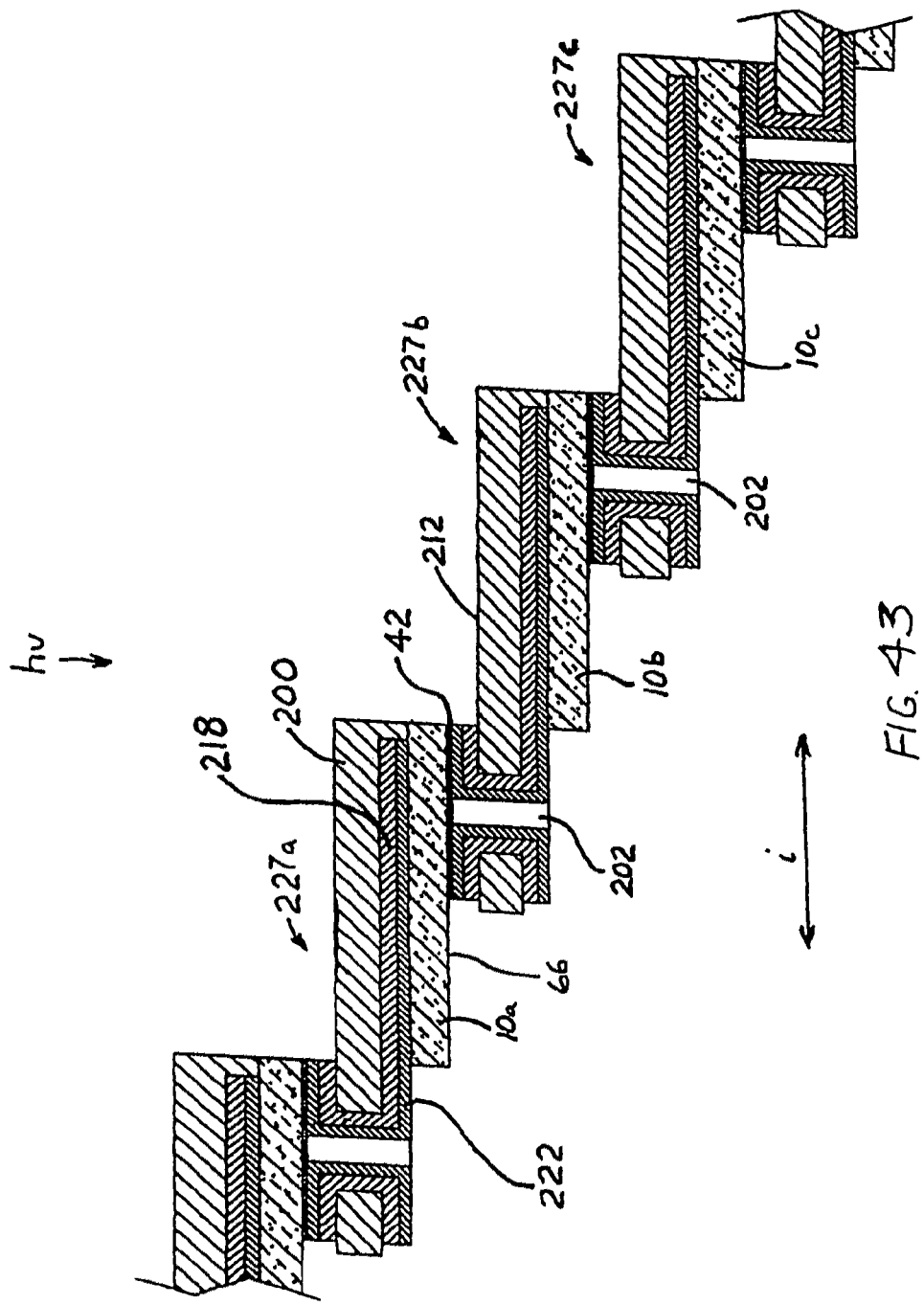
FIG. 43 is a sectional view showing multiple articles as in FIG. 42 arranged in a series interconnected array.

One method of combining the current collector stock 226 embodied in FIG. 41 with a cell stock 10 as embodied in FIGS. 1A and 2A is illustrated in FIGS. 42 and 43. In the FIG. 43 structure, individual current collector stocks 226 are combined with cells 10a, 10b, 10c respectively to produce a series interconnected array. This may be accomplished via a process generally described as follows.

As embodied in FIG. 42, individual current collector stock, such as 226, is combined with cells such as 10 by positioning of surface region "Wcc" of current collector stock 226 having free surface 210 in registration with the light incident surface 59 of cell 10. The article so produced is identified as article 227. Adhesion joining the two surfaces is accomplished by a suitable process. In particular, the material forming the remaining free surface 210 of article 226 (that portion of surface 210 not covered with conductive material 222) may be a sealing material chosen for adhesive affinity to surface 59 of cell 10 thereby promoting good adhesion between the collector stock 226 and cell surface 59 resulting from a laminating process such as that depicted in FIG. 21. Such a laminating process brings the conductive material of fingers 216 into firm and effective contact with the window electrode 18 forming surface 59 of cell 10. This contact is ensured by the blanketing "hold down" afforded by the adhesive bonding adjacent the conductive fingers 216. Also, as mentioned above, the nature of the free surface of conductive material 222 may optionally be manipulated and chosen to further enhance ohmic joining and adhesion. It is envisioned that batch or continuous laminating would be suitable. The invention has been demonstrated using both roll laminators and batch vacuum laminators. Should the articles 226 and 10 be in a continuous form it will be understood that article 227 could be formed as a continuous "tabbed cell stock. The subsequent series arrangement of articles 227a, 227b, depicted in FIG. 43 may employ strip portions of "tabbed cell stock" having a defined length. Alternatively continuous series interconnection of multiple strips of tabbed cell stock supplied from corresponding multiple rolls of tabbed cell stock is possible.

Referring to FIG. 43, it is seen that proper positioning allows the conductive material 222 extending over the second surface 212 of article 227b to be ohmicly adhered to the bottom surface 66 of cell 10a. This joining is accomplished by suitable electrical joining techniques such as soldering, riveting, spot welding or conductive adhesive application. The particular ohmic joining technique embodied in FIG. 43 is through electrically conductive adhesive 42. A particularly suitable conductive adhesive is one comprising a carbon black filler in a polymer matrix possibly augmented with a more highly conductive metal filler. Such adhesive formulations are relatively inexpensive and can be produced as hot melt formulations. Despite the fact that adhesive formulations employing carbon black alone have relatively high intrinsic resistivities (of the order 1 ohm-cm.), the bonding in this embodiment is accomplished through a relatively thin adhesive layer and over a broad surface. Thus the resulting resistance losses are relatively limited. A hot melt conductive adhesive is very suitable for establishing the ohmic connection using a straightforward lamination process.

FIG. 43 embodies multiple cells assembled in a series arrangement using the teachings of the instant invention. In FIG. 43, "i" indicates the direction of net current flow and "hv" indicates the light incidence for the arrangement. It is noted that the arrangement of FIG. 43 resembles a shingling arrangement of cells, but with an important distinction. The prior art shingling arrangements have included an overlapping of cells at a sacrifice of portions of very valuable cell surface. In the FIG. 43 teaching, the benefits of the shingling interconnection concept are achieved without any loss of photovoltaic surface from shading by an overlapping cell. In addition, the FIG. 43 arrangement retains a high degree of flexibility because there is no immediate overlap of the metal foil cell substrate. Conversely, inspection of the FIG. 43 embodiment shows that interconnection may also be achieved without any substantial separation between adjacent connected cells (except for a very slight, vertical displacement). In this way active collection area is maximized, since no "dead area" exists between cells.

Figure 44:
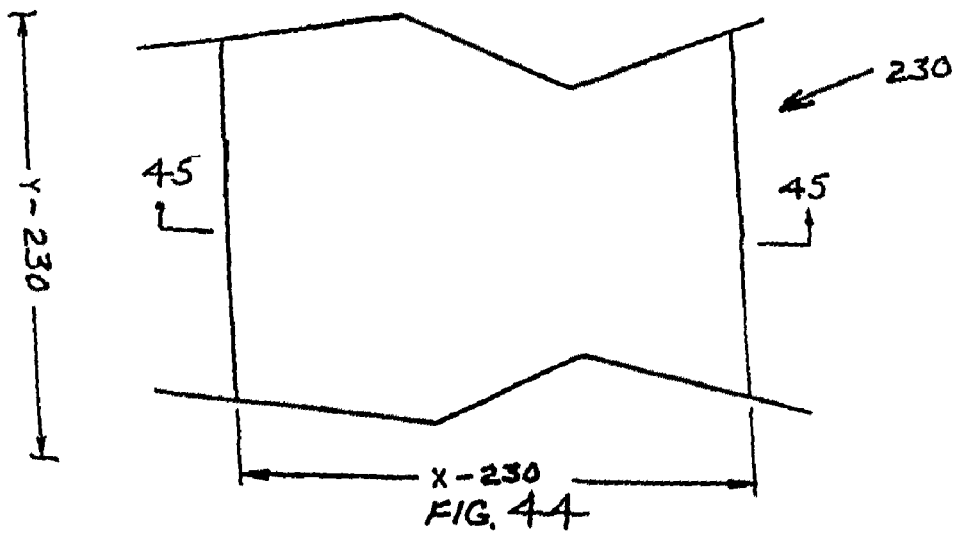
FIG. 44 is a top plan view of a starting article in the production of yet another embodiment of the instant invention.

Yet another form of the instant invention is embodied in FIGS. 44 through 56. FIG. 44 is a top plan view of an article designated 230. Article 230 has width "X-230" and length "Y-230". It is contemplated that "Y-230" may be considerably greater than "X-230" such that article 230 may be processed in continuous roll-to-roll fashion. However, such continuous processing is not a requirement.

Figure 45:
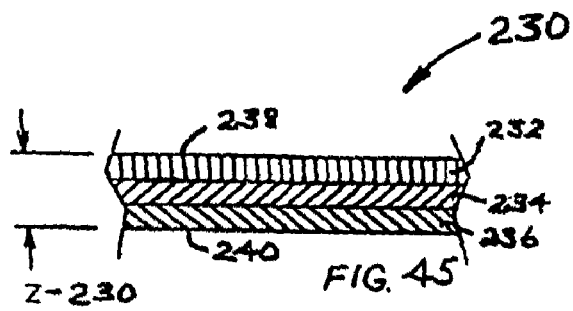
FIG. 45 is a sectional view taken substantially from the perspective of lines 45-45 of FIG. 44 showing a possible layered structure for the article.

FIG. 45 is a sectional view taken substantially from the perspective of lines 45-45 of FIG. 44. It is shown in FIG. 45 that article 230 may comprise any number of layers such as those designated by numerals 232, 234, 236. The layers are intended to supply functional attributes to article 230 as has been discussed for prior embodiments. Article 230 is also shown to have thickness "Z-230". "Z-230" is much smaller than "X-230" of "Y-230" and thus article 230 may be generally characterized as being flexible and sheetlike. Article 230 is shown to have a first surface 238 and second surface 240. As will become clear in subsequent embodiments, it may be advantageous to form layer 232 forming surface 238 using a material having adhesive affinity to the bottom surface 66 of cell 10. In addition, it may be advantageous to have surface 240 formed by a material having adhesive affinity to surface 59 of cell 10.

Figure 46:
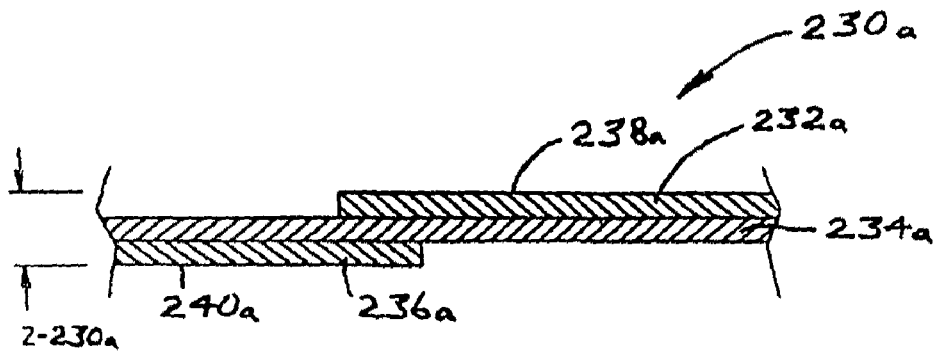
FIG. 46 is a sectional view similar to FIG. 45 but showing an alternate structural embodiment.

FIG. 46 is an alternate sectional embodiment depicting an article 230a. The layers forming article 230a do not necessarily have to cover the entire expanse of article 230a.

Figure 47:
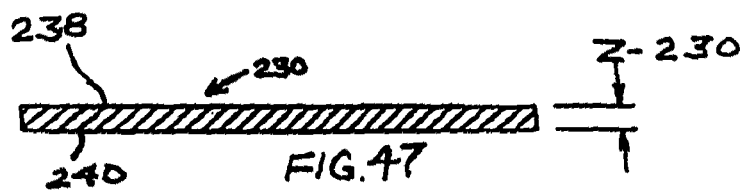
FIG. 47 is a simplified sectional view of the articles embodied in FIGS. 44-46 useful in maintaining clarity and simplicity for subsequent embodiments.

FIG. 47 is a simplified sectional view of the article 230 which will be used to simplify presentation of embodiments to follow. While FIG. 47 presents article 230 as a single layer, it is emphasized that article 230 may comprise any number of layers.

Figure 48:
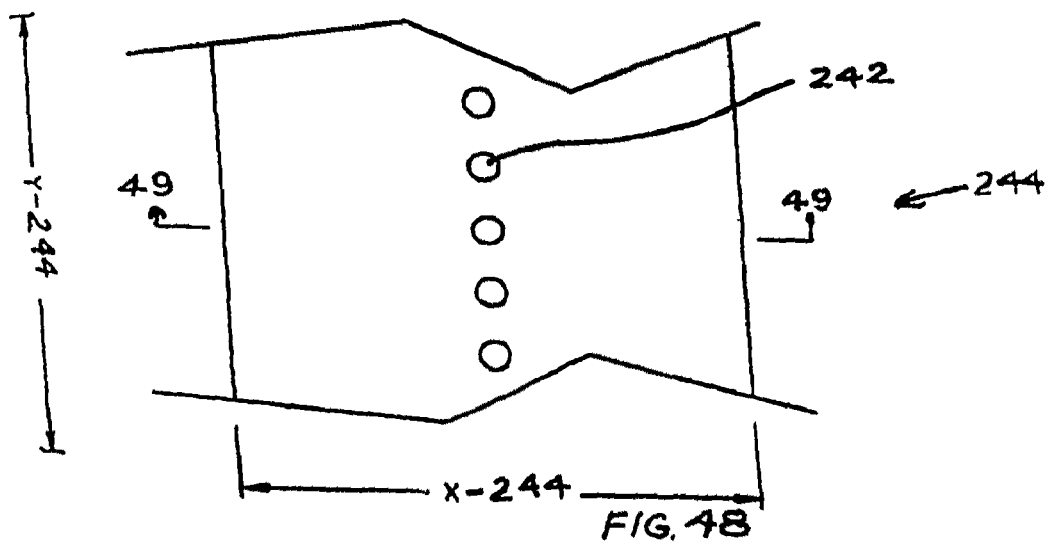
FIG. 48 is a top plan view of the articles of FIGS. 44-47 following an additional processing step.
Figure 49:
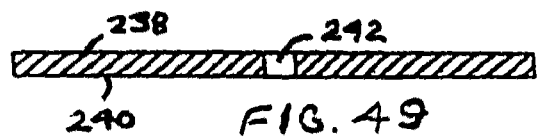
FIG. 49 is a sectional view taken substantially from the perspective of lines 49-49 of FIG. 48.

FIG. 48 is a top plan view of the initial article 230 following an additional processing step. The article embodied in FIG. 48 is designated 244 to reflect this additional processing step. FIG. 49 is a sectional view taken substantially from the perspective of lines 49-49 of FIG. 48. Reference to FIGS. 48 and 49 show that the additional processing has produced holes 242 in the direction of "Y-244". The holes extend from the top surface 238 to the bottom surface 240 of article 244. Holes 242 may be produced by any number of techniques such as laser drilling or simple punching.

Figure 50:
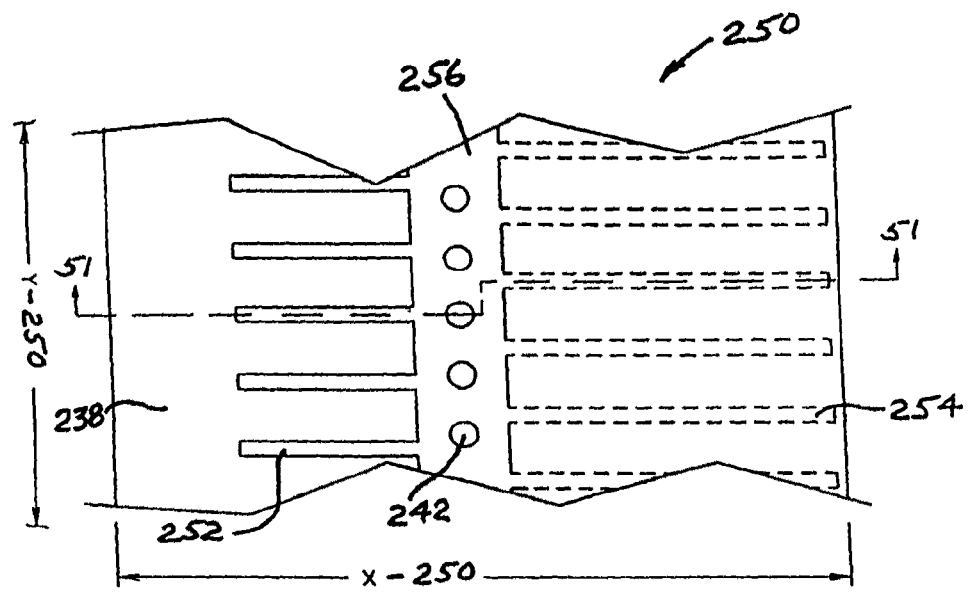
FIG. 50 is a top plan view of the article of FIGS. 48 and 49 following an additional processing step.
Figure 51:
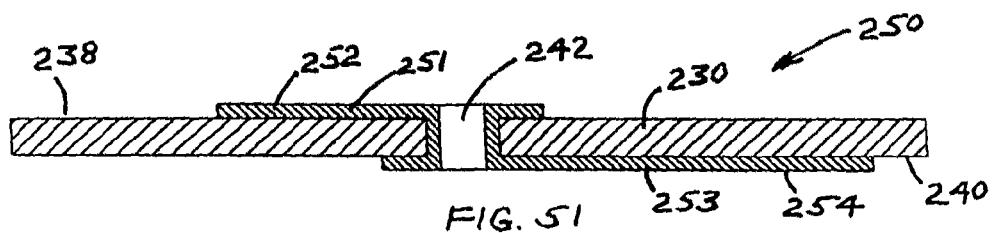
FIG. 51 is a sectional view taken substantially from the perspective of lines 51-51 of FIG. 50.

FIG. 50 is a top plan view of the article 244 following an additional processing step. The article of FIG. 50 is designated 250 to reflect this additional processing. FIG. 51 is a sectional view taken substantially from the perspective of lines 51-51 of FIG. 50. Reference to FIGS. 50 and 51 shows that material 251 has been applied to the first surface 238 in the form of "fingers" 252. Further, material 253 has been applied to second surface 240 in the form of "fingers" 254. In the embodiment, "fingers" 252 and 254 extend substantially perpendicular from a "buss-like" structure 256 extending in the direction "Y-250". As seen in FIG. 51, additional materials 251 and 253 extend through the holes 242. In the FIG. 51 embodiment, materials 251 and 253 are shown as being the same. This is not necessarily a requirement and they may be different. Also, in the embodiment of FIGS. 50 and 51, the buss-like structure 256 is shown as being formed by materials 251/253. This is not necessarily a requirement. Materials forming the "fingers" 252 and 254 and "buss" 256 may all be the same or they may differ in actual composition and be applied separately. Alternatively, fingers and busses may comprise a continuous monolithic material structure forming portions of both fingers and busses. Fingers and busses need not both be present in certain embodiments of the invention.

As in prior embodiments, "fingers" 252 and 254 and "buss" 256 may comprise electrically conductive material. Examples of such materials are metal wires and metal foils, conductive metal containing inks and pastes, patterned metals such as etched metal patterns or masked vacuum deposited metals, intrinsically conductive polymers, conductive inks and DER formulations. In a preferred embodiment, the "fingers and "busses" comprise material such as DER or an electrically conductive ink such as silver containing ink which will enhance or allow subsequent metal electrodeposition. "Fingers" 252 and 254 and "buss" 256 may also comprise non-conductive material which would assist accomplishing a subsequent deposition of conductive material in the pattern defined by the "fingers" and "busses". For example, "fingers" 252 and 254 or "buss" 256 could comprise a polymer which may be seeded to catalyze chemical deposition of a metal in a subsequent step. An example of such a material is "seeded" ABS. "Fingers" 252 and 254 and "buss" 256 may also comprise materials selected to promote adhesion of a subsequently applied conductive material.

Figure 52:
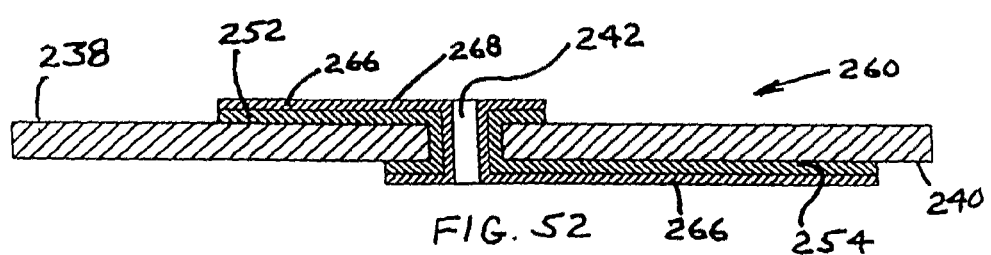
FIG. 52 is a sectional view of the article of FIGS. 50 and 51 following an additional optional processing step.

FIG. 52 is a sectional view showing the article 250 following an additional optional processing step. The article of FIG. 52 is designated 260 to reflect this additional processing. In a fashion like that described above for production of prior embodiments of current collector structures, additional conductive material 266 has been deposited by optional processing to produce the article 260 of FIG. 52. The discussion involving processing to produce the articles of FIGS. 12-15, 20, 31, and 41 is proper to describe the additional processing to produce the article 260 of FIG. 52. In a preferred embodiment, conductive material 266 comprises material applied by chemical metal deposition or metal electrodeposition. In addition, while shown in FIG. 52 as a single continuous, monolithic layer, the additional conductive material may comprise multiple layers. As in prior embodiments, it may be advantageous to use a material such as a low melting point alloy or conductive adhesive to form exterior surface 268 of additional conductive material 266. Additional conductive material overlaying "fingers" 252 need not be the same as the additional conductive material overlaying "fingers" 254.

The sectional views of FIGS. 55 and 56 embody the use of article 250 or 260 to achieve a series connected structural array of photovoltaic cells 10. In FIG. 55, an article designated as 270 has been formed by combining article 260 with cell 10 by laminating the bottom surface 240 of article 260 to the top conductive surface 59 of cell 10. In a preferred embodiment, exposed surface 240 (those regions not covered with "fingers" 254) is formed by a material having adhesive affinity to surface 59 and a secure and extensive adhesive bond forms between surfaces 240 and 59 during the heat and pressure exposure of the lamination process. Thus an adhesive "blanket" holds conductive material 266 of "fingers" 254 in secure ohmic contact with surface 59. As previously pointed out, low melting point alloys or conductive adhesives may also be considered to enhance this contact. It is understood that article 270 of FIG. 55 is yet another embodiment of a "tabbed cell stock".

The sectional view of FIG. 56 embodies multiple articles 270 arranged in a series interconnected array. The series connected array is designated by numeral 290 in FIG. 56. In the FIG. 56 embodiment, it is seen that "fingers" 252 positioned on surface 238 of article 270b have been brought into contact with the bottom surface 66 of cell 10 associated with article 270a. This contact is achieved by choosing material 232 forming free surface 238 of article 270b to have adhesive affinity for bottom conductive surface 66 of cell 10 of article 270a. Secure adhesive bonding is achieved during the heat and pressure exposure of a laminating process thereby resulting in a hold down of the "fingers" 252. The ohmic contact thus achieved can be enhanced using low melting point alloys or conductive adhesives as previously taught herein.

Thus, it is seen in the FIG. 56 embodiment that continuous communication is achieved between the top surface of one cell and the bottom or rear surface of an adjacent cell. Importantly, the communication is achieved with a continuous, monolithic conductive structure. This avoids added resistances and potential degradation of contacts sometimes associated with multiple contact surfaces when using other techniques, such as conductive adhesives and solders, to conductively join a multiple component conductive path. In addition, the FIG. 56 embodiment clearly shows an advantageous "shingling" type structure that avoids any shielding of valuable photovoltaic cell surface. Conversely, the FIG. 56 structure avoids any substantial separation between adjacent cells. Finally, it is seen that the structural embodiment of FIG. 56 includes complete encapsulation of cells 10.

Figure 53:
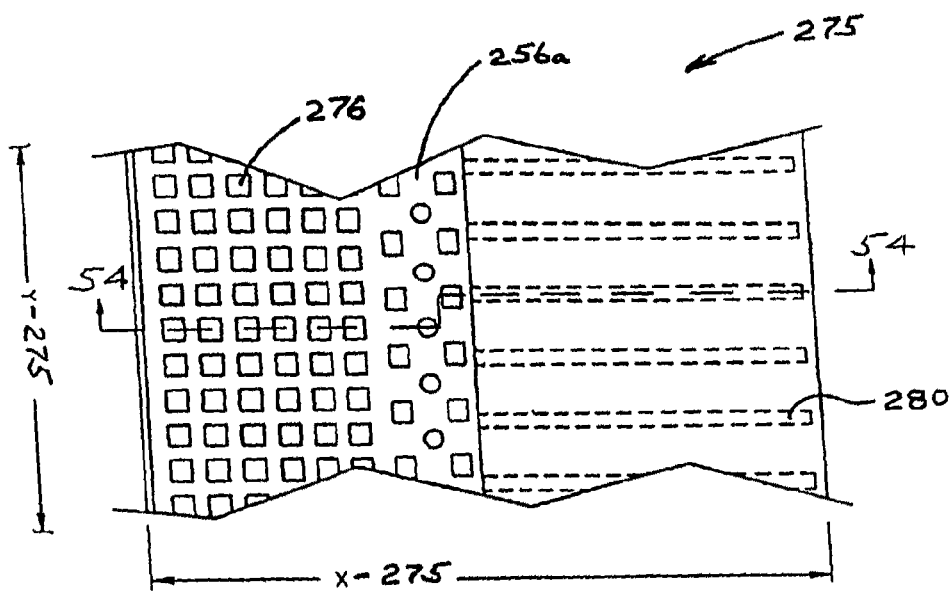
FIG. 53 is a top plan view of an article similar to that of FIG. 50 but embodying an alternate structure.
Figure 54:
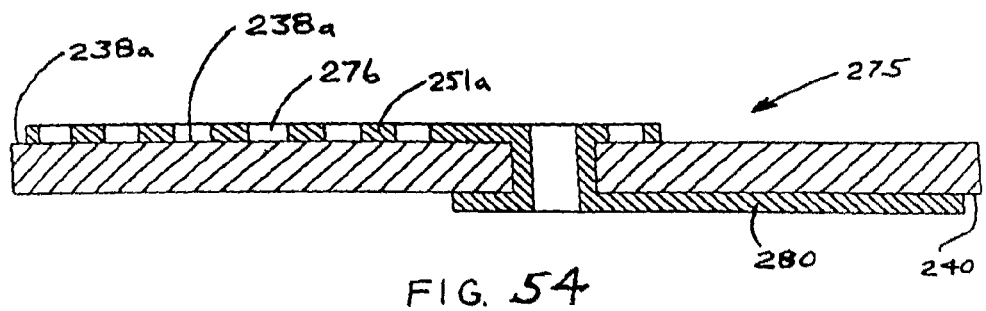
FIG. 54 is a sectional view taken substantially from the perspective of lines 54-54 of FIG. 53.

The embodiments of FIGS. 50 through 52 show the "fingers" and "busses" as essentially planar rectangular structures. Other geometrical forms are clearly possible. This is especially the case when considering structure for contacting the rear or bottom surface 66 of a photovoltaic cell 10. One embodiment of an alternate structure is depicted in FIGS. 53 and 54. FIG. 53 is a top plan view while FIG. 54 is a sectional view taken substantially from the perspective of lines 54-54 of FIG. 53. In FIGS. 53 and 54, there is depicted an article 275 analogous to article 250 of FIG. 50. The article 275 in FIGS. 53 and 54 comprises "fingers" 280 similar to "fingers" 254 of the FIG. 50 embodiment. However, the pattern of material 251 forming the structure on the top surface 238a of article 275 is considerably different than the "fingers" 252 and "buss" 256 of the FIG. 50 embodiment. In FIG. 53, material 251a is deposited in a mesh-like pattern having voids 276 leaving multiple regions of surface 238a exposed. Lamination of such a structure may result in improved surface area contact of the pattern compared to the finger structure of FIG. 50. It is emphasized that since surface 238a of article 275 eventually contacts rear surface 66 of the photovoltaic cell, potential shading is not an issue and thus geometrical design of the exposed contacting surfaces 238a relative to the mating conductive surfaces 66 can be optimized without consideration to shading issues.

In the present specification lamination has been shown as a means of combining the collector grid or electrode structures with a conductive surface. However, one will recognize that other application methods to combine the grid or electrode with a conductive surface may be appropriate such as transfer application processing. For example, in the embodiments such as those of FIG. 23 or 33, the substrate is shown to remain in its entirety as a component of the "tabbed cell stock" and final interconnected array. However, this is not a requirement. In other embodiments, all or a portion of the substrate may be removed prior to or after a laminating process accomplishing positioning and attachment of "fingers" 84 and "busses" 86 to a conductive cell surface. In this case, a suitable release material (not shown) may be used to facilitate separation of the conductive collector electrode structure from a removed portion of substrate 70 during or following an application such as the lamination process depicted in FIG. 21. Thus, in this case the removed portion of substrate 70 would serve as a surrogate or temporary support to initially manufacture and transfer the grid or electrode structure to the desired conductive surface. One example would be that situation where layer 72 of FIG. 7 would remain with the final interconnected array while layers 74 and/or 76 would be removed.

Using a laminating approach to secure the conductive grid materials to a conductive surface involves some design and performance "tradeoffs". For example, if the electrical trace or path "finger" 84 comprises a wire form, it has the advantage of potentially reducing light shading of the surface (at equivalent current carrying capacity) in comparison to a substantially flat electrodeposited, printed, etched or die cut foil member. However, the relatively higher profile for the wire form must be addressed. It has been taught in the art that wire diameters as small as 50 micrometers (0.002 inch) can be assembled into grid like arrangements onto photovoltaic cell surfaces prior to applying sealing materials. Thus when laid on a flat surface such a wire would project above the surface 50 micrometers (0.002 inches). For purposes of this instant specification and claims, a structure projecting above a surface less than 50 micrometers (0.002 inches), i.e. 1 micrometer, 5 micrometer, 10 micrometer 25 micrometer, 50 micrometer, will be defined as a low profile structure. Often a low profile structure may be further characterized as having a substantially flat surface.

Figure 57:
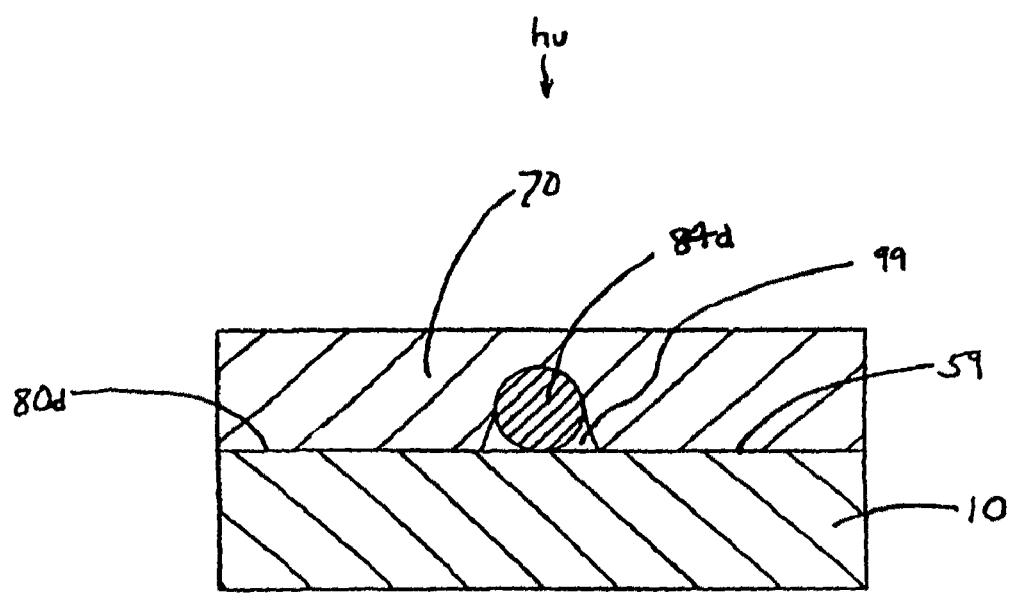
FIG. 57 is a sectional view embodying a possible condition when using a circular form in a lamination process.
Figure 58:
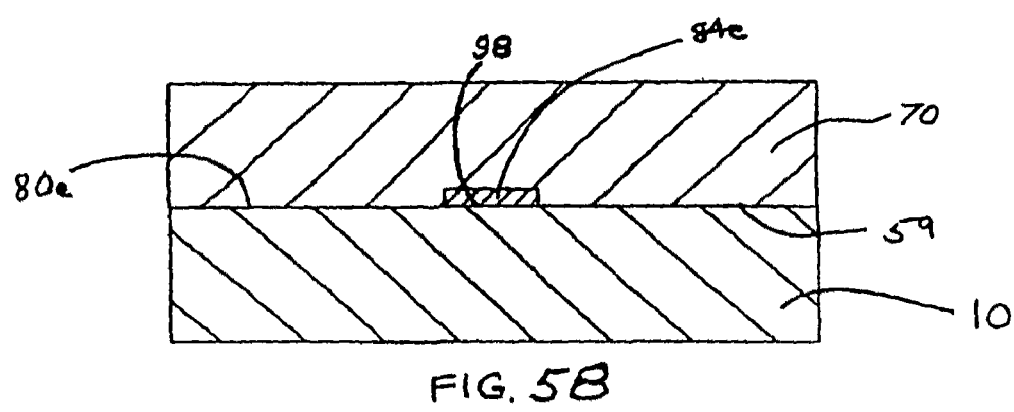
FIG. 58 is a sectional view embodying a possible condition resulting from choosing a low profile form in a lamination process.

A potential cross sectional view of a wire form 84d after being laminated to a surface is depicted in FIG. 57. FIG. 58 depicts a typical cross sectional view of an electrical trace 84e formed by printing, electrodeposition, chemical "electroless" plating, foil etching or stamping, masked vacuum deposition etc. It is seen in FIG. 57 that being round the wire itself contacts the surface essentially along a line (normal to the paper in FIG. 57). In addition, the wire form is embedded in the sealing material, but the sealing material forming surface 80d of film 70 may have difficulty flowing completely around the wire, leaving voids as shown in FIG. 57 at 99, possibly leading to insecure contact. Thus, the thickness of the sealing layer and lamination parameters and material choice become very important when using a round wire form. On the other hand, using a lower profile substantially flat conductive trace such as depicted in FIG. 58 increases contact surface area compared to the line contact associated with a wire. The low profile form of FIG. 58 is easily embedded into the sealing layer promoting broad surface contact and secure lamination but comes at the expense of increased light shading for equivalent current carrying capacity. The low profile, flat structure does require consideration of the thickness of the "flowable" sealing layer forming surface 80e relative to the thickness of the conductive trace. Excessive thickness of certain sealing layer materials might allow relaxation of the "blanket" pressure promoting contact of the surfaces 98 with a mating conductive surface such as 59. Insufficient thickness may lead to voids similar to those depicted for the wire forms of FIG. 57. However, testing has indicated that sealing layer thicknesses for low profile traces such as embodied in FIG. 58 ranging from 0.5 mil (0.0005 inch) to 10 mil (0.01 inch) all perform satisfactorily. Thus a wide range of thickness is possible, and the invention is not limited to sealing layer thicknesses within the stated tested range.

A low profile structure such as depicted in FIG. 58 may be advantageous because it may allow minimizing sealing layer thickness and consequently reducing the total amount of functional groups present in the sealing layer. Such functional groups may adversely affect solar cell performance or integrity. For example, it may be advantageous to limit the thickness of a sealing layer such as EVA to 3 mils or less when using a CIS or CIGS photovoltaic material.

Electrical contact between conductive grid "fingers" or "traces" 84 and a conductive surface (such as cell surface 59) may be further enhanced by coating a conductive adhesive formulation onto "fingers" 84 and possibly "busses" 86 prior to or during the lamination process such as taught in the embodiment of FIGS. 21. In a preferred embodiment, the conductive adhesive would be a "hot melt" material. A "hot melt" conductive adhesive would melt and flow at the temperatures involved in the laminating process 92 of FIG. 21. In this way surface 98 (see FIGS. 14 and 15) is formed by a conductive adhesive resulting in secure adhesive and electrical joining of grid "fingers" 84 to a conductive surface such as top surface 59 following the lamination process. In addition, such a "flowable" conductive material may assist in reducing voids such as depicted in FIG. 57 for a wire form. In addition, a "flowable" conductive adhesive may increase the contact area for a wire form 84d.

In the case of a low profile form such as depicted in FIG. 58, the conductive adhesive may be applied by standard registered printing techniques. However, it is noted that a conductive adhesive coating for a low profile conductive trace may be very thin, of the order of 0.1 to 10 micrometer thick. Thus, the intrinsic resistivity of the conductive adhesive can be relatively high, perhaps up to or even exceeding about 100 ohm-cm. This fact allows reduced loading and increased choices for a conductive filler. Since the conductive adhesive does not require heavy filler loading (i.e. it may have a relatively high intrinsic resistivity as noted above) other unique application options exist.

For example, a suitable conductive "hot melt" adhesive may be deposited from solution onto the surface of the "fingers" and "busses" by conventional paint electrodeposition techniques. Alternatively, should a condition be present wherein the exposed surface of fingers and busses be pristine (no oxide or tarnished surface), the well known characteristic of such a surface to "wet" with water based formulations may be employed to advantage. A freshly activated or freshly electroplated metal surface will be readily "wetted" by dipping in a water-based polymer containing fluid such as a latex emulsion containing a conductive filler such as carbon black. Application selectivity would be achieved because the exposed polymeric sealing surface 80 would not wet with the water based latex emulsion. The water based material would simply run off or could be blown off the sealing material using a conventional air knife. However, the water based film forming emulsion would cling to the freshly activated or electroplated metal surface. This approach is similar to applying an anti-tarnish or conversion dip coating to freshly electroplated metals such as copper and zinc.

Alternatively, one may employ a low melting point metal-based material as a constituent of the material forming either or both surfaces 98 and 100 of "fingers" and "busses". In this case the low melting point metal-based material, or alloy, melts during the temperature exposure of the process 92 of FIG. 21 (typically less than 325 degrees Centigrade) thereby increasing the contact area between the mating surfaces 98, 100 and a conductive surface such as 59. Alternatively, induction heating may be suitable to sufficiently heat the conductive metallic pattern. Such low melting point metal-based materials may be applied by electrodeposition or simple dipping to wet the underlying conductive trace. Suitable low melting point metals may be based on tin, such as tin-bismuth and tin-lead alloys. Such alloys are commonly referred to as "solders". In another preferred embodiment indium or indium containing alloys are chosen as the low melting point contact material at surfaces 98, 100. Indium melts at a low temperature, considerably below possible lamination temperatures. In addition, indium is known to bond to glass and ceramic materials when melted in contact with them. Given sufficient lamination pressures, only a very thin layer of indium or indium alloy would be required to take advantage of this bonding ability.

In yet another embodiment, one or more of the layers 84, 86, 88, 90 etc. may comprise a material having magnetic characteristics. Magnetic materials include nickel and iron. In this embodiment, either a magnetic material in the cell substrate or the material present in the finger/grid collector structure is caused to be permanently magnetized. The magnetic attraction between the "grid pattern" and magnetic component of the foil substrate of the photovoltaic cell (or visa versa) creates a permanent "pressure" contact.

In yet another embodiment, the "fingers" 84 and/or "busses" 86 comprise a magnetic component such as iron or nickel and a external magnetic field is used to maintain positioning of the fingers or busses during the lamination process depicted in FIG. 21.

A number of methods are available to employ the current collecting and interconnection structures taught hereinabove with photovoltaic cell stock to achieve effective interconnection of multiple cells into arrays. A brief description of some possible methods follows. A first method envisions combining photovoltaic cell structure with current collecting electrodes while both components are in their originally prepared "bulk" form prior to subdivision to dimensions appropriate for individual cells. An expansive surface area of photovoltaic structure such as embodied in FIGS. 1 and 2 of the instant specification representing the cumulative area of multiple unit cells is produced. As a separate and distinct operation, an array comprising multiple current collector electrodes arranged on a common substrate, such as the array of electrodes taught in FIGS. 9 through 15 is produced. The bulk array of electrodes is then combined with the expansive surface of photovoltaic structure in a process such as the laminating process embodied in FIG. 21. This process results in a bulk combination of photovoltaic structure and collector electrode. Appropriate subdividing of the bulk combination results in individual cells having a pre-attached current collector structure. Electrical access to the collector structure of individual cells may be achieved using through holes, as taught in conjunction with the embodiments of FIGS. 35 through 42. Alternatively, one may simply lift the collector structure away from the cell surface 59 at the edge of the unit photovoltaic cell to expose the collector electrode.

Another method of combining the collector electrodes and interconnect structures taught herein with photovoltaic cells involves a first step of manufacture of multiple individual current collecting structures or electrodes. A suitable method of manufacture is to produce a bulk continuous roll of electrodes using roll to roll processing. Examples of such manufacture are the processes and structures embodied in the discussion of FIGS. 9 through 15 of the instant specification. The bulk roll is then subdivided into individual current collector electrodes for combination with discrete units of cell stock. The combination produces discrete individual units of "tabbed" cell stock. In concept, this approach is appropriate for individual cells having known and defined surface dimensions, such as 6"×6", 4"×3", 2"×8" and 2"×16". Cells of such defined dimensions may be produced directly, such as with conventional crystal silicon manufacture. Alternatively, cells of such dimension are produced by subdividing an expansive cell structure into smaller dimensions. The "tabbed" cell stock thereby produced could be packaged in cassette packaging. The discrete "tabbed" cells are then electrically interconnected into an array, optionally using automatic dispensing, positioning and electrical joining of multiple cells. The overhanging tabs of the individual "tabbed" cells facilitate such joining into an array as was taught in the embodiments of FIGS. 24, 34, 43, and 56 above.

Alternate methods to achieve interconnected arrays according to the instant invention comprise first manufacturing multiple current collector structures in bulk roll to roll fashion. In this case the "current collector stock" would comprise electrically conductive current collecting structure on a supporting sheetlike web essentially continuous in the "Y" or "machine" direction. Furthermore, the conductive structure is possibly repetitive in the "X" direction, such as the arrangement depicted in FIGS. 9, 12 and 38 of the instant specification. In a separate operation, individual rolls of unit "cell stock" are produced, possibly by subdividing an expansive web of cell structure. The individual rolls of unit "cell stock" are envisioned to be continuous in the "Y" direction and having a defined width corresponding to the defined width of cells to be eventually arranged in interconnected array.

Having separately prepared rolls of "current collector stock" and unit "cell stock", multiple assembly processes may be considered to assemble modules as follows. In one form of array assembly process, a roll of unit "current collector stock" is produced, possibly by subdividing a bulk roll of "current collector stock" to appropriate width for the unit roll. The rolls of unit "current collector stock" and unit "cell stock" are then combined in a continuous process to produce a roll of unit "tabbed stock". The "tabbed" stock therefore comprises cells, which may be extensive in the "Y" dimension, equipped with readily accessible contacting surfaces for either or both the top and bottom surfaces of the cell. The "tabbed" stock may be assembled into an interconnected array using a multiple of different processes. As examples, two such process paths are discussed according to (A) and (B) following.

Process Example (A): Multiple strips of "tabbed" stock are fed to a process such that an interconnected array of multiple cells is achieved continuously in the machine (original "Y") direction. This process would produce an interconnected array having series connections of cells whose number would correspond to the number of rolls of "tabbed" stock being fed. In this case the individual strips of "tabbed" stock would be arranged in appropriate overlapping fashion as dictated by the particular embodiment of "tabbed" stock. The multiple overlapping tabbed cells would be electrically joined appropriately using electrical joining means, surface mating through laminating or combinations thereof as has been taught above. Both the feed and exit of such an assembly process would be substantially in the original "Y" direction and the output of such a process would be essentially continuous in the original "Y" direction. The multiple interconnected cells could be rewound onto a roll for further processing.

Figure 59:
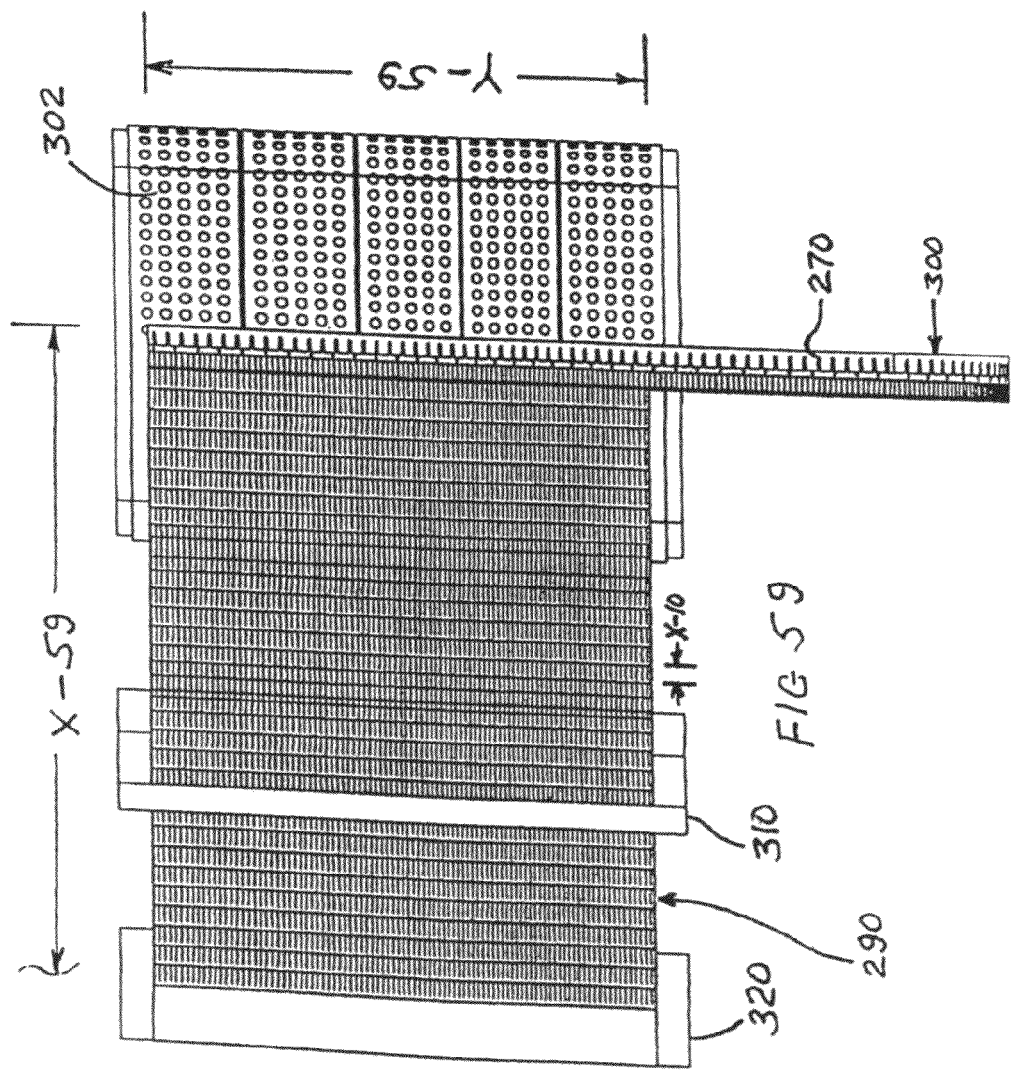
FIG. 59 is a top plan view embodying a possible process to achieve positioning and combining of photovoltaic cells into a series interconnected array.
Figure 60:
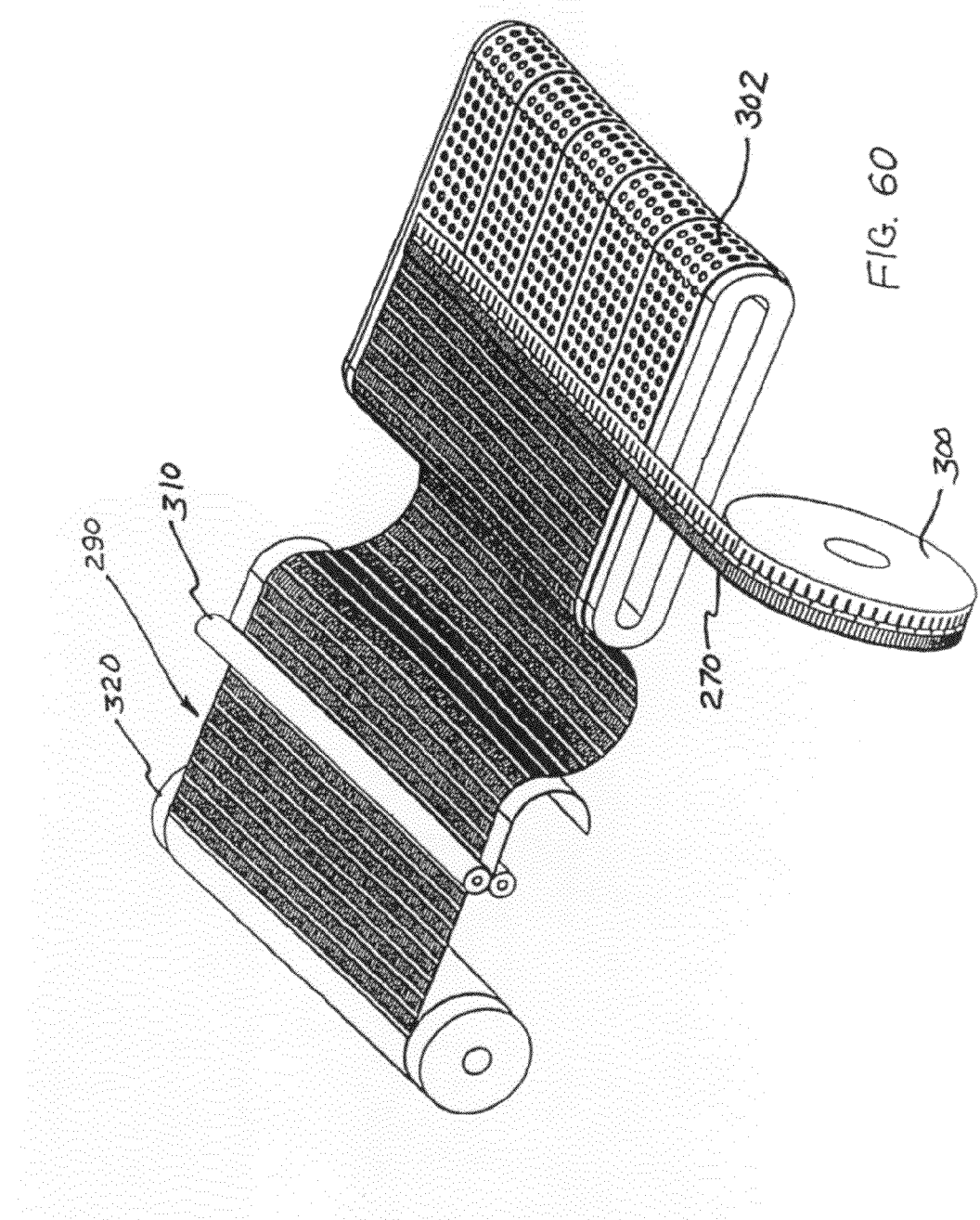
FIG. 60 is a perspective view of the process embodied in FIG. 59.

Process Example (B): An alternative process is taught in conjunction with FIGS. 59 and 60. FIG. 59 is a top view of the process and FIG. 60 is a perspective view. The process is embodied in FIGS. 59 and 60 using the "tabbed cell stock" 270 as shown in FIG. 55. One will recognize that other forms of "tabbed cell stock" such as those shown in FIGS. 23, 33, 42, are also suitable. A single strip of "tabbed" cell stock 270 is unwound from roll 300 and cut to a predetermined length "Y-59". "Y-59" represents the width of the form factor of the eventual interconnected array. The strip of "tabbed cell stock" cut to length "Y-59" is then positioned. In the embodiment of FIGS. 59 and 60 the strip is securely positioned on vacuum belt 302. The strip is then "shuttled" in the original "x" direction of the "tabbed cell stock" a distance substantially the length of a repeat dimension among adjacent series connected cells. This repeat distance is indicated in FIGS. 56 and 59 as "X-10". A second strip of "tabbed cell stock" 270 is then unwound and appropriately positioned to properly overlap the first strip, as best shown in FIG. 56. This second strip is cut to length "Y-59". The second strip is then slightly tacked to the first strip of "tabbed cell stock" using exposed substrate material, as that indicated at numeral 306 in FIG. 56. The tacking may be accomplished quickly and simply at points spaced in the "Y-59" direction using heated probes to melt small regions of the sealing material forming the surface of the exposed substrate. This process of positioning and tacking is repeated multiple times. It is understood that methods other than tacking may be chosen to maintain positioning of the adjacent cells prior to lamination. Eventually, the repetitive structures are passed through a lamination step. In the embodiment of FIGS. 59 and 60, the lamination is accomplished using roll laminator 310. Thus the series connected structure 290 depicted in FIG. 56 is achieved. The electrical joining may take many forms, depending somewhat on the structure of the individual "tabbed cell stock". For example, in the embodiment of FIGS. 24 and 25, joining may take the form of an electrically conductive adhesive, solder, etc. as previously taught. In the case of "tabbed" cell stock such as FIG. 55, electrical joining may comprise a simple adhesive "blanket hold down" lamination such as embodied in FIG. 56, but may also include additional conductive adhesives. It is seen that in the process depicted in FIGS. 59 and 60 the interconnected cell stock would exit the basic lamination assembly process in a fashion substantially perpendicular to the original "Y" direction of the "tabbed cell stock". The interconnected cells produced would therefore have a new predetermined width "Y-59" and the new length (in the original "X" direction) may be of extended dimension. The output in the new length dimension may be described as essentially continuous and thus the output of interconnected cells may be gathered on roll 320 as shown.

While the feed material in the process embodiment of FIGS. 59 and 60 is shown as a continuous strip of "tabbed cell stock" 270, one will understand that the process may alternatively be practiced using defined lengths (Y-59) of "tabbed cell stock" fed from, for example, a cassette of lengths sorted according to performance characteristics.

It will be appreciated that using the processing as embodied in FIGS. 59 and 60, a large choice of final form factors for the interconnected array is possible. For example, dimension "Y-59" could conceivably and reasonably be quite large, for example 8 feet while dimension "X-59" may be virtually any desired dimension. To date, module sizes have been restricted by the practical problems of handling and interconnecting large numbers of small individual cells. The largest commercially available module known to the instant inventor is about 60 square feet. Using the instant invention, module sizes far in excess of 60 square feet are reasonable. Large modules suitable for combination with standard construction materials may be produced. For example, a module surface area of 4 ft. by 8 ft. (a standard dimension for plywood and other sheetlike construction materials) is readily produced using the processing of the instant invention. Alternatively, since the final modular array can be accumulated in roll form as shown in FIGS. 59 and 60, installation could be facilitated by the ability to simply "roll out" the array at the installation site. The ability to easily make modular arrays of very expansive surface and having wide choice of form factor greatly facilitates eventual installation and is a substantial improvement over existing options for modular array manufacture.

It is further pointed out that additional optional operations may be achieved after or during the formation of modular arrays such as those of FIGS. 24, 34, 43, and 56 are formed. For example, additional film structure such as barrier layers can be added just prior to the lamination step depicted at rolls 310 in FIG. 60 or in an additional lamination step. Alternatively, the continuous output 290 of the FIG. 59 process may be fed to additional process steps. For example, the modular structure 290 of FIG. 59 may be cut to predetermined lengths in the "X-59" dimension for positioning into a casing of predetermined dimensions and/or further protected with a layer such as glass. This would of course eliminate the delicate and careful handling associated with placements multiple cells interconnected with conventional "string and tab" structure.

Finally, the modularization processes described by way of example above in paragraphs 245 through 249 are very scaleable since they adopt laminating processing firmly established in the packaging industry.

EXAMPLE 1

A standard plastic laminating sheet from GBC Corp. 75 micrometer (0.003 inch) thick was coated with DER in a pattern of repetitive fingers joined along one end with a busslike structure resulting in an article as embodied in FIGS. 16 through 19. The fingers were 0.020 inch wide, 1.625 inch long and were repetitively separated by 0.150 inch. The buss-like structure which contacted the fingers extended in a direction perpendicular to the fingers as shown in FIG. 16. The busslike structure had a width of 0.25 inch. Both the finger pattern and buss-like structure were printed simultaneously using the same DER ink and using silk screen printing. The DER printing pattern was applied to the laminating sheet surface formed by the sealing layer (i.e. that surface facing to the inside of the standard sealing pouch).

The finger/buss pattern thus produced on the lamination sheet was then electroplated with nickel in a standard Watts nickel bath at a current density of 50 amps. per sq. ft. Approximately 4 micrometers of nickel thickness was deposited to the overall pattern.

A photovoltaic cell having surface dimensions of 1.75 inch wide by 2.0625 inch long was used. This cell was a CIGS semiconductor type deposited on a 0.001 inch stainless steel substrate. A section of the laminating sheet containing the electroplated buss/finger pattern was then applied to the top, light incident side of the cell, with the electroplated grid finger extending in the width direction (1.75 inch dimension) of the cell. Care was taken to ensure that the buss region of the conductive electroplated metal did not overlap the cell surface. This resulted in a total cell surface of 3.61 sq. inch. (2.0625"×1.75") with about 12% shading from the grid, (i.e. about 88% open area for the cell).

The electroplated "finger/buss" on the lamination film was applied to the photovoltaic cell using a standard Xerox office laminator. The resulting completed cell showed good appearance and connection.

The cell prepared as above was tested in direct sunlight for photovoltaic response. Testing was done at noon, Morgan Hill, Calif. on Apr. 8, 2006 in full sunlight. The cell recorded an open circuit voltage of 0.52 Volts. Also recorded was a "short circuit" current of 0.65 Amps. This indicates excellent power collection from the cell at high efficiency of collection.

EXAMPLE 2

Individual thin film CIGS semiconductor cells comprising a stainless steel supporting substrate 0.001 inch thick were cut to dimensions of 7.5 inch length and 1.75 inch width.

In a separate operation, multiple laminating collector grids were prepared as follows. A 0.002 inch thick film of Surlyn material was applied to both sides of a 0.003 inch thick PET film to produce a starting laminating substrate as embodied in FIG. 44. Holes having a 0.125 inch diameter were punched through the laminate to produce a structure as in FIG. 48. A DER ink was then printed on opposite surfaces and through the holes to form a pattern of DER traces. The resulting structure resembled that depicted in FIG. 51. The grid fingers 254 depicted in FIGS. 50 and 51 were 0.012 inch wide and 1.625 inch long and were spaced on centers 0.120 inch apart in the length direction. The grid fingers 252 were 0.062 inch wide and extended 1 inch and were spaced on centers 0.5 inch apart. The printed film was then electroplated to deposit approximately 2 micrometers nickel strike, 5 micrometers copper and a top flash coating of 1 micrometer nickel. This operation produced multiple sheets of laminating current collector stock having overall dimension of 7.5 inch length ("Y" dimension) and 4.25 in width ("X" dimension) as indicated in FIG. 50. These individual current collector sheets were laminated to cells having dimension of 7.25 inches in length and 1.75 inches in width to produce tabbed cell stock as depicted in FIG. 55. A standard Xerox office roll laminator was used to produce the tabbed cell stock. Six pieces of the tabbed cell stock were laminated together as depicted in FIG. 56. A standard Xerox office roll laminator was used to produce the FIG. 56 embodiment. The combined series interconnected array had a total surface area of 76.1 square inches. In full noon sunlight the 6 cell array had an open circuit voltage of 3.2 Volts and a short circuit current of 2.3 amperes.

While many of the embodiments of the invention refer to "current collector" structure, one will appreciate that similar articles could be employed to collect and convey other electrical characteristics such as voltage.

One application of the modules made practical by the teachings above is expansive area photovoltaic energy farms or expansive area rooftop applications. The instant invention envisions facile manufacture and installation of large sheetlike modules having area dimensions suitable for covering expansive surface areas. Practical module widths may be 2 ft., 4 ft., 8 ft etc. Practical module lengths may be 2 ft., 4 ft., 10 ft., 50 ft, 100 ft., 500 ft., or larger. The "sheetlike" modules may be produced in a wide range of forms. The longer lengths can be characterized as "continuous" and be shipped and installed in a roll format. In another application, the sheetlike modules may be adhered to a rigid supporting member such as plywood, polymeric sheet or a honeycomb structure. The sheetlike modules may be produced having terminal bars at two opposite terminal ends of the module. These terminal bars are easily incorporated into the modules using the same continuous processes used in assembly of the bulk module. It is noted that in the hereinbefore teachings, the terminal bars may have oppositely facing conductive surface regions with electrical communication between them. This is an advantage for certain embodiments of the instant invention, in that an upward facing conductive surface for the terminal bars may facilitate electrical connections.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. An article comprising a combination of a first photovoltaic cell and an interconnection component wherein, said first photovoltaic cell has a light incident top surface formed of a transparent or translucent first electrically conductive material, said interconnection component is flexible and further comprises a structure having a sheetlike shape whereby said sheetlike shaped structure has length, width and thickness and wherein the length and width are greater than the thickness, said sheetlike shaped structure has an exterior first side and an oppositely facing exterior second side, said second side intended to face upwardly toward a light source, and wherein at least a portion of said exterior first side is substantially parallel to at least a portion of said exterior second side, said sheetlike shaped structure is further characterized as comprising a collection portion and an interconnection structure, said collection portion comprises one or more layers of transparent or translucent polymeric material and wherein said exterior first side of said sheetlike shaped structure associated with said collection portion is formed of said one of more layers of transparent or translucent polymeric material, said collection portion is further characterized as having a pattern comprising a second electrically conductive material, said pattern being positioned directly on said exterior first side of said sheetlike shaped structure associated with said collection portion, said interconnection structure comprises additional electrically conductive material extending from said exterior first side to said exterior second side of said sheetlike shaped structure, said additional conductive material being in ohmic electrical communication with said pattern, said combination has said exterior first side of said sheet-like shaped structure associated with said collection portion overlaying said light incident top cell surface in facing relationship such that parts of both said exterior first side associated with said collection portion and said pattern are in direct physical contact with said light incident top cell surface of said first photovoltaic cell and, said pattern extends over a preponderance of said light incident top surface.

2. The article of claim 1 wherein said transparent or translucent first electrically conductive material comprises a conductive oxide.

3. The article of claim 1 wherein said first photovoltaic cell comprises a self supporting metal based foil and wherein a semiconductor material covers the full expanse of an upward facing surface of said foil, said upward facing surface facing toward said light incident surface.

4. The article of claim 1 wherein said one or more transparent or translucent polymeric material layers forming said exterior first side associated with said collection portion comprises a polymeric adhesive having adhesive affinity for said light incident top surface of said first photovoltaic cell.

5. The article of claim 4 wherein said polymeric adhesive is a thermoplastic, whereby adhesive characteristics are activated when temperatures and pressure are increased sufficiently above ambient.

6. The article of claim 1 wherein said pattern comprises multiple substantially parallel line segments said line segments comprising a common monolithic material.

7. The article of claim 1 wherein portions of said pattern are defined by printed material.

8. The article of claim 7 wherein said printed material is characterized as having the ability to facilitate metal deposition.

9. The article of claim 1 wherein said pattern comprises a layer of nickel or nickel based alloy absent polymeric material.

10. The article of claim 1 wherein said pattern parts in contact with said light incident surface comprise a metallic surface absent polymeric material.

11. The article of claim 10 wherein said metallic surface comprises nickel.

12. The article of claim 1 wherein said pattern comprises an electrically conductive polymer.

13. The article of claim 12 wherein said electrically conductive polymer has an adhesive affinity to said light incident surface.

14. The article of claim 1 wherein said pattern comprises a directly electroplateable resin (DER).

15. The article of claim 1 wherein a common monolithic form extends throughout the entirety of said pattern.

16. The article of claim 1 wherein said pattern and said additional electrically conductive material extending from said exterior first side to said exterior second side of said shaped structure comprise a monolithic material common to both said exterior first side and said exterior second side.

17. The article of claim 16 wherein said common monolithic material comprises a continuous metal.

18. The article of claim 1 wherein said additional conductive material extends from said exterior first side to said exterior second side of said shaped structure through holes extending through said shaped structure from said exterior first side to said exterior second side.

19. The article of claim 1 wherein said additional electrically conductive material further forms a portion of said exterior second side.

20. The article of claim 19 wherein either of said pattern or said additional electrically conductive material comprises metal with a melting point at or below the melting point of tin.

21. The article of claim 1 wherein said article has a length much greater than width whereby said article can be characterized as continuous in length.

22. The article of claim 1 wherein said article is flexible.

23. The article of claim 16 further comprising, a second photovoltaic cell, said second cell having an electrically conductive bottom surface portion facing away from a light incident top surface, and said second cell being positioned such that said conductive bottom surface portion of said second cell overlays at least a portion of said interconnection structure, and wherein said monolithic material is in direct physical contact with said electrically conductive bottom surface of said second cell.

24. The article of claim 1 wherein said additional conductive material of said interconnection structure comprises a mesh or fabric whereby said additional conductive material extends through the natural holes of the mesh or fabric and produces conductive surface portions of both said first and second sides of the shaped structure.

25. The article of claim 1 wherein said interconnection structure forms a portion of said interconnection component distinct from said collection portion.

26. The article of claim 1 further comprising, a second photovoltaic cell, said second cell having an electrically conductive bottom surface portion facing away from a light incident top surface, and said second cell being positioned such that said conductive bottom surface portion of said second cell overlays at least a portion of said interconnection structure, and wherein said additional conductive material is in direct physical contact with said electrically conductive bottom surface of said second cell.

* * * * *